United States Patent
Nakamura et al.

(10) Patent No.: US 10,534,264 B2
(45) Date of Patent: Jan. 14, 2020

(54) RESIST COMPOSITION AND RESIST PATTERN FORMING METHOD

(71) Applicant: TOKYO OHKA KOGYO CO., LTD., Kawasaki-shi (JP)

(72) Inventors: Tsuyoshi Nakamura, Incheon (KR); Kazuishi Tanno, Incheon (KR); JunYeob Lee, Incheon (KR)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 9 days.

(21) Appl. No.: 15/879,206

(22) Filed: Jan. 24, 2018

(65) Prior Publication Data

US 2018/0224742 A1    Aug. 9, 2018

(30) Foreign Application Priority Data

Feb. 3, 2017    (KR) .......................... 10-2017-0015370

(51) Int. Cl.
| | | |
|---|---|---|
| G03F 7/004 | (2006.01) | |
| G03F 7/30 | (2006.01) | |
| G03F 7/38 | (2006.01) | |
| C08F 224/00 | (2006.01) | |
| C08F 232/02 | (2006.01) | |
| C08F 232/04 | (2006.01) | |
| C08F 232/08 | (2006.01) | |
| G03F 7/039 | (2006.01) | |
| G03F 7/038 | (2006.01) | |
| G03F 7/16 | (2006.01) | |
| G03F 7/20 | (2006.01) | |
| G03F 7/32 | (2006.01) | |
| C08F 220/16 | (2006.01) | |
| C08F 220/28 | (2006.01) | |

(52) U.S. Cl.
CPC .......... *G03F 7/0397* (2013.01); *C08F 220/16* (2013.01); *C08F 224/00* (2013.01); *C08F 232/02* (2013.01); *C08F 232/04* (2013.01); *C08F 232/08* (2013.01); *G03F 7/0045* (2013.01); *G03F 7/038* (2013.01); *G03F 7/162* (2013.01); *G03F 7/168* (2013.01); *G03F 7/2006* (2013.01); *G03F 7/2041* (2013.01); *G03F 7/325* (2013.01); *G03F 7/38* (2013.01); *C08F 220/28* (2013.01); *C08F 2220/282* (2013.01); *C08F 2220/283* (2013.01); *C08F 2800/10* (2013.01)

(58) Field of Classification Search
CPC ........ G03F 7/0045; G03F 7/0397; G03F 7/30; C08F 224/00; C08F 232/02; C08F 232/04; C08F 232/08; C08F 2220/282; C08F 2220/283
USPC .............................. 430/270.1, 326, 905, 910
See application file for complete search history.

(56) References Cited

U.S. PATENT DOCUMENTS

| | | | | |
|---|---|---|---|---|
| 7,569,326 B2 * | 8/2009 | Ohsawa | .................. | C08F 20/22 430/270.1 |
| 2013/0045444 A1 | 2/2013 | Taniguchi et al. | | |
| 2016/0168296 A1 * | 6/2016 | Hatakeyama | ......... | C08F 224/00 430/270.1 |

FOREIGN PATENT DOCUMENTS

JP    A-2013-041126    2/2013

* cited by examiner

*Primary Examiner* — John S Chu
(74) *Attorney, Agent, or Firm* — Knobbe, Martens, Olson & Bear LLP

(57) ABSTRACT

A resist composition which generates an acid through exposure and whose solubility in a developer changes by the action of an acid. The resist composition contains a polymer compound having at least two kinds of specific constituent units. A resist pattern forming method, including forming a resist film on a support using the resist composition, subjecting the resist film to exposure, and forming a resist pattern through patterning by developing the resist film having undergone exposure by using a developer.

6 Claims, No Drawings

RESIST COMPOSITION AND RESIST PATTERN FORMING METHOD

BACKGROUND OF THE INVENTION

Field of the Invention

The present invention relates to a resist composition and a resist pattern forming method.

This application claims priority to Korean Patent Application No. 10-2017-0015370, filed Feb. 3, 2017, the entire content of which is incorporated herein by reference.

Description of Related Art

In lithography techniques, for example, a step is performed in which a resist film formed of a resist material is formed on a substrate, the resist film is subjected to selective exposure by using light or radiation such as electron beams through a mask having a predetermined pattern formed, and a development treatment is performed such that a resist pattern having a predetermined shape is formed on the resist film.

A resist material in which a portion having undergone exposure turns into a portion having a property of being dissolved in a developer is referred to as a positive resist, and a resist material in which a portion having undergone exposure turns into a portion having a property of not being dissolved in a developer is referred to as a negative resist.

In recent years, in manufacturing of semiconductor devices or liquid crystal display devices, with the progress of lithography techniques, patterns have rapidly become finer.

For making a fine pattern, generally, a method of shortening the wavelength (increasing the energy) of an exposure light source is performed. Specifically, although ultraviolet rays represented by g-line and i-line were used in the related art, currently, mass production of semiconductor devices by using a KrF excimer laser or an ArF excimer laser has begun. Furthermore, due to these excimer lasers, short-wavelength (high-energy) electron beams, extreme ultraviolet (EUV), X-rays, and the like are also being investigated.

Resist materials are required to have lithography characteristics such as sensitivity with respect to these exposure light sources and resolution which makes it possible to reproduce a pattern of small dimension.

In the related art, as a resist material satisfying the requirements, a chemical amplification-type resist composition is used which contains a substrate component whose solubility in a developer changes by the action of an acid and an acid generator component generating an acid through exposure.

For example, in a case where the aforementioned developer is an alkaline developer (an alkaline development process), as a positive chemical amplification-type resist composition, generally, a composition is used which contains a resin component (a base resin) whose solubility in the alkaline developer increases by the action of an acid and an acid generator component.

In a case where a resist film formed using the aforementioned resist composition is subjected to selective exposure at the time of forming a resist pattern, in an exposed portion, an acid is generated from the acid generator component. By the action of the acid, the polarity of the base resin increases, and the exposed portion becomes soluble in the alkaline developer. Accordingly, by performing alkaline development, a positive pattern in which an unexposed portion remains as a pattern is formed.

In contrast, in a case where the chemical amplification-type resist composition is applied to a solvent development process in which an organic solvent-containing developer (an organic developer) is used, provided that the polarity of the base resin increases, the solubility of the base resin in the organic developer relatively decreases. Accordingly, the unexposed portion of the resist film is removed by being dissolved in the organic developer, and a negative resist pattern in which the exposed portion remains as a pattern is formed. The solvent development process for forming a negative resist pattern as described above is referred to as a negative development process in some cases.

In the related art, it is known that in order to obtain high resolution and an excellent pattern shape at the time of forming a resist pattern, a positive resist composition containing a resin, which has a methacrylic repeating unit containing adamantyl on tertiary carbon as an acid-labile group and a methacrylic repeating unit having a cyclic structure formed of tertiary carbon and has alkali solubility increasing by an acid, a photoacid generator, and a solvent is used (for example, see Japanese Unexamined Patent Application, First Publication No. 2013-041126).

In a case where a pattern is formed using the resist composition of the related art, a sufficiently uniform pattern is not formed. Therefore, as the pattern becomes increasingly finer, a demand for a polymer compound useful as a base resin for a resist composition is growing.

SUMMARY OF THE INVENTION

The lithography techniques are greatly advancing, and the field of application thereof is broadening. In this trend, for the formation of a resist pattern, various lithography characteristics such as sensitivity, resolution, roughness, and a margin of process are being required to be further improved.

Specifically, it is preferable that a resist composition makes it possible to form a resist pattern with an excellent shape having high rectangularity at the time of forming, for example, a line and space resist pattern and to form a resist pattern with an excellent shape having excellent circularity and in-plane uniformity at the time of forming, for example, a resist pattern of a contact hole. Furthermore, a resist composition is required to have excellent lithography characteristics such as line width roughness (LWR), exposure latitude margin (EL margin), mask error factor (MEF), depth of focus (DOF), and critical dimension uniformity (CDU). Particularly, a resist composition is required to have excellent EL margin and excellent DOF and to enable the margin of process to be improved at the time of forming a resist pattern by increasing a process window.

"Line width roughness (LWR)" means the non-uniformity of widths between lines of line patterns at the time of forming a resist pattern. As the pattern becomes finer, the improvement of the LWR becomes more important.

"Exposure latitude margin (EL margin)" shows that the higher the value of EL margin, the smaller the change in a pattern size resulting from the change in an exposure amount and the higher the margin of process.

"Mask error factor (MEF)" is a parameter showing to what extent mask patterns having different sizes can be faithfully reproduced (mask reproducibility) in a case where a mask size (a line width, a space width, a hole diameter, or the like) is varied in a state where an exposure amount is the same and a pitch is fixed.

"Depth of focus (DOF)" is a range of a depth of focus in which a resist pattern can be formed at a dimension deviating from a target dimension within a predetermined range in a case where exposure is performed by moving a focus up and down at the same exposure amount. That is, DOF is a range in which a resist pattern close to a mask pattern is obtained. The larger the value of DOF, the more preferable.

"Critical Dimension uniformity (CDU)" is a value of standard deviation between the average hole diameter, which is determined by measuring diameters of holes of, for example, a contact hole (CH) pattern as a fine pattern including a hole pattern and the like, and a measured hole diameter. The smaller the value of CDU, the more preferable.

Particularly, in order to improve DOF and CDU among the aforementioned lithography characteristics, it is important to control the diffusion of an acid. A short acid diffusion length leads to a problem in that the sensitivity easily deteriorates.

The present invention has been made under the circumstances described above, and an object thereof is to provide a resist composition which makes it possible to form a resist pattern having improved CDU and a resist pattern forming method in which the resist composition is used.

In order to achieve the aforementioned object, the present invention has adopted the following constitution.

By conducting an examination, the inventors of the present invention obtained knowledge that in a case where a polymer compound having at least two kinds of specific constituent units is used as a resin component of a resist composition, the aforementioned object can be achieved. Based on the knowledge, the inventors have accomplished the present invention.

[1] A resist composition containing a component (A) whose solubility in a developer changes by the action of an acid and an acid generator component (B) generating an acid through exposure, in which the component (A) contains a polymer compound having a constituent unit (a1) represented by Formula (1) and a constituent unit (a2) represented by Formula (2).

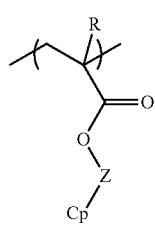

(1)

[In the formula, R represents a hydrogen atom, an alkyl group having 1 to 5 carbon atoms, or a halogenated alkyl group having 1 to 5 carbon atoms; Z represents a single bond or an alkylene group; and $C_p$ represents a group represented by Formula (Cp-1).]

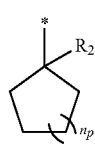

(Cp-1)

[In the formula, $R_2$ represents a tertiary alkyl group, $n_p$ represents a positive integer, and * represents a binding position in which (Cp-1) is bonded to Z.]

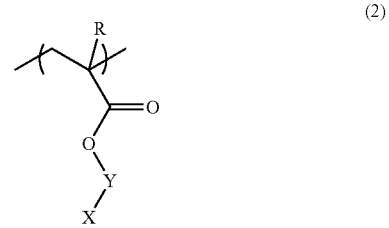

(2)

[In the formula, R represents a hydrogen atom, an alkyl group having 1 to 5 carbon atoms, or a halogenated alkyl group having 1 to 5 carbon atoms; Y represents a divalent linking group; and X represents a group represented by a formula selected from the group consisting of Formulae (a2-r-1) to (a2-r-7), (a5-r-1), and (a5-r-2).]

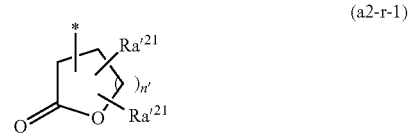

(a2-r-1)

(a2-r-2)

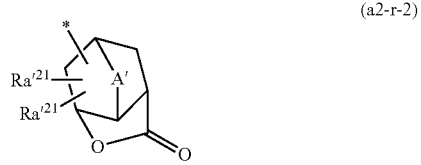

(a2-r-3)

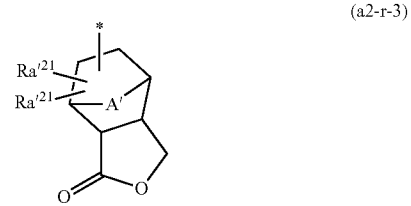

(a2-r-4)

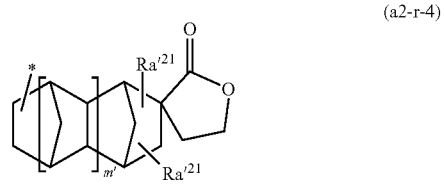

(a2-r-5)

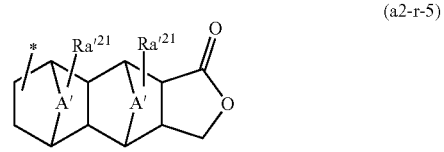

(a2-r-6)

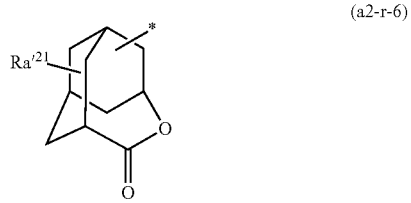

-continued

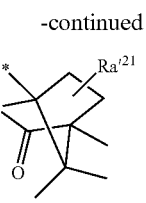
(a2-r-7)

[Chemical Formula 4]

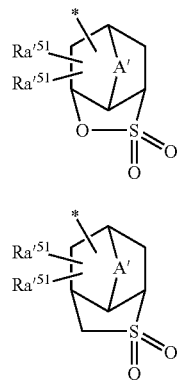
(a5-r-1)

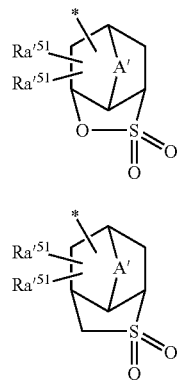
(a5-r-2)

[In the formulae, $Ra'^{21}$ and $Ra'^{51}$ each independently represent a hydrogen atom, a cyano group, or a halogen atom; A' represents an alkylene group having 1 to 5 carbon atoms that may contain an oxygen atom or a sulfur atom, an oxygen atom, or a sulfur atom; n' represents an integer of 0 to 2; and m' represents an integer of 0 or 1.]

[2] The resist composition described in [1], in which in Formula (Cp-1), $n_p$ represents an integer of 1 to 3, and $R_2$ represents a tertiary alkyl group having 4 to 10 carbon atoms.

[3] The resist composition described in [1] or [2], in which the constituent unit (a2) is a constituent unit represented by Formula (2-1) or Formula (2-2).

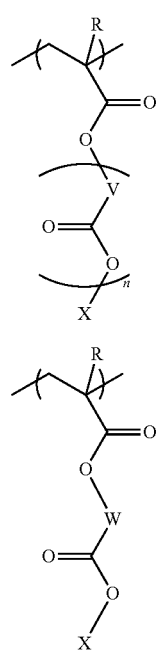

(2-1)

(2-2)

[In the formulae, R represents a hydrogen atom, an alkyl group having 1 to 5 carbon atoms, or a halogenated alkyl group having 1 to 5 carbon atoms; X represents a group represented by a formula selected from the group consisting of Formulae (a2-r-1) to (a2-r-7), (a5-r-1), and (a5-r-2); V and W each independently represent a divalent linking group; and n represents an integer of 1 to 5.]

[4] The resist composition described in any one of [1] to [3], in which in Formula (2), X represents a group represented by the formula selected from the group consisting of Formulae (a2-r-1), (a2-r-2), (a2-r-6), (a2-r-7), and (a5-r-1).

[5] The resist composition described in any one of [3], in which in Formula (2-1) or (a2-2), X represents a group represented by the formula selected from the group consisting of Formulae (a2-r-1), (a2-r-2), (a2-r-6), (a2-r-7), and (a5-r-1).

[7] A resist pattern forming method including a step of forming a resist film on a support by using the resist composition described in any one of [1] to [5], a step of subjecting the resist film to exposure, and a step of forming a resist pattern by developing the resist film.

According to the present invention, it is possible to provide a resist composition which makes it possible to form a resist pattern having improved CDU and a resist pattern forming method in which the resist composition is used.

DETAILED DESCRIPTION OF THE INVENTION

In the present specification and the claims of the present application, "aliphatic" is a concept comparative to "aromatic", and means a group not having aromaticity, a compound not having aromaticity, and the like.

Unless otherwise specified, "alkyl group" includes a linear, branched, and cyclic monovalent saturated hydrocarbon groups. The same is true for an alkyl group in an alkoxy group.

Unless otherwise specified, "alkylene group" includes linear, branched, and cyclic divalent saturated hydrocarbon groups.

"Halogenated alkyl group" is a group obtained in a case where some or all of the hydrogen atoms in an alkyl group are substituted with a halogen atom. Examples of the halogen atom include a fluorine atom, a chlorine atom, a bromine atom, and an iodine atom.

"Fluorinated alkyl group" or "fluorinated alkylene group" refers to a group obtained in a case where some or all of the hydrogen atoms in an alkyl group or an alkylene group are substituted with a fluorine atom.

"Constituent unit" means a monomer unit constituting a polymer compound (a resin, a polymer, or a copolymer).

The description of "may have a substituent" includes both the case where a hydrogen atom (—H) is substituted with a monovalent group and the case where a methylene group (—$CH_2$—) is substituted with a divalent group.

"Exposure" is a concept including the entire radiation irradiation process.

"Constituent unit derived from an acrylic ester" means a constituent unit constituted by the cleavage of an ethylenic double bond of an acrylic ester.

"Acrylic ester" is a compound obtained in a case where a hydrogen atom on a carboxy group terminal of an acrylic acid ($CH_2$=CH—COOH) is substituted with an organic group.

In the acrylic ester, a hydrogen atom bonded to a carbon atom in the α-position may be substituted with a substituent. The substituent ($R^{\alpha 0}$) substituting the hydrogen atom bonded to a carbon atom in the α-position is an atom or a group other than a hydrogen atom, and examples of the substituent include an alkyl group having 1 to 5 carbon atoms, a halogenated alkyl group having 1 to 5 carbon atoms, and the like. The substituent also includes an itaconic acid diester obtained in a case where the substituent ($R^{\alpha 0}$) is substituted with a substituent having an ester bond, and an αhydroxyacryl ester obtained in a case where the substituent ($R^{\alpha 0}$) is substituted with a group modifying a hydroxyalkyl group or a hydroxyl group thereof. Unless otherwise specified, the carbon atom in the α-position of the acrylic ester is a carbon atom to which a carbonyl group of acrylic acid is bonded.

Hereinafter, the acrylic ester obtained in a case where a hydrogen atom bonded to a carbon atom in the α-position is substituted with a substituent will be referred to as an α-substituted acrylic ester in some cases. Furthermore, the acrylic ester and the α-substituted acrylic ester will be collectively referred to as "(α-substituted) acrylic ester" in some cases.

"Styrene" conceptually includes styrene and those obtained in a case where a hydrogen atom in the α-position of styrene is substituted with other substituents such as an alkyl group and a halogenated alkyl group.

"Constituent unit derived from styrene" and "constituent unit derived from a styrene derivative" mean constituent units constituted by the cleavage of an ethylenic double bond of styrene or a styrene derivative.

The alkyl group as the aforementioned substituent in the α-position is preferably a linear or branched alkyl group. Specifically, examples thereof include an alkyl group having 1 to 5 carbon atoms (a methyl group, an ethyl group, a n-propyl group, an isopropyl group, a n-butyl group, an isobutyl group, a tert-butyl group, a pentyl group, an isopentyl group, or a neopentyl group) and the like.

Specific examples of the halogenated alkyl group as the substituent in the α-position include groups obtained in a case where some or all of the hydrogen atoms in "alkyl group as the substituent in the α-position" described above are substituted with a halogen atom. Examples of the halogen atom include a fluorine atom, a chlorine atom, a bromine atom, an iodine atom, and the like. Among these, a fluorine atom is particularly preferable.

Specifically, examples of the hydroxyalkyl group as the substituent in the α-position include groups obtained in a case where some or all of the hydrogen atoms in "alkyl group as the substituent in the α-position" described above are substituted with a hydroxyl group. The number of hydroxyl groups in the hydroxyalkyl group is preferably 1 to 5, and most preferably 1.

<<Resist Composition>>

The resist composition of the present invention is a resist composition which contains a component (A) whose solubility in a developer changes by the action of an acid and an acid generator component (B) generating an acid by the irradiation of radiation.

In the present invention, the resist composition contains a substrate component (A) (hereinafter, referred to as "component (A)" as well) whose solubility in a developer changes by the action of an acid.

In a case where a resist film is formed using the resist composition, and the resist film is subjected to selective exposure, an acid is generated in an exposed portion, and by the action of the acid, the solubility of the component (A) in a developer changes. In contrast, in an unexposed portion, the solubility of the component (A) in a developer does not change. Therefore, there is a difference in the solubility in the developer between the exposed portion and the unexposed portion. Accordingly, in a case where the resist film is developed, provided that the resist composition is a positive resist composition, the exposed portion is dissolved and removed, and a positive resist pattern is formed. Provided that the resist composition is a negative resist composition, the unexposed portion is dissolved and removed, and a negative resist pattern is formed.

In the present specification, a resist composition forming a positive resist pattern by the dissolution and removal of an exposed portion is referred to as a positive resist composition, and a resist composition forming a negative resist pattern by the dissolution and removal of an unexposed portion is referred to as a negative resist composition.

In the present invention, a resist composition may be a positive resist composition or a negative resist composition.

Furthermore, in the present invention, a resist composition may be used for an alkaline development process in which an alkaline developer is used in a development treatment at the time of forming a resist pattern, or used for a solvent development process in which a developer containing an organic solvent (an organic developer) is used in the development treatment.

The resist composition of the embodiment described above has an acid generating ability by generating an acid through exposure. The component (A) may generate an acid through exposure, or an additive component formulated separately from component (A) may generate an acid through exposure. However, it is preferable that the resist composition contains an acid generator component (B) (hereinafter, referred to as "component (B)" as well) generating an acid through exposure.

<Substrate Component>

In the present invention, "substrate component" is an organic compound having a film forming ability, and an organic compound having a molecular weight of equal to or greater than 500 is preferably used. In a case where the molecular weight of the organic compound is equal to or greater than 500, the film forming ability is improved, and a nanolevel resist pattern is easily formed.

The organic compound used as a substrate component is roughly classified into a non-polymer and a polymer.

As the non-polymer, generally, those having a molecular weight of equal to or greater than 500 and less than 4,000 are used. Hereinafter, "low-molecular weight compound" refers to a non-polymer having a molecular weight of equal to or greater than 500 and less than 4,000.

As the polymer, generally, those having a molecular weight of equal to or greater than 1,000 are used. Hereinafter, "resin" or "polymer compound" refers to a polymer having a molecular weight of equal to or greater than 1,000.

As the molecular weight of a polymer, a mass average molecular weight measured by gel permeation chromatography (GPC) and expressed in terms of polystyrene is used.

As the substrate component used in the resist composition of the present embodiment, at least component (A) is used, and other polymer compounds and/or low-molecular weight compounds may be used in combination with the component (A).

[Component (A)]

In the resist composition of the present embodiment, the component (A) contains a polymer compound having a constituent unit (a1) represented by Formula (1) and a constituent unit (a2) represented by Formula (2) (hereinafter, the polymer compound will be referred to as "component (A)").

In a case where a resist film formed using the resist composition containing the component (A) is subjected to exposure, by the action of an acid, at least some of the bonds in the structures of the constituent unit (a1) are cleaved, and hence the polarity increases. Accordingly, in a case where an organic developer is used as a developer (a solvent development process), the resist composition of the present embodiment becomes a negative resist composition, and in a case where an alkaline developer is used as a developer (an alkaline development process), the resist composition of the present embodiment becomes a positive resist composition. The polarity of the component (A) changes before and after exposure. Therefore, by using the component (A), excellent development contrast can be obtained not only in the alkaline development process but also in the solvent development process.

That is, in a case where the solvent development process is adopted, the component (A) exhibits high solubility in the organic developer before exposure. In a case where an acid is generated through exposure, by the action of the acid, the polarity increases, and the solubility in the organic developer decreases. Accordingly, in a case where a resist film, which is obtained by coating a support with the resist composition, is selectively exposed at the time of forming a resist pattern, while the exposed portion soluble in the organic developer becomes poorly soluble, the unexposed portion remains soluble without a change. Therefore, by performing development in the organic developer, a contrast can be made between the exposed portion and the unexposed portion, and a negative resist pattern can be formed.

In contrast, in a case where the alkaline development process is adopted, the component (A) exhibits low solubility in the alkaline developer before exposure. In a case where an acid is generated through exposure, by the action of the acid, the polarity increases, and the solubility in the alkaline developer increases. Accordingly, in a case where a resist film, which is obtained by coating a support with the resist composition, is selectively exposed at the time of forming a resist pattern, while the exposed portion poorly soluble in the alkaline developer becomes soluble, the unexposed portion remains poorly soluble without a change. Therefore, by performing development in the alkaline developer, a contrast can be made between the exposed portion and the unexposed portion, and a positive resist pattern can be formed.

(Constituent Unit (a1))

The constituent unit (a1) is a constituent unit having an acid-decomposable group whose polarity increases by the action of an acid.

"Acid-decomposable group" is a group decomposed by an acid, in which at least some of the bonds in the structure of the acid-decomposable group can be cleaved by the action of an acid.

Examples of the acid-decomposable group whose polarity increases by the action of an acid include a group generating a polar group by being decomposed by the action of an acid.

Examples of the polar group include a carboxy group, a hydroxyl group, an amino group, a sulfo group ($-SO_3H$), and the like. Among these, a polar group containing —OH in the structure is preferable (hereinafter, referred to as an "OH-containing polar group" in some cases), a carboxy group or a hydroxyl group is more preferable, and a carboxy group is particularly preferable.

More specifically, examples of the acid-decomposable group include a group in which the aforementioned polar group is protected with an acid-dissociable group (for example, a group in which a hydrogen atom of the OH-containing polar group is protected with an acid-dissociable group).

Herein, "acid-dissociable group" refers to both of (i) a group dissociated by an acid, in which a bond between the acid-dissociable group and an atom adjacent to the acid-dissociable group can be cleaved by the action of an acid and (ii) a group in which a bond between the acid-dissociable group and an atom adjacent to the acid-dissociable group can be cleaved by the occurrence of a decarboxylation reaction following the cleavage of some bonds by the action of an acid.

The acid-dissociable group constituting the acid-decomposable group needs to be a group having polarity lower than that of a polar group generated by the dissociation of the acid-dissociable group. Provided that the acid-dissociable group is such a group, in a case where the acid-dissociable group is dissociated by the action of an acid, a polar group having polarity higher than that of the acid-dissociable group is generated, and the polarity increases. As a result, overall polarity of the component (A) increases. Due to the increase in polarity, the solubility in a developer relatively changes, and in a case where the developer is an organic developer, the solubility decreases.

The acid-dissociable group is not particularly limited, and those suggested so far as acid-dissociable groups of base resins for chemical amplification-type resists can be used.

Among the aforementioned polar groups, as an acid-dissociable group protecting a carboxy group or a hydroxyl group, an acid-dissociable group represented by Formula (a1-r-1) (hereinafter, for the sake of convenience, referred to as "acetal-type acid-dissociable group" in some cases) can be exemplified.

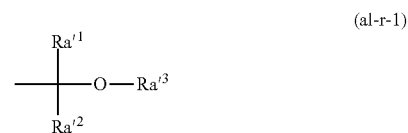

(a1-r-1)

[In the formula, $Ra'^1$ and $Ra'^2$ each represent a hydrogen atom or an alkyl group, $Ra'^3$ represents a hydrocarbon group and may form a ring by being bonded to any of $Ra'^1$ and $Ra'^2$. * represents a bond.]

In Formula (a1-r-1), examples of the alkyl group represented by $Ra'^1$ and $Ra'^2$ include the same alkyl groups exemplified above as substituents which may be bonded to a carbon atom in the α-position in the description relating to the α-substituted acrylic ester. Among these, a methyl group or an ethyl group is preferable, and a methyl group is most preferable.

The hydrocarbon group represented by $Ra'^3$ is preferably an alkyl group having 1 to 20 carbon atoms and more preferably an alkyl group having 1 to 10 carbon atoms. The hydrocarbon group is preferably a linear or branched alkyl group, and specifically, examples thereof include a methyl group, an ethyl group, a propyl group, an isopropyl group, a n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group, a 2,2-dimethylbutyl group, and the like.

In a case where $Ra'^3$ is a cyclic hydrocarbon group, the hydrocarbon group may be aliphatic or aromatic and may be polycyclic or monocyclic. As the monocyclic alicyclic hydrocarbon group, a group obtained by removing one hydrogen atom from monocycloalkane is preferable. As the monocycloalkane, those having 3 to 8 carbon atoms are preferable. Specifically, examples thereof include cyclopentane, cyclohexane, cyclooctane, and the like. As the polycyclic alicyclic hydrocarbon group, a group obtained by removing one hydrogen atom form polycycloalkane is preferable. As the polycycloalkane, those having 7 to 12 carbon atoms are preferable. Specifically, examples thereof include adamantane, norbornane, isobornane, tricyclodecane, tetracyclododecane, and the like.

In a case where $Ra'^3$ is an aromatic hydrocarbon group, examples of the aromatic ring contained therein specifically include an aromatic hydrocarbon ring such as benzene, biphenyl, fluorene, naphthalene, anthracene, or phenanthrene; an aromatic heterocycle obtained in a case where some of the carbon atoms constituting the aromatic hydrocarbon ring are substituted with a heteroatom; and the like. Examples of the heteroatom in the aromatic heterocycle include an oxygen atom, a sulfur atom, a nitrogen atom, and the like.

Specific examples of the aromatic hydrocarbon group include a group obtained by removing one hydrogen atom from the aromatic hydrocarbon ring (an aryl group); a group obtained in a case where one hydrogen atom in the aryl group is substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group); and the like. The number of carbon atoms in the aforementioned alkylene group (an alkyl chain in the arylalkyl group) is preferably 1 to 4, more preferably 1 or 2, and particularly preferably 1.

In a case where $Ra'^3$ forms a ring by being bonded to any of $Ra'^1$ and $Ra'^2$, the formed cyclic group is preferably 4- to 7-membered ring, and more preferably a 4- to 6-membered ring. Specific examples of the cyclic group include a tetrahydropyranyl group, a tetrahydrofuranyl group, and the like.

Among the aforementioned polar groups, as the acid-dissociable group protecting a carboxy group, an acid-dissociable group represented by Formula (a1-r-2) can be exemplified.

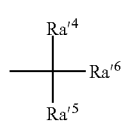

(a1-r-2)

[In the formula, $Ra'^4$ to $Ra'^6$ each represent a hydrocarbon group, and $Ra'^5$ and $Ra'^6$ may form a ring by being bonded to each other. * represents a bond.]

Examples of the hydrocarbon group represented by $Ra'^4$ to $Ra'^6$ include the same hydrocarbon group as $Ra'^3$. $Ra'^4$ is preferably an alkyl group having 1 to 5 carbon atoms. In a case where $Ra'^5$ and $Ra'^6$ form a ring by being bonded to each other, examples of the ring include a group represented by Formula (a1-r2-1).

In a case where $Ra'^4$ to $Ra'^6$ are not bonded to each other and each independently represent a hydrocarbon group, examples of the hydrocarbon group include a group represented by Formula (a1-r2-2).

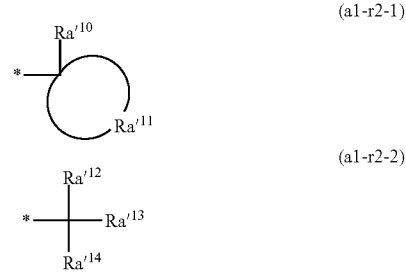

[In the formulae, $Ra'^{10}$ represents an alkyl group having 1 to 10 carbon atoms, $Ra'^{11}$ represents a group forming an aliphatic cyclic group together with a carbon atom to which $Ra'^{10}$ is bonded, and $Ra'^{12}$ to $Ra'^{14}$ each independently represent a hydrocarbon group. * represents a bond.]

In Formula (a1-r2-1), the alkyl group having 1 to 10 carbon atoms that is represented by $Ra'^{10}$ is preferably a group exemplified above as the linear or branched alkyl group represented by $Ra'^3$ in Formula (a1-r-1). In Formula (a1-r2-1), the aliphatic cyclic group constituted with $Ra'^{11}$ is preferably a group exemplified above as the cyclic alkyl group represented by $Ra'^3$ in Formula (a1-r-1).

In Formula (a1-r2-2), $Ra'^{12}$ and $Ra'^{14}$ preferably each independently represent an alkyl group having 1 to 10 carbon atoms. The alkyl group is more preferably a group exemplified above as the linear or branched alkyl group represented by $Ra'^3$ in Formula (a1-r-1), even more preferably a linear alkyl group having 1 to 5 carbon atoms, and particularly preferably a methyl group or an ethyl group.

In Formula (a1-r2-2), $Ra'^{13}$ is preferably a linear, branched, or cyclic alkyl group exemplified above as the hydrocarbon group represented by $Ra'^3$ in Formula (a1-r-1). Among these, a group exemplified above as the cyclic alkyl group represented by $Ra'^3$ is more preferable.

Specific examples of Formula (a1-r2-1) will be shown below. In the following formulae, "*" represents a bond.

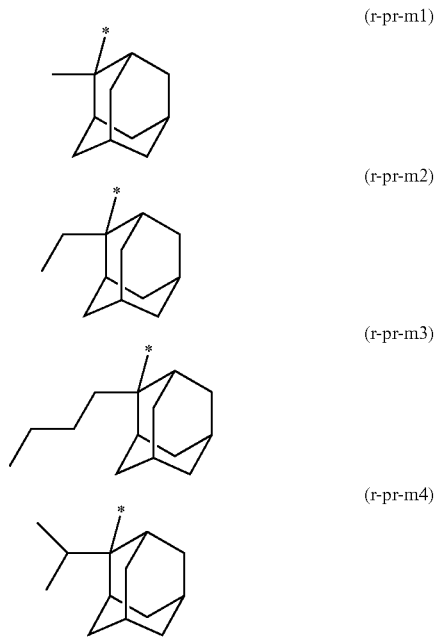

(r-pr-m5)
(r-pr-m6)
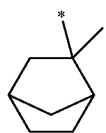
(r-pr-m7)
(r-pr-m8)
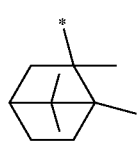
(r-pr-m9)
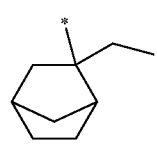
(r-pr-m10)
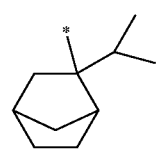
(r-pr-m11)
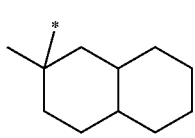
(r-pr-m12)
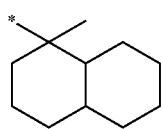
(r-pr-m13)
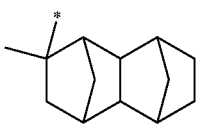
(r-pr-m14)
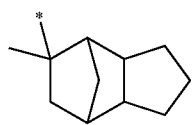
(r-pr-m15)
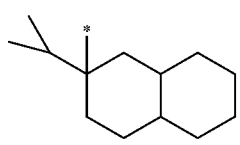
(r-pr-m16)
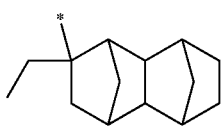
(r-pr-m17)
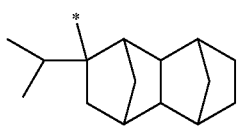
(r-pr-s1)
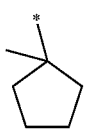
(r-pr-s2)
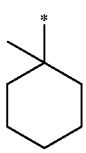
(r-pr-s3)
(r-pr-s4)
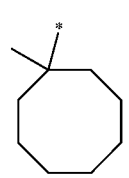
(r-pr-s5)
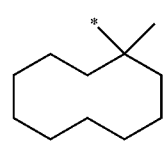
(r-pr-s6)
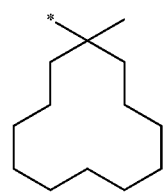
(r-pr-s7)
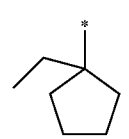
(r-pr-s8)
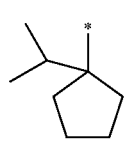

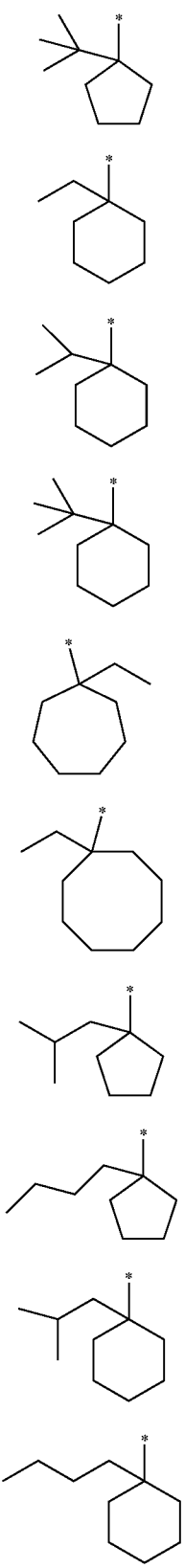
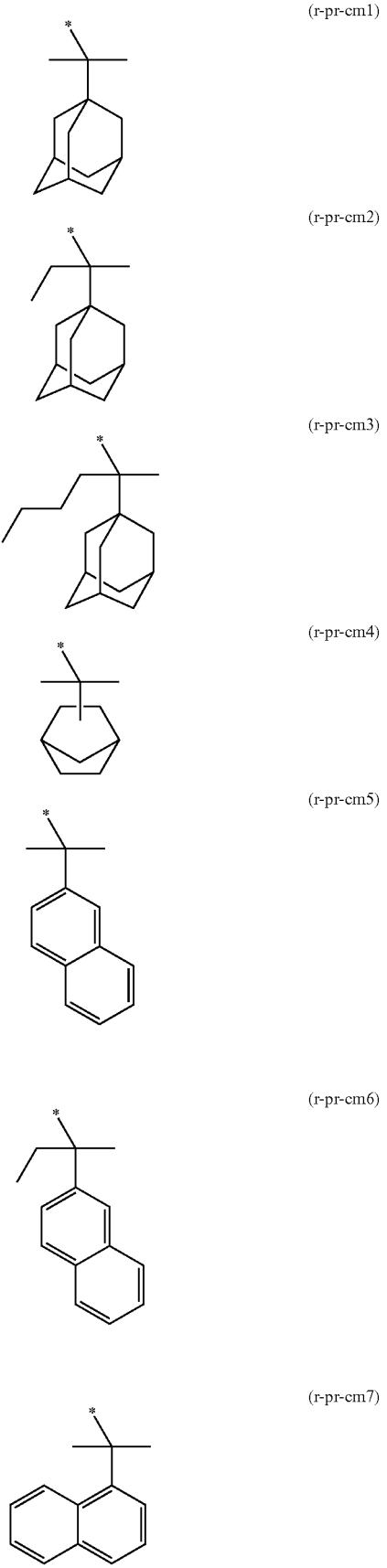
Specific examples of Formula (a1-r2-2) will be shown below.

-continued (r-pr-cm8)
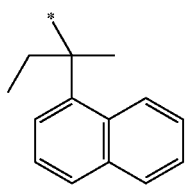

(r-pr-cs1)
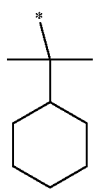

(r-pr-cs2)
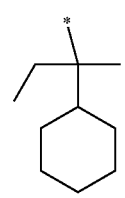

(r-pr-cs3)
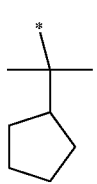

(r-pr-cs4)
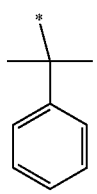

(r-pr-cs5)
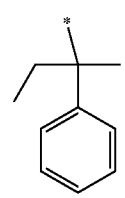

(r-pr-c1)

(r-pr-c2)

(r-pr-c3)
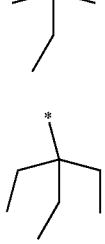

-continued (r-pr-c4)
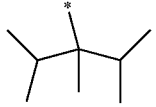

As the acid-dissociable group protecting a hydroxyl group among the aforementioned polar groups, an acid-dissociable group represented by Formula (a1-r-3) (hereinafter, for the sake of convenience, referred to as "tertiary alkyloxycarbonyl acid-dissociable group" in some cases) can be exemplified.

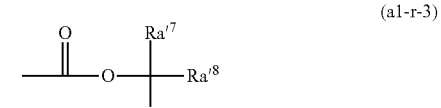

(a1-r-3)

[In the formula, $Ra'^7$ to $Ra'^9$ each represent an alkyl group. * represents a bond.]

In Formula (a1-r-3), $Ra'^7$ to $Ra'^9$ preferably each represent an alkyl group having 1 to 5 carbon atoms, and more preferably each represent an alkyl group having 1 to 3 carbon atoms.

The total number of carbon atoms in each alkyl group is preferably 3 to 7, more preferably 3 to 5, and most preferably 3 or 4.

The acid-decomposable group of the present invention preferably generates a polar group (a carboxy group) by being decomposed by the action of an acid. That is, the acid-decomposable group is a group in which the aforementioned polar group is protected by an acid-dissociable group.

Specifically, as the constituent unit (a1) having the acid-decomposable group, a constituent unit represented by Formula (1) is preferable.

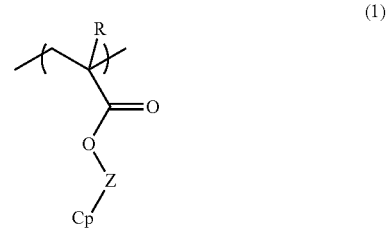

(1)

[In the formula, R represents a hydrogen atom, an alkyl group, or a halogenated alkyl group; Z represents a single bond or an alkylene group; and $C_p$ represents a group represented by Formula (Cp-1).]

(Cp-1)

[In the formula, $R_2$ represents a tertiary alkyl group, $n_p$ represents a positive integer, and * represents a binding position in which (Cp-1) is bonded to Z.]

In Formula (1), the alkyl group represented by R is preferably a linear or branched alkyl group having 1 to 5 carbon atoms. Specifically, examples thereof include a methyl group, an ethyl group, a n-propyl group, an isopropyl group, a n-butyl group, an isobutyl group, a tert-butyl group, a pentyl group, an isopentyl group, a neopentyl group, and the like.

In Formula (1), the halogenated alkyl group represented by R is a group obtained in a case where some or all of the hydrogen atoms in the aforementioned alkyl group are substituted with a halogen atom. Examples of the halogen atom include a fluorine atom, a chlorine atom, a bromine atom, an iodine atom, and the like. Among these, a fluorine atom is particularly preferable.

R is preferably a hydrogen atom, an alkyl group having 1 to 5 carbon atoms, or a fluorinated alkyl group having 1 to 5 carbon atoms, more preferably a hydrogen atom or an alkyl group having 1 to 5 carbon atoms from the viewpoint of ease of industrial availability, and particularly preferably a methyl group.

In Formula (1), Z represents a single bond or an alkylene group as a linking group.

Examples of the alkylene group represented by Z include the alkylene group having 1 to 5 carbon atoms. The alkylene group is preferably an alkylene group having 1 to 3 carbon atoms, more preferably an alkylene group having 1 or 2 carbon atoms.

In Formula (1), $C_p$ represents a group represented by Formula (Cp-1).

In Formula (Cp-1), $R_2$ represents a tertiary alkyl group, and the tertiary alkyl group is preferably an alkyl group having 4 to 10 carbon atoms, more preferably an alkyl group having 4 to 6 carbon atoms, and most preferably a tert-butyl group.

In Formula (Cp-1), $n_p$ represents a positive integer which is preferably 1 to 10, more preferably 1 to 5, and most preferably 1 to 3.

In Formula (CP-1), $R_2$ preferably represents a tert-butyl group, and $n_p$ preferably represents 1.

The constituent unit (a1) is a constituent unit having an acid-decomposable group whose polarity increases by the action of an acid.

The acid-decomposable group in the constituent unit (a1) requires a relatively lower activation energy, which is necessary for at least some of the bonds in the structure of the acid-decomposable group to be cleaved by the action of an acid, compared to other acid-dissociable groups (that is, the aforementioned acid-decomposable group is easily dissociated by the action of an acid).

In the present invention, preferable examples of the constituent unit (a1) include the following constituent units and the like. As the constituent unit (a1) the constituent unit represented by Formula (1-1) is most preferable.

(1-1)

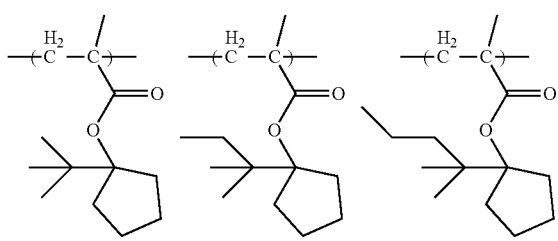

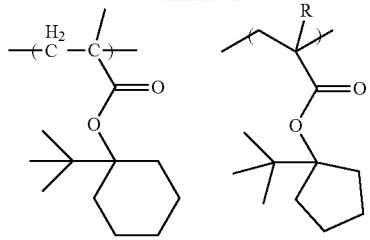

In Formula (1-1), R has the same definition as R in Formula (1) described above.

The proportion of the constituent unit (a1) in the component (A) with respect to all the constituent units constituting the component (A) is preferably 20 to 80 mol %, more preferably 20 to 75 mol %, and even more preferably 25 to 70 mol %. In the case where the proportion is equal to or higher than the lower limit described above, the lithography characteristics such as sensitivity, resolution, and LWR are improved. In a case where the proportion is equal to or lower than the upper limit described above, the constituent unit (a1) can be well balanced with other constituent units.

(Constituent Unit (a2))

In the present invention, the component (A) can contain a constituent unit (a2) having a lactone cyclic group or a —SO$_2$—-containing cyclic group.

In a case where the constituent unit (a2) having the lactone cyclic group or the —SO$_2$—-containing cyclic group is used together with the constituent unit (a1), it is possible to provide a resist composition which can form a resist pattern having improved CDU and to provide a resist pattern forming method in which the resist composition is used.

The constituent unit (a2) is preferably a constituent unit represented by Formula (2).

(2)

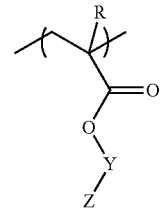

In Formula (2), R represents a hydrogen atom, an alkyl group, or a halogenated alkyl group.

In Formula (2), the alkyl group represented by R is preferably an alkyl group having 1 to 5 carbon atoms, and more preferably a linear or branched alkyl group having 1 to 5 carbon atoms. Specifically, examples thereof include a methyl group, an ethyl group, a propyl group, an isopropyl group, a n-butyl group, an isobutyl group, a tert-butyl group, a pentyl group, an isopentyl group, a neopentyl group, and the like.

In Formula (2), the halogenated alkyl group represented by R is preferably a halogenated divalent having 1 to 5 carbon atoms. The halogenated alkyl group is a group obtained in a case where some or all of the hydrogen atoms in the alkyl group having 1 to 5 carbon atoms are substituted with a halogen atom. Examples of the halogen atom include a fluorine atom, a chlorine atom, a bromine atom, an iodine atom, and the like. Among these, a fluorine atom is particularly preferable.

R is preferably a hydrogen atom, an alkyl group having 1 to 5 carbon atoms, or a fluorinated alkyl group having 1 to 5 carbon atoms, and most preferably a hydrogen atom or a methyl group from the viewpoint of ease of industrial availability.

In Formula (2), Y represents a divalent linking group.

The divalent linking group represented by Y is not particularly limited, and examples of the group suitable as Y include a divalent hydrocarbon group which may have a substituent, a divalent linking group having a heteroatom, and the like.

Divalent hydrocarbon group which may have substituent:

In a case where Y is a divalent hydrocarbon group which may have a substituent, the hydrocarbon group may be an aliphatic hydrocarbon group or an aromatic hydrocarbon group.

Aliphatic Hydrocarbon Group

The aliphatic hydrocarbon group means a hydrocarbon group not having aromaticity. The aliphatic hydrocarbon group may be saturated or unsaturated. Generally, it is preferable that the aliphatic hydrocarbon group is saturated. Examples of the aliphatic hydrocarbon group include a linear or branched aliphatic hydrocarbon group, an aliphatic hydrocarbon group having a ring in the structure thereof, and the like.

Linear or Branched Aliphatic Hydrocarbon Group

The number of carbon atoms in the linear aliphatic hydrocarbon group is preferably 1 to 10, more preferably 1 to 6, even more preferably 1 to 4, and most preferably 1 to 3.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$—], and the like.

The number of carbon atoms in the linear aliphatic hydrocarbon group is preferably 3 to 10, more preferably 3 to 6, even more preferably 3 or 4, and most preferably 3.

As the branched aliphatic hydrocarbon group, a branched alkylene group is preferable. Specifically, examples thereof include an alkylalkylene group including an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group such as —$CH(CH_3)CH_2CH_2$— or —$CH_2CH(CH_3)CH_2$—; and an alkyltetramethylene group such as —$CH(CH_3)CH_2CH_2CH_2$— or —$CH_2CH(CH_3)CH_2CH_2$—. As the alkyl group in the alkylalkylene group, a linear alkyl group having 1 to 5 carbon atoms is preferable.

The aforementioned linear or branched aliphatic hydrocarbon group may or may not have a substituent. Examples of the substituent include a fluorine atom, a fluorinated alkyl group having 1 to 5 carbon atoms substituted with a fluorine atom, a carbonyl group, and the like.

Aliphatic Hydrocarbon Group Having Ring in Structure Thereof

The aliphatic hydrocarbon group having a ring in the structure thereof can have a substituent containing a heteroatom in the cyclic structure. Examples thereof include a cyclic aliphatic hydrocarbon group (a group obtained by removing two hydrogen atoms from an aliphatic hydrocarbon ring), a group in which the cyclic aliphatic hydrocarbon group is bonded to a terminal of a linear or branched aliphatic hydrocarbon group, a group in which the cyclic aliphatic hydrocarbon group is in the middle of a linear or branched aliphatic hydrocarbon group, and the like. Examples of the linear or branched aliphatic hydrocarbon group include the same ones as described above.

The number of carbon atoms in the cyclic aliphatic hydrocarbon group is preferably 3 to 20, and more preferably 3 to 12.

The cyclic aliphatic hydrocarbon group may be polycyclic or monocyclic. As the monocyclic alicyclic hydrocarbon group, a group obtained by removing two hydrogen atoms from monocycloalkane is preferable. As the monocycloalkane, those having 3 to 6 carbon atoms are preferable. Specifically, examples thereof include cyclopentane, cyclohexane, and the like. The polycyclic alicyclic hydrocarbon group is preferably a group obtained by removing two hydrogen atoms from polycycloalkane. As the polycycloalkane, those having 7 to 12 carbon atoms are preferable. Specifically, examples thereof include adamantane, norbornane, isobornane, tricyclodecane, tetracyclododecane, and the like.

The cyclic aliphatic hydrocarbon group may or may not have a substituent. Examples of the substituent include an alkyl group, an alkoxy group, a halogen atom, a halogenated alkyl group, a hydroxyl group, a carbonyl group, and the like.

The alkyl group as the substituent is preferably an alkyl group having 1 to 5 carbon atoms, and most preferably a methyl group, an ethyl group, a propyl group, a n-butyl group, or a tert-butyl group.

The alkoxy group as the substituent is preferably an alkoxy group having 1 to 5 carbon atoms, more preferably a methoxy group, an ethoxy group, a n-propoxy group, a iso-propoxy group, a n-butoxy group, or a tert-butoxy group, and most preferably a methoxy group or an ethoxy group.

Examples of the halogen atom as the substituent include a fluorine atom, a chlorine atom, a bromine atom, an iodine atom, and the like. Among these, a fluorine atom is preferable.

Examples of the halogenated alkyl group as the substituent include a group obtained in a case where some or all of the hydrogen atoms in the aforementioned alkyl group are substituted with the aforementioned halogen atom.

Some of the carbon atoms constituting the cyclic structure of the cyclic aliphatic hydrocarbon group may be substituted with a substituent having a heteroatom. The substituent containing a heteroatom is preferably —O—, —C(=O)—O—, —S—, —S(=O)$_2$—, or —S(=O)$_2$—O—.

Aromatic Hydrocarbon Group

The aromatic hydrocarbon group is a hydrocarbon group having at least one aromatic ring. The aromatic ring is not particularly limited as long as it is a cyclic conjugated system having 4n+2 π electrons, and can be monocyclic or polycyclic. The number of carbon atoms in the aromatic ring is preferably 5 to 30, more preferably 5 to 20, even more preferably 6 to 15, and particularly preferably 6 to 12. Here, the number of carbon atoms does not include the number of carbon atoms in the substituent. Specifically, examples of the aromatic ring include an aromatic hydrocarbon ring such as benzene, naphthalene, anthracene, or phenanthrene; an aromatic heterocycle obtained in a case where some of the carbon atoms constituting the aromatic hydrocarbon ring are substituted with a heteroatom; and the like. Examples of the heteroatom in the aromatic heterocycle include an oxygen atom, a sulfur atom, a nitrogen atom, and the like. Specifically, examples of the aromatic heterocycle include a pyridine ring, a thiophene ring, and the like.

Specifically, examples of the aromatic hydrocarbon group include a group obtained by removing two hydrogen atoms from the aromatic hydrocarbon ring or aromatic heterocycle described above (an arylene group or a heteroarylene group); a group obtained by removing two hydrogen atoms from an aromatic compound (for example, biphenyl, fluorene, or the like) having two or more aromatic rings; a group obtained in a case where one of the hydrogen atoms in a group (an aryl group or a heteroaryl group) obtained by removing one hydrogen atom from the aromatic hydrocarbon ring or aromatic heterocycle described above is substituted with an alkylene group (for example, a group obtained by removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group); and the like. The number of carbon atoms in the alkylene group bonded to the aryl group or heteroaryl group described above is preferably 1 to 4, more preferably 1 or 2, and particularly preferably 1.

The hydrogen atom contained in the aforementioned aromatic hydrocarbon group may be substituted with a substituent. For example, the hydrogen atom bonded to the aromatic ring in the aromatic hydrocarbon group may be substituted with a substituent. Examples of the substituent include an alkyl group, an alkoxy group, a halogen atom, a halogenated alkyl group, a hydroxyl group, and the like.

The alkyl group as the substituent is preferably an alkyl group having 1 to 5 carbon atoms, and most preferably a methyl group, an ethyl group, a propyl group, a n-butyl group, or a tert-butyl group.

Examples of the alkoxy group, the halogen atom, and the halogenated alkyl group as the substituent include those exemplified above as the substituent substituting the hydrogen atom contained in the cyclic aliphatic hydrocarbon group described above.

Divalent linking group having heteroatom:

In a case where Y represents a divalent linking group having a heteroatom, examples of groups preferable as the linking group include —O—, —C(=O)—O—, —C(=O)—, —O—C(=O)—O—, —C(=O)—NH—, —C(=O)—NH—C(=O)—, —NH—, —NH—C(=NH)— (H may be substituted with a substituent such as an alkyl group or an acyl group), —S—, —S(=O)$_2$—, —S(=O)$_2$—O—, a group represented by Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$, —[Y$^{21}$—C(=O)—O]$_{m''}$—, —Y$^{21}$—O—C(=O)—Y$^{22}$—, or —Y$^{21}$—S(=O)$_2$—O—Y$^{22}$— [in the formulae, Y$^{21}$ and Y$^{22}$ each independently represent a divalent hydrocarbon group which may have a substituent, O represents an oxygen atom, and m" represents an integer of 0 to 5], and the like.

In a case where the divalent linking group having a heteroatom is C(=O)—NH—, —C(=O)—NH—C(=O)—, —NH—, or —NH—C(=NH)—, H may be substituted with a substituent such as an alkyl group or an acyl group. The number of carbon atoms in the substituent (the alkyl group, the acyl group, or the like) is preferably 1 to 10, more preferably 1 to 8, and particularly preferably 1 to 5.

In Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$, —[Y$^{21}$—C(=O)—O]$_{m''}$—, —Y$^{21}$—O—C(=O)—Y$^{22}$—, or —Y$^{21}$—S(=O)$_2$—O—Y$^{22}$—, Y$^{21}$ and Y$^{22}$ each independently represent a divalent hydrocarbon group which may have a substituent. Examples of the divalent hydrocarbon group include the same divalent hydrocarbon groups (the divalent hydrocarbon groups which may have a substituent) as those exemplified above as the aforementioned divalent linking group.

Y$^{21}$ is preferably a linear aliphatic hydrocarbon group, more preferably a linear alkylene group, even more preferably a linear alkylene group having 1 to 5 carbon atoms, and particularly preferably a methylene group or an ethylene group.

Y$^{22}$ is preferably a linear or branched aliphatic hydrocarbon group, and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m" represents an integer of 0 to 3. m" is preferably an integer of 0 to 2, more preferably 0 or 1, and particularly preferably 1. That is, as the group represented by Formula —[Y$^{21}$—C(=O)—O]$_{m}$—Y$^{22}$-, a group represented by Formula —Y$^{21}$—C(=O)—O—Y$^{22}$— is particularly preferable. Especially, a group represented by Formula —(CH$_2$)$_{a'}$—C(=O)—O—(CH$_2$)$_{b'}$— is preferable. In the formula, a' represents an integer of 1 to 10. a' is preferably an integer of 1 to 8, more preferably an integer of 1 to 5, even more preferably 1 or 2, and most preferably 1. b' is an integer of 1 to 10, preferably an integer of 1 to 8, more preferably an integer of 1 to 5, even more preferably 1 or 2, and most preferably 1.

In the present invention, Y is preferably an ester bond (—C(=O)—O—), an ether bond (—O—), a linear or branched alkylene group, or a combination of these. Y is preferably an alkylene group or a divalent linking group having an ester bond, because then a resist pattern having excellent lithography characteristics and an excellent shape is easily formed. Y is particularly preferably an alkylene group, —[Y$^{21}$—C(=O)—O]$_{m''}$— or —Y$^{21}$—C(=)—O—.

Because the constituent unit (a2) has the aforementioned linking group, the invention of the present application brings about an effect of improving the in-plane uniformity of the dimension of a resist pattern.

The constituent unit represented by Formula (2) is preferably a constituent unit represented by Formula (2-1) or Formula (2-2).

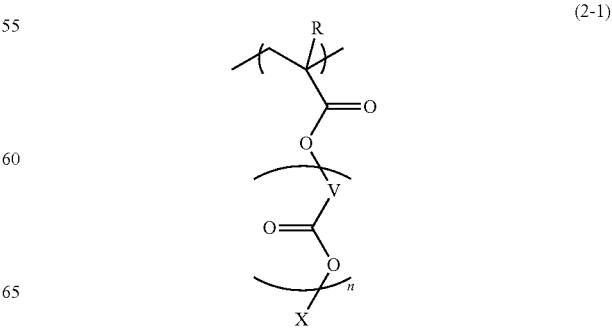

(2-1)

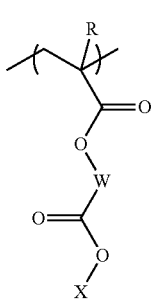

R in Formula (2-1) and Formula (2-2) has the same definition as R in Formula (2).

In Formula (2-1), n represents an integer of 1 to 5.

In Formula (2-1), V represents a divalent linking group. The divalent linking group in V includes the same divalent linking group as Y in Formula (2). The divalent linking group in V is preferably a divalent hydrocarbon group.

In Formula (2-1), a divalent hydrocarbon group in V may be an aliphatic hydrocarbon group or an aromatic hydrocarbon group. The aliphatic hydrocarbon group means a hydrocarbon group not having aromaticity. The aliphatic hydrocarbon group as the divalent hydrocarbon group represented by V may be saturated or unsaturated. Generally, it is preferable that the aliphatic hydrocarbon group is saturated.

More specifically, examples of the aliphatic hydrocarbon group include a linear or branched aliphatic hydrocarbon group, an aliphatic hydrocarbon group having a ring in the structure thereof, and the like.

Examples of V include those obtained in a case where the aforementioned divalent hydrocarbon groups are bonded to each other through an ether bond, a urethane bond, or an amide bond.

The number of carbon atoms in the linear or branched aliphatic hydrocarbon group is preferably 1 to 10, more preferably 1 to 6, even more preferably 1 to 4, and most preferably 1 to 3.

As the linear aliphatic hydrocarbon group, a linear alkylene group is preferable. Specifically, examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—], and the like.

As the branched aliphatic hydrocarbon group, a branched alkylene group is preferable. Specifically, examples thereof include an alkylalkylene group including an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, or —C(CH$_2$CH$_3$)$_2$—; an alkylethylene group such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, or —C(CH$_2$CH$_3$)$_2$—CH$_2$—; an alkyltrimethylene group such as —CH(CH$_3$)CH$_2$CH$_2$— or —CH$_2$CH(CH$_3$)CH$_2$—; and an alkyltetramethylene group such as —CH(CH$_3$)CH$_2$CH$_2$CH$_2$— or —CH$_2$CH(CH$_3$)CH$_2$CH$_2$—. As the alkyl group in the alkylalkylene group, a linear alkyl group having 1 to 5 carbon atoms is preferable.

Examples of the aliphatic hydrocarbon group having a ring in the structure thereof include an alicyclic hydrocarbon group (a group obtained by removing two hydrogen atoms from an aliphatic hydrocarbon ring), a group obtained in a case where an alicyclic hydrocarbon group is bonded to a terminal of a linear or branched aliphatic hydrocarbon group, a group in which an alicyclic hydrocarbon group is in the middle of a linear or branched aliphatic hydrocarbon group, and the like. Examples of the linear or branched aliphatic hydrocarbon group are the same as described above.

The number of carbon atoms in the alicyclic hydrocarbon group is preferably 3 to 20, and more preferably 3 to 12.

The alicyclic hydrocarbon group may be polycyclic or monocyclic. As the monocyclic alicyclic hydrocarbon group, a group obtained by removing two hydrogen atoms from monocycloalkane is preferable. As the monocycloalkane, those having 3 to 6 carbon atoms are preferable. Specifically, examples thereof include cyclopentane, cyclohexane, and the like. As the polycyclic alicyclic hydrocarbon group, a group obtained by removing two hydrogen atoms from polycycloalkane is preferable. As the polycycloalkane, those having 7 to 12 carbon atoms are preferable. Specifically, examples thereof include adamantane, norbornane, isobornane, tricyclodecane, tetracyclododecane, and the like.

The aromatic hydrocarbon group is a hydrocarbon group having an aromatic ring.

The number of carbon atoms in the aromatic hydrocarbon group as the divalent hydrocarbon group represented by V is preferably 3 to 30, more preferably 5 to 30, even more preferably 5 to 20, particularly preferably 6 to 15, and most preferably 6 to 10. Here, the number of carbon atoms does not include the number of carbon atoms in the substituent.

Specifically, examples of the aromatic ring included in the aromatic hydrocarbon group include an aromatic hydrocarbon ring such as benzene, biphenyl, fluorene, naphthalene, anthracene, or phenanthrene; an aromatic heterocycle obtained in a case where some of the carbon atoms constituting the aromatic hydrocarbon ring are substituted with a heteroatom; and the like. Examples of the heteroatom in the aromatic heterocycle include an oxygen atom, a sulfur atom, a nitrogen atom, and the like.

Specifically, examples of the aromatic hydrocarbon group include a group obtained by removing two hydrogen atoms from the aromatic hydrocarbon ring (an arylene group); a group obtained in a case where one of the hydrogen atoms in a group (an aryl group) obtained by removing one hydrogen atom from the aromatic hydrocarbon ring is substituted with an alkylene group (a group obtained by removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group); and the like. The number of carbon atoms in the alkylene group (the alkyl chain in the arylalkyl group) is preferably 1 to 4, more preferably 1 or 2, and particularly preferably 1.

In Formula (2-2), W represents a divalent linking group. The divalent linking group in W includes the same divalent linking group as Y in Formula (2). The divalent linking group in W is preferably a divalent hydrocarbon group.

In Formula (2-2), the divalent hydrocarbon group represented by W may be an aliphatic hydrocarbon group or an aromatic hydrocarbon group. The aliphatic hydrocarbon group means a hydrocarbon group not having aromaticity, and may be saturated or unsaturated. Generally, it is preferable that the aliphatic hydrocarbon group is saturated. Examples of the aliphatic hydrocarbon group include a linear or branched aliphatic hydrocarbon group, an aliphatic hydrocarbon group having a ring in the structure thereof, a group obtained by combining a linear or branched aliphatic hydrocarbon group with an aliphatic hydrocarbon group having a ring in the structure thereof. Specifically, examples of the aliphatic hydrocarbon group include the same group as V in Formula (2-1).

In Formula (2), Formula (2-1) and Formula (2-2), X represents a lactone cyclic group or a —SO$_2$—-containing cyclic group.

"Lactone cyclic group" refers to a cyclic group containing a ring (a lactone ring) having —O—C(=O)— in the ring skeleton thereof. In a case where the lactone ring is counted as the first ring, and the cyclic group has only the lactone ring, the cyclic group is referred to as a monocyclic group. In a case where the cyclic group also has other cyclic structures, the cyclic group is referred to as a polycyclic group regardless of the structure thereof. The lactone cyclic group may be a monocyclic group or a polycyclic group.

Specifically, examples of the lactone monocyclic group include groups obtained by removing one hydrogen atom from 4- to 6-membered lactone, for example, a group obtained by removing one hydrogen atom from β-propionolactone, a group obtained by removing one hydrogen atom from γ-butyrolactone, and a group obtained by removing one hydrogen atom from δ-valerolactone. Examples of the lactone polycyclic group include groups obtained by removing one hydrogen atom from bicycloalkane, tricycloalkane, and tetracycloalkane having a lactone ring.

In a case where the component (A) is used for forming a resist film, the lactone cyclic group in the constituent unit (a2) is effective for improving the adhesiveness of the resist film with respect to a substrate or for improving the affinity of the resist film with a developer containing water.

The lactone cyclic group is not particularly limited, and any of lactone cyclic groups can be used. Specifically, examples thereof include groups represented by Formulae (a2-r-1) to (a2-r-7). In the following formulae, "*" represents a bond.

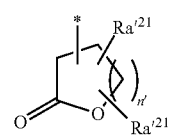
(a2-r-1)

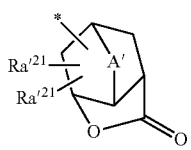
(a2-r-2)

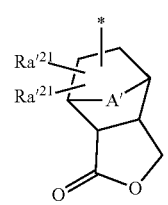
(a2-r-3)

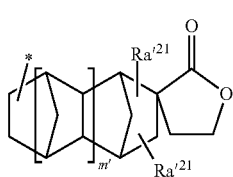
(a2-r-4)

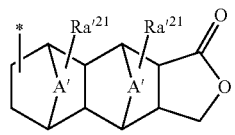
(a2-r-5)

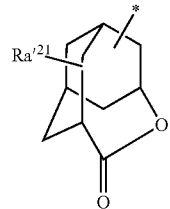
(a2-r-6)

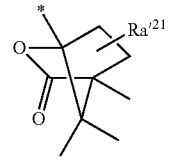
(a2-r-7)

[In the formulae, Ra$'^{21}$ each independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; A' represents an alkylene group having 1 to 5 carbon atoms that may contain an oxygen atom or a sulfur atom, an oxygen atom, or a sulfur atom, n' represents an integer of 0 to 2, and m' represents 0 or 1.]

As the alkyl group represented by Ra$'^{21}$, an alkyl group having 1 to 5 carbon atoms is preferable. Examples thereof include a methyl group, an ethyl group, a propyl group, a n-butyl group, a tert-butyl group, and the like.

As the alkoxy group represented by Ra$'^{21}$, an alkoxy group having 1 to 6 carbon atoms is preferable. Examples thereof include a methoxy group, an ethoxy group, a n-propoxy group, an iso-propoxy group, a n-butoxy group, and a tert-butoxy group. The alkoxy group is preferably linear or branched. Specifically, examples thereof include a group obtained by linking an alkyl group, which is exemplified as the alkyl group represented by Ra$'^{21}$, to an oxygen atom (—O—).

Examples of the halogen atom represented by Ra$'^{21}$ include a fluorine atom, a chlorine atom, a bromine atom, an iodine atom, and the like. Among these, a fluorine atom is preferable.

Examples of the halogenated alkyl group represented by Ra$'^{21}$ include a group obtained in a case where some or all of the hydrogen atoms in the alkyl group represented by Ra$'^{21}$ are substituted with the aforementioned halogen atom. The halogenated alkyl group is preferably a fluorinated alkyl group, and particularly preferably a perfluoroalkyl group.

Among them, Ra$'^{21}$ is preferably a hydrogen atom, a cyano group, or a halogen atom, and more preferably a hydrogen atom or a cyano group.

As the alkylene group having 1 to 5 carbon atoms represented by A', a linear or branched alkylene group is preferable. Examples thereof include a methylene group, an ethylene group, a n-propylene group, an isopropylene group, and the like. In a case where the alkylene group has an oxygen atom or a sulfur atom, specific examples of the alkylene group include a group in which —O— or —S— is on a terminal of the alkylene group or between the carbon atoms of the alkylene group. Examples of such a group include —O—CH$_2$—, —CH$_2$—O—CH$_2$—, —S—CH$_2$—, —CH$_2$—S—CH$_2$—, and the like. A' is preferably an alkylene group having 1 to 5 carbon atoms or —O—, more preferably an alkylene group having 1 to 5 carbon atoms, and most preferably a methylene group.

Specific examples of the groups represented by Formulae (a2-r-1) to (a2-r-7) will be shown below.

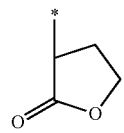
(r-1c-1-1)

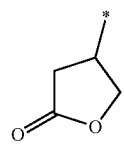
(r-1c-1-2)

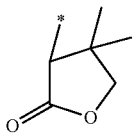
(r-1c-1-3)

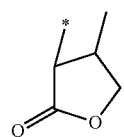
(r-1c-1-4)

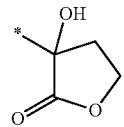
(r-1c-1-5)

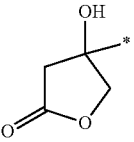
(r-1c-1-6)

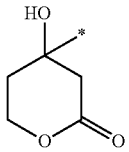
(r-1c-1-7)

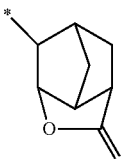
(r-1c-2-1)

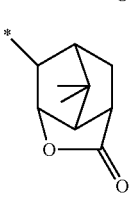
(r-1c-2-2)

-continued

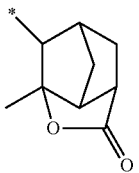
(r-1c-2-3)

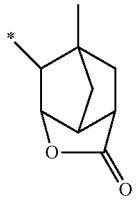
(r-1c-2-4)

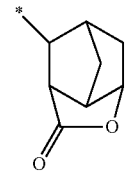
(r-1c-2-5)

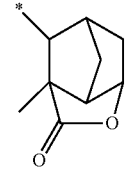
(r-1c-2-6)

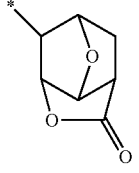
(r-1c-2-7)

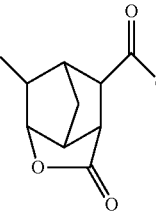
(r-1c-2-8)

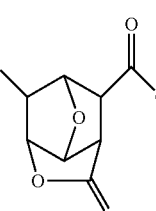
(r-1c-2-9)

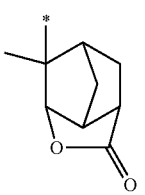
(r-1c-2-10)

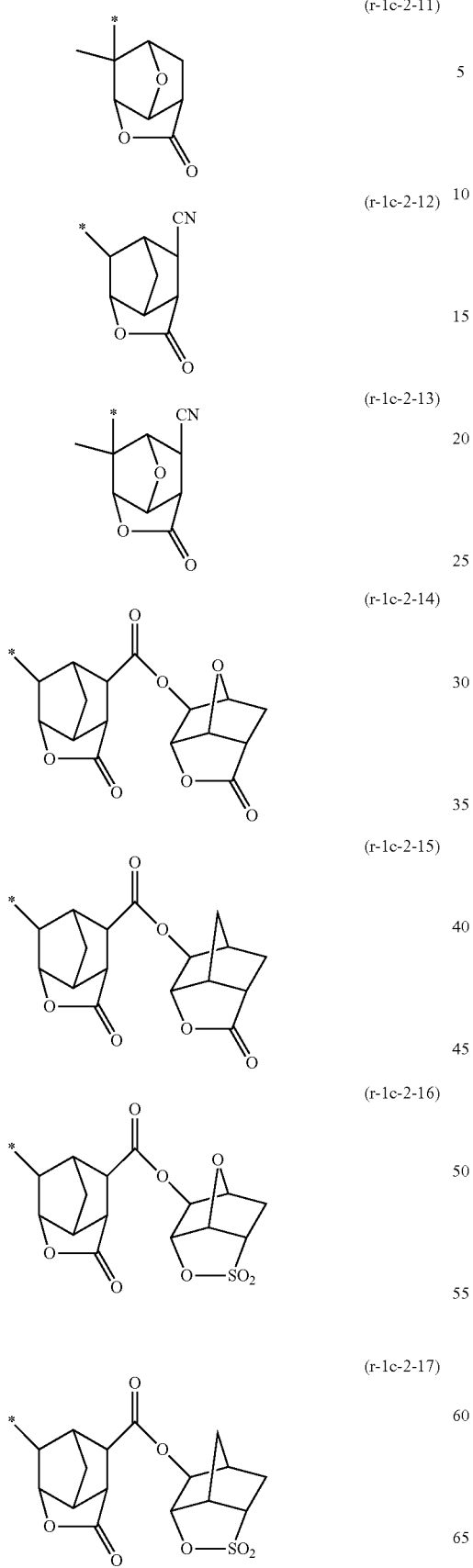
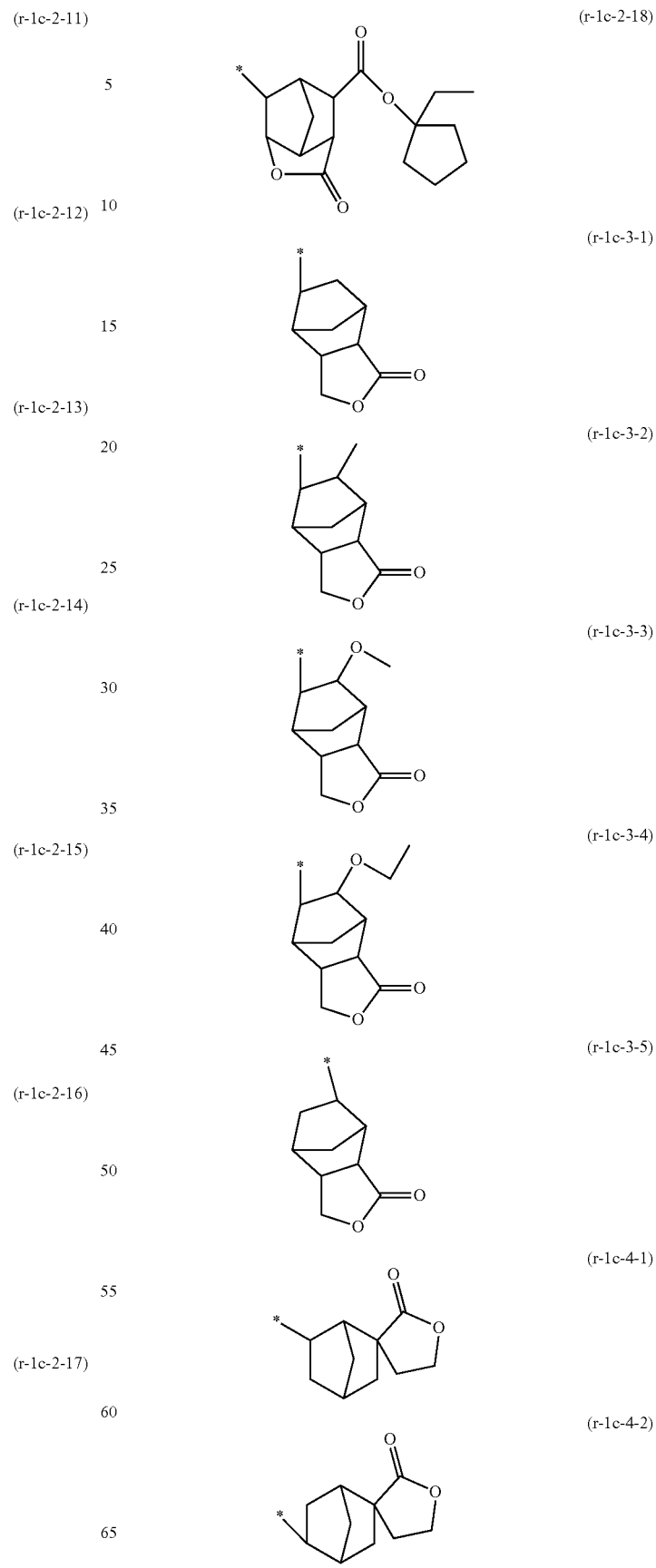

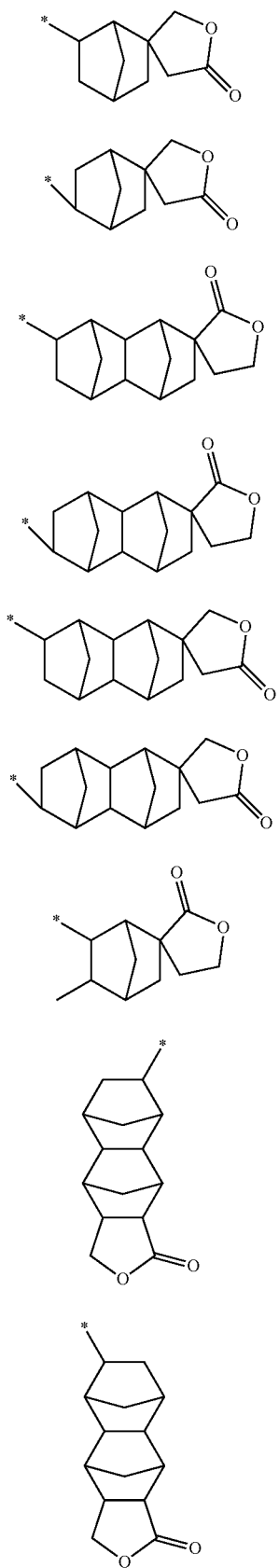
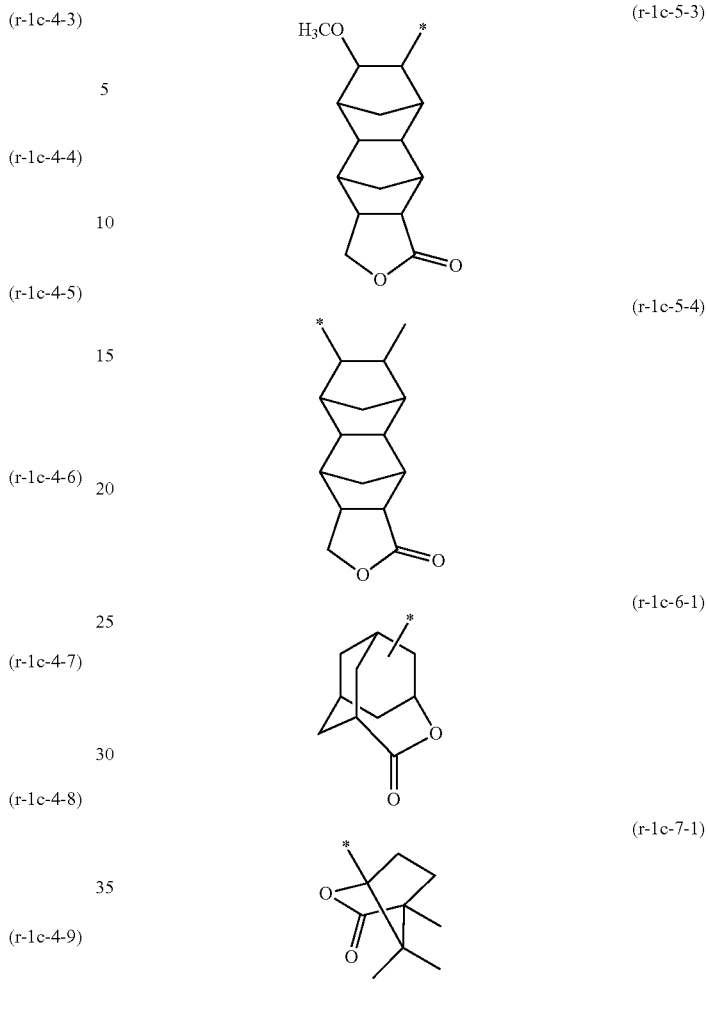

In the present invention, the constituent unit (a2) is preferably a group represented by Formula (a2-r-2), (a2-r-6), or (a2-r-7), and more preferably a group represented by Chemical Formula (r-1c-2-1), (r-1c-2-7), (r-1c-2-12), (r-1c-2-13), (r-1c-6-1), or (r-1c-7-1).

"—$SO_2$—-containing cyclic group" refers to a cyclic group containing a —$SO_2$—-containing ring in the ring skeleton thereof, and is specifically a cyclic group in which a sulfur atom (S) in —$SO_2$— forms a portion of the ring skeleton of the cyclic group. In a case where the —$SO_2$—-containing ring in the ring skeleton is counted as the first ring, and the cyclic group has only this ring, the cyclic group is referred to as a monocyclic group. In a case where the cyclic group has other cyclic structures, the cyclic group is referred to as a polycyclic group regardless of the structure thereof. The —$SO_2$—-containing cyclic group may be monocyclic or polycyclic.

The —$SO_2$—-containing cyclic group is particularly preferably a cyclic group having —O—$SO_2$— in the ring skeleton thereof, that is, a cyclic group containing a sultone ring in which —O—S— in —O—$SO_2$— forms a portion of the ring skeleton. More specifically, examples of the —$SO_2$—-containing cyclic group include groups represented by Formulae (a5-r-1) to (a5-r-4).

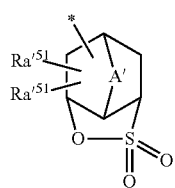
(a5-r-1)

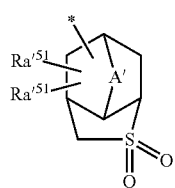
(a5-r-2)

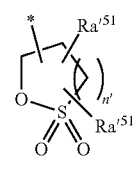
(a5-r-3)

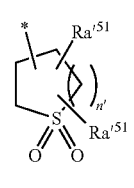
(a5-r-4)

[In the formulae, $Ra'^{51}$ each independently represents a hydrogen atom, an alkyl group, an alkoxy group, a halogen atom, a halogenated alkyl group, a hydroxyl group, —COOR″, —OC(=O)R″, a hydroxyalkyl group, or a cyano group; R″ represents a hydrogen atom or an alkyl group; A′ represents an alkylene group having 1 to 5 carbon atoms that may have an oxygen atom or a sulfur atom, an oxygen atom, or a sulfur atom, and n′ represents an integer of 0 to 2.]

In Formulae (a5-r-1) to (a5-r-4), A′ is the same as A′ in Formulae (a2-r-1) to (a2-r-7). The alkyl group, the alkoxy group, the halogen atom, the halogenated alkyl group, —COOR″, —OC(=O)R″, and the hydroxyalkyl group represented by $Ra'^{51}$ are the same as $Ra'^{21}$ in Formulae (a2-r-1) to (a2-r-7).

Among them, $Ra'^{51}$ is preferably a hydrogen atom, a cyano group, or a halogen atom, and more preferably a hydrogen atom.

Specific examples of the groups represented by Formulae (a5-r-1) to (a5-r-4) will be shown below. In the formulae, "Ac" represents an acetyl group.

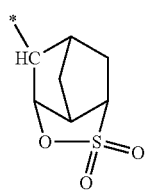
(r-s1-1-1)

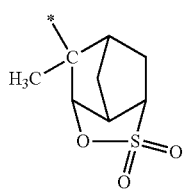
(r-s1-1-2)

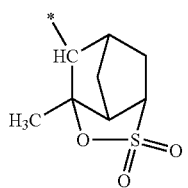
(r-s1-1-3)

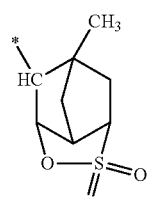
(r-s1-1-4)

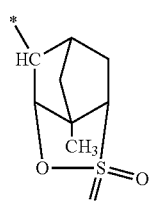
(r-s1-1-5)

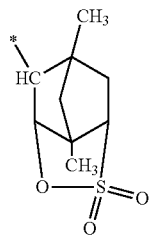
(r-s1-1-6)

(r-s1-1-7)

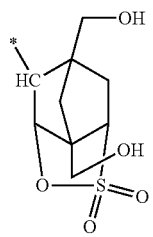
(r-s1-1-8)

(r-s1-1-9)
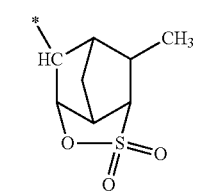
(r-s1-1-10)
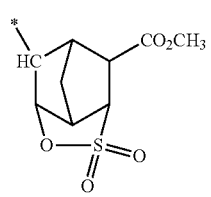
(r-s1-1-11)
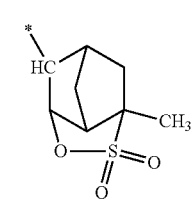
(r-s1-1-12)
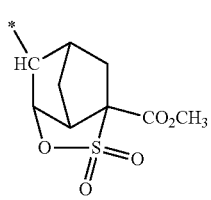
(r-s1-1-13)
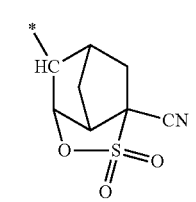
(r-s1-1-14)
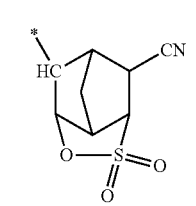
(r-s1-1-15)
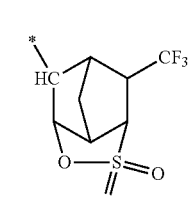
(r-s1-1-16)
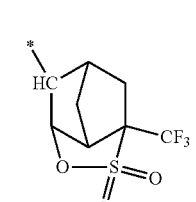
(r-s1-1-17)
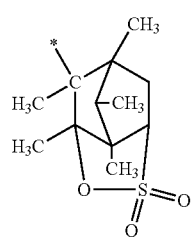
(r-s1-1-18)
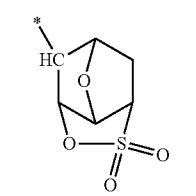
(r-s1-1-19)
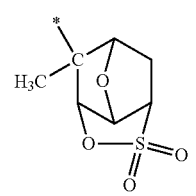
(r-s1-1-20)
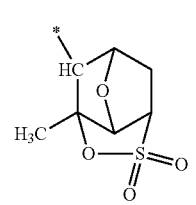
(r-s1-1-21)
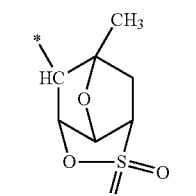
(r-s1-1-22)
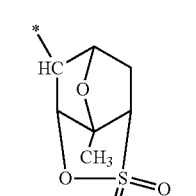
(r-s1-1-23)
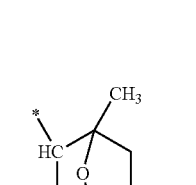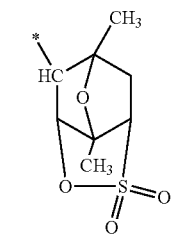

(r-s1-1-24)
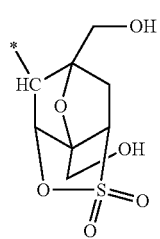

(r-s1-1-25)
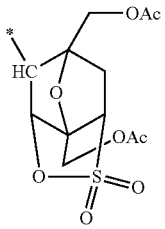

(r-s1-1-26)
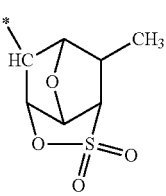

(r-s1-1-27)
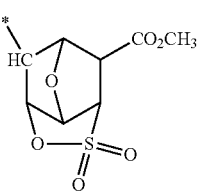

(r-s1-1-28)
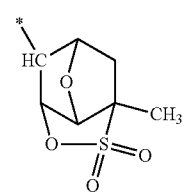

(r-s1-1-29)
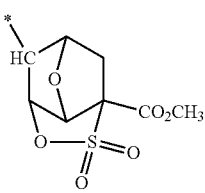

(r-s1-1-30)
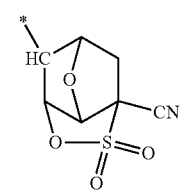

(r-s1-1-31)
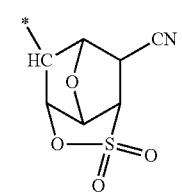

(r-s1-1-32)
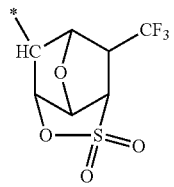

(r-s1-1-33)
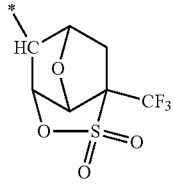

(r-s1-2-1)
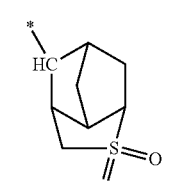

(r-s1-2-2)
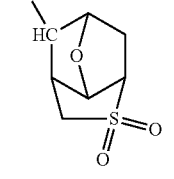

(r-s1-3-1)
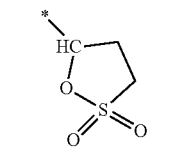

(r-s1-4-1)
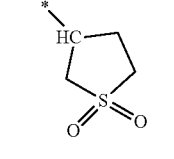

In the present invention, in a case where the constituent unit (a2) has the —SO$_2$-containing cyclic group, a log P value of the acrylic ester monomer having the —SO$_2$—-containing cyclic group is not particularly limited as long as it is less than 1.2. Among the above, a group represented by Formula (a5-r-1) is preferable, at least one kind of group selected from the group consisting of groups represented by any of Chemical Formulae (r-s1-1-1), (r-s1-1-18), (r-s1-3-1), and (r-s1-4-1) is more preferably used, and a group represented by Chemical Formula (r-s1-1-18) is most preferably used.

Specific example of monomers used for deriving the constituent unit (a2) will be shown below.

(2-1-a)

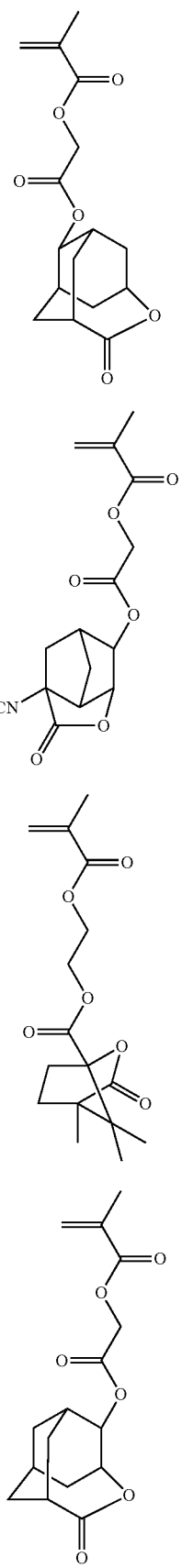

(2-1-b)

(2-1-c)

(2-1-d)

(2-2-a)

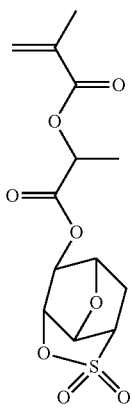

In the component (A), one kind of constituent unit (a2) may be used singly, or two or more kinds thereof may be used in combination.

In a case where the component (A) has the constituent unit (a2), the proportion of the constituent unit (a2) with respect to all the constituent units constituting the component (A) is preferably 1 to 80 mol %, more preferably 5 to 70 mol %, even more preferably 10 to 65 mol %, and particularly preferably 10 to 60 mol %. In a case where the proportion is equal to or higher than the aforementioned lower limit, the effect obtained by adding the constituent unit (a2) becomes sufficient. In a case where the proportion is equal to or lower than the aforementioned upper limit, the constituent unit (a2) can be well balanced with other constituent units, and various lithography characteristics and the pattern shape become excellent.

In the present invention, in a case where constituent unit (a1) and constituent unit (a2) are used in combination as substrate components, it is possible to provide a resist composition having improved CDU.

(Other Constituent Units: Constituent Unit (a3))

In the resist composition of the present embodiment, as the component (A), a constituent unit (hereinafter, referred to as "constituent unit (a3)") which does not correspond to the constituent unit (a1) and the constituent unit (a2) may also be used together.

The constituent unit (a3) is not particularly limited, and may be used by being arbitrarily selected from a number of components (for example, base resins for an ArF excimer laser, a KrF excimer laser, and the like (preferably for an ArF excimer laser)) known in the related art as substrate components for chemical amplification-type resist compositions.

Specific examples of the constituent unit (a3) include a constituent unit having an acid-decomposable group whose polarity increases by the action of an acid (provided that the constituent unit represented by Formula (1) is excluded), a constituent unit having a lactone cyclic group or a —$SO_2$— containing cyclic group (provided that the constituent unit represented by Formula (2) is excluded), and a constituent unit represented by Formula (a3-1) to (a3-3) below.

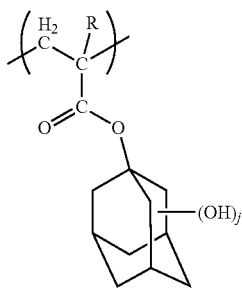
(a3-1)

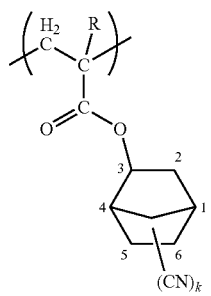
(a3-2)

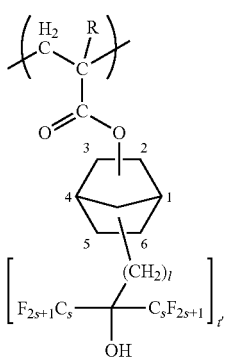
(a3-3)

In the formulae (a3-1) to (a3-3), R represents a hydrogen atom, an alkyl group having 1 to 5 carbon atoms, or a halogenated alkyl group having 1 to 5 carbon atoms; j is an integer of 1 to 3; k is an integer of 1 to 3; t' is an integer of 1 to 3; l is an integer of 1 to 5; and s is an integer of 1 to 3.

In the resist composition of the present embodiment, one kind of constituent unit (a3) may be used singly, or two or more kinds thereof may be used in combination.

The content of the component (A) in the resist composition of the present embodiment may be adjusted according to the thickness of a resist film to be formed.

<Other Components>

The resist composition of the present embodiment may contain, in addition to the component (A), components other than the component (A). Examples of other components include a component (B), a component (D), a component (E), a component (F), a component (S), and the like described below.

[Component (B): Acid Generator Component]

The resist composition of the present embodiment may contain an acid generator component (hereinafter, referred to as "component (B)") in addition to the component (A).

The component (B) is not particularly limited, and those suggested so far as acid generators for chemical amplification-type resists can be used.

Examples of the acid generators include various acid generators including acid generators based on an onium salt such as an iodonium salt or a sulfonium salt, and oxime sulfonate-based acid generators; diazomethane-based acid generators such as bisalkyl or bisaryl sulfonyl diazomethanes and poly(bissulfonyl)diazomethanes; nitrobenzyl sulfonate-based acid generators, iminosulfonate-based acid generators, and disulfone-based acid generators. Among these, it is preferable to use onium salt-based acid generators.

Examples of the onium salt-based acid generators include a compound represented by Formula (b-1) (hereinafter, referred to as "component (b-1)" as well), a compound represented by Formula (b-2) (hereinafter, referred to as "component (b-2)" as well), and a compound represented by Formula (b-3) (hereinafter, referred to as "component (b-3)" as well).

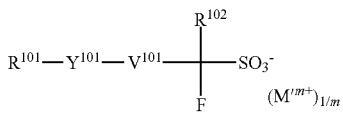
(b-1)

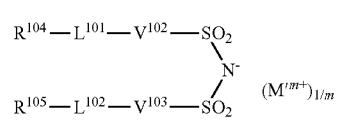
(b-2)

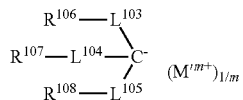
(b-3)

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may form a ring by being bonded to each other. $R^{102}$ represents a fluorine atom or a fluorinated alkyl group having 1 to 5 carbon atoms. $Y^{101}$ represents a single bond or a divalent linking group having an oxygen atom. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO—, or —SO$_2$—. m represents an integer of 1 or greater, and $M'^{m+}$ represents an m-valent onium cation.]

{Anion Portion}

Anion Portion as Component (b-1)

In Formula (b-1), $R^{101}$ represents a cyclic group which may have a substituent, a chain-like alkyl group which may have a substituent, or a chain-like alkenyl group which may have a substituent.

Cyclic group which may have substituent:

The cyclic group is preferably a cyclic hydrocarbon group. The cyclic hydrocarbon group may be an aromatic hydrocarbon group or an aliphatic hydrocarbon group. The aliphatic hydrocarbon group means a hydrocarbon group not having aromaticity. The aliphatic hydrocarbon group may be saturated or unsaturated. Generally, it is preferable that the aliphatic hydrocarbon group is saturated.

The aromatic hydrocarbon group represented by $R^{101}$ is a hydrocarbon group having an aromatic ring. The number of carbon atoms in the aromatic hydrocarbon group is preferably 3 to 30, more preferably 5 to 30, even more preferably 5 to 20, particularly preferably 6 to 15, and most preferably 6 to 10. Here, the number of carbon atoms does not include the number of carbon atoms in the substituent.

Specifically, examples of the aromatic ring included in the aromatic hydrocarbon group represented by $R^{101}$ include benzene, fluorene, naphthalene, anthracene, phenanthrene, biphenyl, an aromatic heterocycle obtained in a case where some of the carbon atoms constituting the above aromatic rings are substituted with a heteroatom, and the like. Examples of the heteroatom in the aromatic heterocycle include an oxygen atom, a sulfur atom, a nitrogen atom, and the like.

Specifically, examples of the aromatic hydrocarbon group represented by $R^{101}$ include a group obtained by removing one hydrogen atom from the aforementioned aromatic rings (an aryl group such as a phenyl group or a naphthyl group), a group obtained in a case where one hydrogen atom in the aforementioned aromatic rings is substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group), and the like. The number of carbon atoms in the alkylene group (the alkyl chain in the arylalkyl group) is preferably 1 to 4, more preferably 1 or 2, and particularly preferably 1.

Examples of the cyclic aliphatic hydrocarbon group represented by $R^{101}$ include an aliphatic hydrocarbon group having a ring in the structure thereof.

Examples of the aliphatic hydrocarbon group having a ring in the structure thereof include an alicyclic hydrocarbon group (a group obtained by removing one hydrogen atom from an aliphatic hydrocarbon ring), a group in which an alicyclic hydrocarbon group is bonded to a terminal of a linear or branched aliphatic hydrocarbon group, a group in which an alicyclic hydrocarbon group is in the middle of a linear or branched aliphatic hydrocarbon group, and the like.

The number of carbon atoms in the alicyclic hydrocarbon group is preferably 3 to 20, and more preferably 3 to 12.

The alicyclic hydrocarbon group may be a polycyclic group or a monocyclic group. As the monocyclic alicyclic hydrocarbon group, a group obtained by removing one hydrogen atom from monocycloalkane is preferable. As the monocycloalkane, those having 3 to 6 carbon atoms are preferable. Specifically, examples thereof include cyclopentane, cyclohexane, and the like. As the polycyclic alicyclic hydrocarbon group, a group obtained by removing one hydrogen atom from polycycloalkane is preferable. As the polycycloalkane, those having 7 to 30 carbon atoms are preferable. Among these, as the polycycloalkane, polycycloalkane having a polycyclic skeleton based on a crosslinked ring such as adamantane, norbornane, isobornane, tricyclodecane, or tetracyclododecane; and polycycloalkane having a polycyclic skeleton based on a fused ring such as a cyclic group having a steroid skeleton are more preferable.

Among these, as the cyclic aliphatic hydrocarbon group represented by $R^{101}$, a group obtained by removing one or more hydrogen atoms from monocycloalkane or polycycloalkane is preferable, a group obtained by removing one hydrogen atom from polycycloalkane is more preferable, an adamantyl group or a norbornyl group is particularly preferable, and an adamantyl group is most preferable.

The number of carbon atoms in the linear or branched aliphatic hydrocarbon group which may be bonded to an alicyclic hydrocarbon group is preferably 1 to 10, more preferably 1 to 6, even more preferably 1 to 4, and most preferably 1 to 3.

As the linear aliphatic hydrocarbon group, a linear alkylene group is preferable. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$—], and the like.

As the branched aliphatic hydrocarbon group, a branched alkylene group is preferable. Specifically, examples thereof include an alkylalkylene group including an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group such as —$CH(CH_3)CH_2CH_2$— or —$CH_2CH(CH_3)CH_2$—; and an alkyltetramethylene group such as —$CH(CH_3)CH_2CH_2CH_2$— or —$CH_2CH(CH_3)CH_2CH_2$—. As the alkyl group in the alkylalkylene group, a linear alkyl group having 1 to 5 carbon atoms is preferable.

The cyclic hydrocarbon group represented by $R^{101}$ may have a heteroatom just like a heterocycle or the like. Specifically, examples thereof include a lactone cyclic group represented by each of Formulae (a2-r-1) to (a2-r-7), a —$SO_2$—-containing polycyclic group represented by each of Formulae (a5-r-1) to and (a5-r-2), and a heterocyclic group represented by each of Formulae (r-hr-1) to (r-hr-16) shown below.

(r-hr-1)

(r-hr-2)

(r-hr-3)

(r-hr-4)

(r-hr-5)

(r-hr-6)

(r-hr-7)

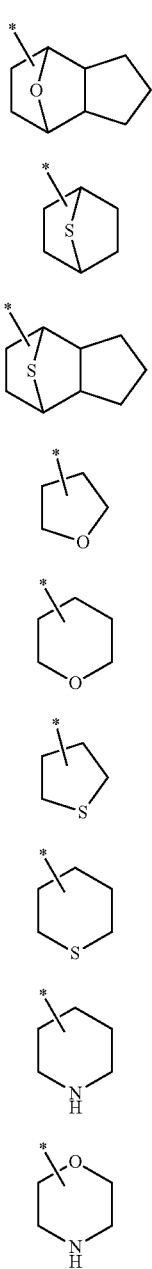

(r-hr-8)
(r-hr-9)
(r-hr-10)
(r-hr-11)
(r-hr-12)
(r-hr-13)
(r-hr-14)
(r-hr-15)
(r-hr-16)

Examples of the substituent in the cyclic group represented by $R^{101}$ include an alkyl group, an alkoxy group, a halogen atom, a halogenated alkyl group, a hydroxyl group, a carbonyl group, a nitro group, and the like.

The alkyl group as the substituent is preferably an alkyl group having 1 to 5 carbon atoms, and most preferably a methyl group, an ethyl group, a propyl group, a n-butyl group, or a tert-butyl group.

The alkoxy group as the substituent is preferably an alkoxy group having 1 to 5 carbon atoms, more preferably a methoxy group, an ethoxy group, a n-propoxy group, an iso-propoxy group, a n-butoxy group, or a tert-butoxy group, and most preferably a methoxy group or an ethoxy group.

Examples of the halogen atom as the substituent include a fluorine atom, a chlorine atom, a bromine atom, an iodine atom, and the like. Among these, a fluorine atom is preferable.

Examples of the halogenated alkyl group as the substituent include a group obtained in a case where some or all of the hydrogen atoms in an alkyl group having 1 to 5 carbon atoms, such as a methyl group, an ethyl group, a propyl group, a n-butyl group, or a tert-butyl group, are substituted with the aforementioned halogen atom.

The carbonyl group as the substituent is a group substituting a methylene group (—$CH_2$—) constituting the cyclic hydrocarbon group.

Chain-like alkyl group which may have substituent:

The chain-like alkyl group represented by $R^{101}$ may be linear or branched.

The number of carbon atoms in the linear alkyl group is preferably 1 to 20, more preferably 1 to 15, and most preferably 1 to 10. Specifically, examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an eicosyl group, a heneicosyl group, a docosyl group, and the like.

The number of carbon atoms in the branched alkyl group is preferably 3 to 20, more preferably 3 to 15, and most preferably 3 to 10. Specifically, examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, a 4-methylpentyl group, and the like.

Chain-like alkenyl group which may have substituent:

The chain-like alkenyl group represented by $R^{101}$ may be linear or branched. The number of carbon atoms in the chain-like alkenyl group is preferably 2 to 10, more preferably 2 to 5, even more preferably 2 to 4, and particularly preferably 3. Examples of the linear alkenyl group include a vinyl group, a propenyl group (an allyl group), a butynyl group, and the like. Examples of the branched alkenyl group include a 1-methylvinyl group, a 2-methylvinyl group, a 1-methylpropenyl group, a 2-methylpropenyl group, and the like.

As the linear alkenyl group, among the above, a linear alkenyl group is preferable, a vinyl group or a propenyl group is more preferable, and a vinyl group is particularly preferable.

Examples of the substituent in the chain-like alkyl or alkenyl group represented by $R^{101}$ include an alkoxy group, a halogen atom, a halogenated alkyl group, a hydroxyl group, a carbonyl group, a nitro group, an amino group, a cyclic group represented by $R^{101}$, and the like.

Among these, as $R^{101}$, a cyclic group which may have a substituent or a chain-like alkyl group which may have a substituent is preferable, a cyclic group which may have a substituent is more preferable, and a cyclic hydrocarbon group which may have a substituent is even more preferable.

Among these, a phenyl group, a naphthyl group, a group obtained by removing one or more hydrogen atoms from polycycloalkane, a lactone cyclic group represented by each of Formulae (a2-r-1) to (a2-r-7), and a —$SO_2$—-containing polycyclic group represented by each of Formulae (a5-r-1) and (a5-r-2) are preferable. Among these, a group obtained by removing one or more hydrogen atoms from polycycloalkane and a —$SO_2$—-containing polycyclic group represented by each of Formulae (a5-r-1) and (a5-r-2) are more preferable.

In Formula (b-1), $Y^{101}$ represents a single bond or a divalent linking group having an oxygen atom.

In a case where $Y^{101}$ represents a divalent linking group having an oxygen atom, $Y^{101}$ may contain an atom other than the oxygen atom. Examples of the atom other than the oxygen atom include a carbon atom, a hydrogen atom, a sulfur atom, a nitrogen atom, and the like.

Examples of the divalent linking group having an oxygen atom include an oxygen atom-containing linking group which is not based on hydrocarbon, such as an oxygen atom (an ether bond: —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); a combination of the oxygen atom-containing linking group which is not based on hydrocarbon and an alkylene group; and the like. A sulfonyl group (—SO$_2$—) may be additionally linked to the combination. Examples of the divalent linking group having an oxygen atom include linking groups represented by Formulae (y-a1-1) to (y-a1-7).

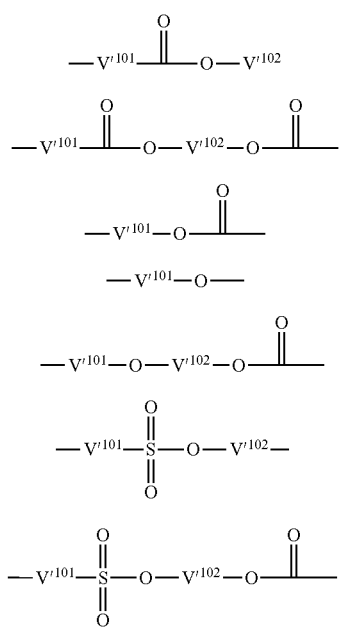

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group represented by $V'^{102}$ is preferably an alkylene group having 1 to 30 carbon atoms, more preferably an alkylene group having 1 to 10 carbon atoms, and even more preferably an alkylene group having 1 to 5 carbon atoms.

The alkylene group represented by $V'^{101}$ and $V'^{102}$ may be a linear or branched alkylene group, and is preferably a linear alkylene group.

Specifically, examples of the alkylene group represented by $V'^{101}$ and $V'^{102}$ include a methylene group [—CH$_2$—]; an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, or —C(CH$_2$CH$_3$)$_2$—; an ethylene group [—CH$_2$CH$_2$—]; an alkylethylene group such as —CH(CH$_3$)CH$_2$—, —CH(CH$_3$)CH(CH$_3$)—, —C(CH$_3$)$_2$CH$_2$—, or —CH(CH$_2$CH$_3$)CH$_2$—; a trimethylene group (a n-propylene group) [—CH$_2$CH$_2$CH$_2$—]; an alkyltrimethylene group such as —CH(CH$_3$)CH$_2$CH$_2$— or —CH$_2$CH(CH$_3$)CH$_2$—; a tetramethylene group [—CH$_2$CH$_2$CH$_2$CH$_2$—]; an alkyltetramethylene group such as —CH(CH$_3$)CH$_2$CH$_2$CH$_2$— or —CH$_2$CH(CH$_3$)CH$_2$CH$_2$—; a pentamethylene group [—CH$_2$CH$_2$CH$_2$CH$_2$CH$_2$—]; and the like.

Some of the methylene groups in the alkylene group represented by $V'^{101}$ or $V'^{102}$ may be substituted with a divalent aliphatic cyclic group having 5 to 10 carbon atoms. The aliphatic cyclic group is preferably a divalent group obtained by removing one more hydrogen atom from a monocyclic alicyclic hydrocarbon group or a polycyclic alicyclic hydrocarbon group, and more preferably a cyclohexylene group, a 1,5-adamantylene group, or a 2,6-adamantylene group.

$Y^{101}$ is preferably a divalent linking group having an ester bond or a divalent linking group having an ether bond, more preferably a linking group represented by each of Formulae (y-a1-1) to (y-a1-5), and even more preferably a linking group represented by each of (y-a1-1) to (y-a1-3).

In Formula (b-1), $V^{101}$ represents a single bond, an alkylene group, or a fluorinated alkylene group. The number of carbon atoms in the alkylene group or the fluorinated alkylene group represented by $V^{101}$ is preferably 1 to 4. Examples of the fluorinated alkylene group represented by $V^{101}$ include a group obtained in a case where some or all of the hydrogen atoms in the alkylene group represented by $V^{101}$ are substituted with a fluorine atom. Among these, as $V^{101}$, a single bond or a fluorinated alkylene group having 1 to 4 carbon atoms is preferable.

In Formula (b-1), $R^{102}$ represents a fluorine atom or a fluorinated alkyl group having 1 to 5 carbon atoms. $R^{102}$ is preferably a fluorine atom or a perfluoroalkyl group having 1 to 5 carbon atoms, and more preferably a fluorine atom.

For example, in a case where $Y^{101}$ represents a single bond, specific examples of the anion portion of the component (b-1) include a fluorinated alkyl sulfonate anion such as a trifluoromethane sulfonate anion or a perfluorobutane sulfonate anion. In a case where $Y^{101}$ represents a divalent linking group having an oxygen atom, examples of the anion include anions represented by any of Formulae (an-1) to (an-3).

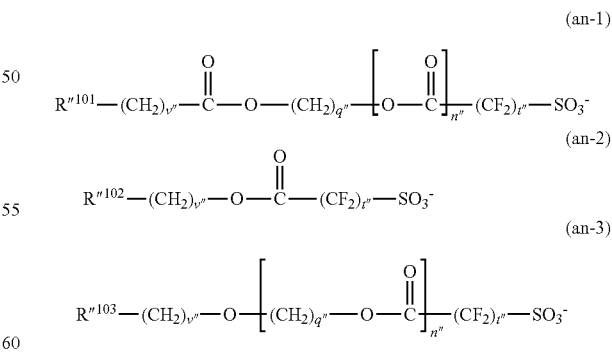

[In the formulae, $R'''^{101}$ represents an aliphatic cyclic group which may have a substituent, a group represented by each of Formulae (r-hr-1) to (r-hr-6), or a chain-like alkyl group which may have a substituent; $R'''^{102}$ represents an aliphatic cyclic group which may have a substituent, lactone represented by each of Formulae (a2-r-1) to (a2-r-7), or a —SO$_2$—-containing polycyclic group represented by each of Formulae (a5-r-1) and (a5-r-2); R''$^{103}$ represents an aromatic cyclic group which may have a substituent, an aliphatic cyclic group which may have a substituent, or a chain-like alkenyl group which may have a substituent; v'' each independently represents an integer of 0 to 3, q'' each independently represents an integer of 1 to 20, t'' represents an integer of 1 to 3, and n'' represents 0 or 1.]

The aliphatic cyclic group which is represented by R''$^{101}$, R''$^{102}$, and R''$^{103}$ and may have a substituent is preferably the group exemplified above as the cyclic aliphatic hydrocarbon group represented by R$^{101}$. Examples of the substituent include the same substituents as the substituents which may substitute the cyclic aliphatic hydrocarbon group represented by R$^{101}$.

The aromatic cyclic group which is represented by R''$^{103}$ and may have a substituent is preferably the group exemplified above as the aromatic hydrocarbon group in the cyclic hydrocarbon group represented by R$^{101}$. Examples of the substituent include the same substituents as the substituents which may substitute the aromatic hydrocarbon group represented by R$^{101}$.

The chain-like alkyl group which is represented by R''$^{101}$ and may have a substituent is preferably the group exemplified above as the chain-like alkyl group represented by R$^{101}$. The chain-like alkenyl group which is represented by R''$^{103}$ and may have a substituent is preferably the group exemplified above as the chain-like alkenyl group represented by R$^{101}$.

Anion Portion of Component (b-2)

In Formula (b-2), R$^{104}$ and R$^{105}$ each independently represent a cyclic group which may have a substituent, a chain-like alkyl group which may have a substituent, or a chain-like alkenyl group which may have a substituent. Examples of these groups include the same group as R$^{101}$ in Formula (b-1). Here, R$^{104}$ and R$^{105}$ may form a ring by being bonded to each other.

Each of R$^{14}$ and R$^{105}$ is preferably a chain-like alkyl group which may have a substituent, and more preferably a linear or branched alkyl group or a linear or branched fluorinated alkyl group.

The number of carbon atoms in the chain-like alkyl group is preferably 1 to 10, more preferably 1 to 7, and even more preferably 1 to 3. Within the aforementioned range of number of carbon atoms, the smaller the number of carbon atoms in the chain-like alkyl group represented by R$^{104}$ and R$^{105}$, the more preferable, for the reason that the solubility in a resist solvent becomes excellent, or the like. Furthermore, in the chain-like alkyl group represented by R$^{104}$ and R$^{105}$, the larger the number of hydrogen atoms substituted with a fluorine atom, the more preferable, because then the strength of an acid increases, and the transparency with respect to high energy light or electron beams at a wavelength equal to or shorter than 200 nm is improved.

The proportion of the fluorine atom in the chain-like alkyl group, that is, the fluorination rate is preferably 70% to 100%, and more preferably 90% to 100%. It is most preferable that all the hydrogen atoms are substituted with a fluorine atom such that a perfluoroalkyl group is obtained.

In Formula (b-2), V$^{102}$ and V$^{103}$ each independently represent a single bond, an alkylene group, or a fluorinated alkylene group. Examples of these include the same group as V$^{101}$ in Formula (b-1).

In Formula (b-2), L$^{11}$ and L$^{102}$ each independently represent a single bond or an oxygen atom.

Anion portion of component (b-3) In Formula (b-3), R$^{106}$ to R$^{108}$ each independently represent a cyclic group which may have a substituent, a chain-like alkyl group which may have a substituent, or a chain-like alkenyl group which may have a substituent. Examples of these include the same group as R$^{101}$ in Formula (b-1).

L$^{103}$ to L$^{105}$ each independently represent a single bond, —CO—, or —SO$_2$—.

{Cation Portion}

In Formulae (b-1), (b-2), and (b-3), m represents an integer of 1 or greater, M'$^{m+}$ represents an m-valent onium cation. Examples of cations suitable as M'$^{m+}$ include a sulfonium cation and an iodonium cation. Particularly, an organic cation represented by each of Formulae (ca-1) to (ca-4) is preferable.

(ca-1)

(ca-2)

(ca-3)

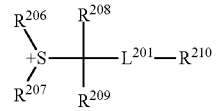

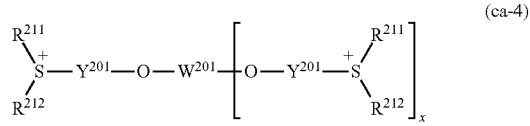

(ca-4)

[In the formulae, R$^{201}$ to R$^{207}$, R$^{211}$, and R$^{212}$ each independently represent an aryl group, an alkyl group, or an alkenyl group which may have a substituent, and R$^{201}$ to R$^{203}$, R$^{206}$ and R$^{207}$, and R$^{211}$ and R$^{212}$ may form a ring by being bonded to each other together with a sulfur atom in the formulae. R$^{208}$ and R$^{209}$ each independently represent a hydrogen atom or an alkyl group having 1 to 5 carbon atoms, R$^{210}$ represents an aryl group which may have a substituent, an alkyl group which may have a substituent, an alkenyl group which may have a substituent, or a —SO$_2$—-containing cyclic group which may have a substituent, L$^{201}$ represents —C(=O)— or —C(=O)—O—, and Y$^{201}$ each independently represents an arylene group, an alkylene group, or an alkenylene group, x represents 1 or 2, and W$^{201}$ represents an (x+1)-valent linking group.]

Examples of the aryl group represented by R$^{201}$ to R$^{207}$, R$^{211}$, and R$^{212}$ include an unsubstituted aryl group having 6 to 20 carbon atoms. Among these, a phenyl group and a naphthyl group are preferable.

As the alkyl group represented by R$^{201}$ to R$^{207}$, R$^{211}$, and R$^{212}$, a chain-like or cyclic alkyl group having 1 to 30 carbon atoms is preferable.

As the alkenyl group represented by R$^{201}$ to R$^{207}$, R$^{211}$, and R$^{212}$, an alkenyl group having 2 to 10 carbon atoms is preferable.

Examples of the substituent which may be included in R$^{201}$ to R$^{207}$, and R$^{210}$ to R$^{212}$ include an alkyl group, a halogen atom, a halogenated alkyl group, a carbonyl group, a cyano group, an amino group, an aryl group, and a group represented by each of Formulae (ca-r-1) to (ca-r-7).

[ca-r-1]

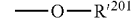

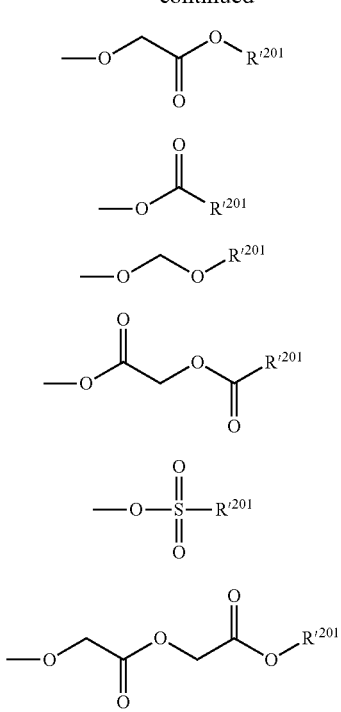

[In the formulae, $R'^{201}$ each independently represents a hydrogen atom, a cyclic group which may have a substituent, a chain-like alkyl group which may have a substituent, or a chain-like alkenyl group which may have a substituent.]

Examples of the cyclic group which may have a substituent, the chain-like alkyl group which may have a substituent, and the chain-like alkenyl group which may have a substituent represented by $R'^{201}$ include the same group as $R^{101}$ in Formula (b-1).

In a case where $R^{201}$ to $R^{203}$, $R^{206}$ and $R^{207}$, and $R^{211}$ and $R^{212}$ form a ring by being bonded to each other together with a sulfur atom in the formulae, $R^{201}$ to $R^{203}$, $R^{206}$ and $R^{207}$, and $R^{211}$ and $R^{212}$ may be bonded to each other through a heteroatom such as a sulfur atom, an oxygen atom, or a nitrogen atom or a functional group such as a carbonyl group, —SO—, —SO$_2$—, —SO$_3$—, —COO—, —CONH—, or —N($R_N$)— ($R_N$ represents an alkyl group having 1 to 5 carbon atoms). Regarding the formed ring, a single ring having a sulfur atom in the formulae in the ring skeleton is preferably a 3- to 10-membered ring, and particularly preferably a 5- to 7-membered ring, including the sulfur atom. Specific examples of the formed ring include a thiophene ring, a thiazole ring, a benzothiophene ring, a thianthrene ring, a dibenzothiophene ring, a 9H-thioxanthene ring, a thioxanthone ring, a phenoxanthiin ring, a tetrahydrothiophenium ring, a tetrahydrothiopyranium ring, and the like.

$R^{208}$ and $R^{209}$ each independently represent a hydrogen atom or an alkyl group having 1 to 5 carbon atoms, and preferably represent a hydrogen atom or an alkyl group having 1 to 3 carbon atoms. In a case where $R^{208}$ and $R^{209}$ each represent an alkyl group, they may form a ring by being bonded to each other.

$R^{210}$ represents an aryl group which may have a substituent, an alkyl group which may have a substituent, an alkenyl group which may have a substituent, or a —SO$_2$—-containing cyclic group which may have a substituent.

Examples of the aryl group represented by $R^{210}$ include an unsubstituted aryl group having 6 to 20 carbon atoms. Among these, a phenyl group and a naphthyl group are preferable.

As the alkyl group represented by $R^{210}$, a chain-like or cyclic alkyl group having 1 to 30 carbon atoms is preferable.

As the alkenyl group represented by $R^{210}$, an alkenyl group having 2 to 10 carbon atoms is preferable.

The —SO$_2$—-containing cyclic group which is represented by $R^{210}$ and may have a substituent is preferably "—SO$_2$—-containing polycyclic group" described above, and more preferably a group represented by Formula (a5-r-1).

$Y^{201}$ each independently represents an arylene group, an alkylene group, or an alkenylene group.

Examples of the arylene group represented by $Y^{201}$ include a group obtained in a case where one hydrogen atom is removed from the aryl group exemplified above as the aromatic hydrocarbon group represented by $R^{101}$ in Formula (b-1).

Examples of the alkylene group and the alkenylene group represented by $Y^{201}$ include a group obtained in a case where one hydrogen atom is removed from the group exemplified above as the chain-like alkyl group or the chain-like alkenyl group represented by $R^{101}$ in Formula (b-1).

In Formula (ca-4), x represents 1 or 2.

$W^{201}$ represents an (x+1)-valent linking group, that is, a divalent or trivalent linking group.

As the divalent linking group represented by $W^{201}$, a divalent hydrocarbon group which may have a substituent is preferable. The divalent linking group represented by $W^{201}$ may be linear, branched, or cyclic, and is preferably cyclic. Among these, a group obtained by combining two carbonyl groups on both terminals of an arylene group is preferable. Examples of the arylene group include a phenylene group, a naphthylene group, and the like. Among these, a phenylene group is particularly preferable.

Examples of the trivalent linking group represented by $W^{201}$ include a group obtained by removing one hydrogen atom from the divalent linking group represented by $W^{201}$, a group obtained by bonding the aforementioned divalent linking group to the divalent linking group, and the like. As the trivalent linking group represented by $W^{201}$, a group obtained by bonding two carbonyl groups to an arylene group is preferable.

Specific examples of suitable cations represented by Formula (ca-1) include a cation represented by each of Formulae (ca-1-1) to (ca-1-67).

(ca-1-1)

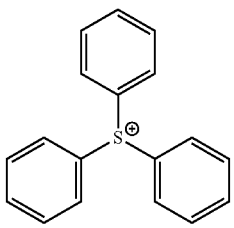

(ca-1-1)
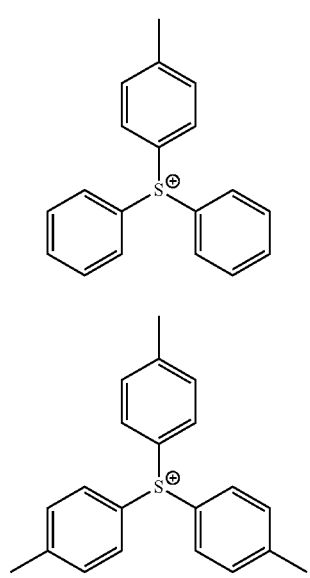
(ca-1-1)
(ca-1-1)
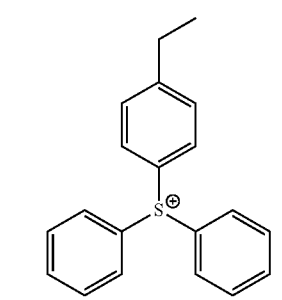
(ca-1-1)
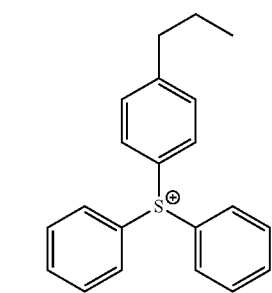
(ca-1-1)
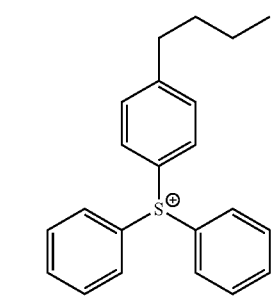
(ca-1-7)
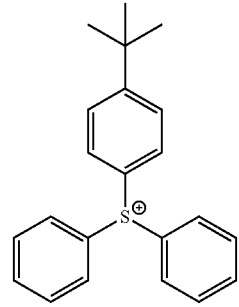
(ca-1-8)
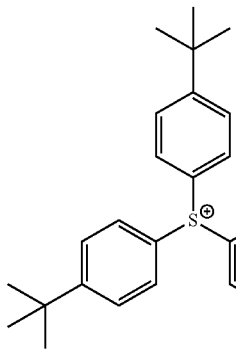
(ca-1-9)
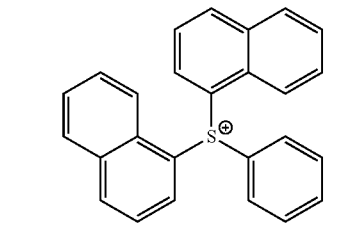
(ca-1-10)
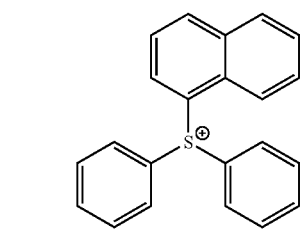
(ca-1-11)
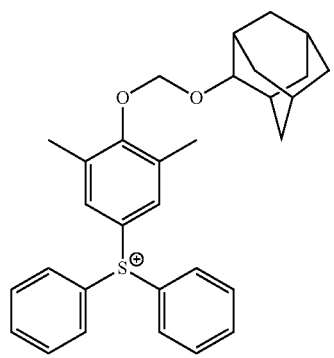

-continued
(ca-1-12)
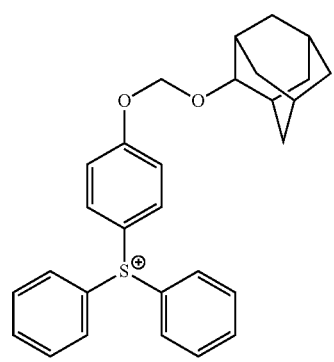
(ca-1-13)
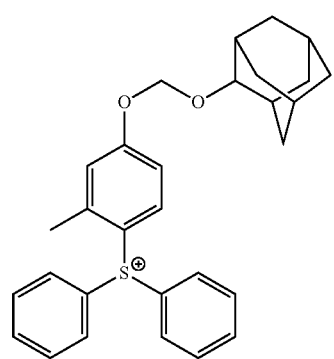
(ca-1-14)
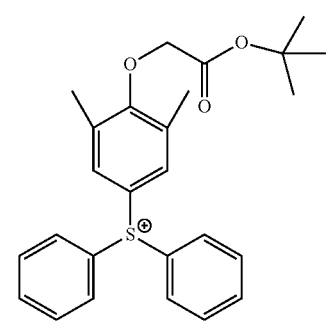
(ca-1-15)
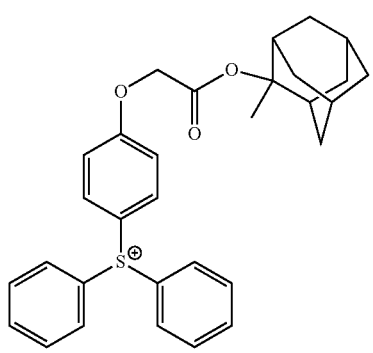
-continued
(ca-1-16)
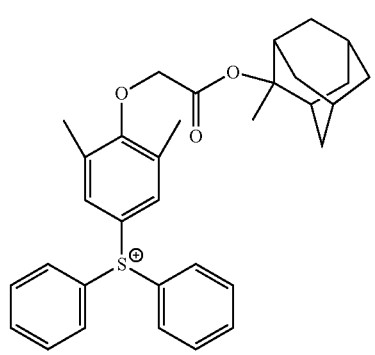
(ca-1-17)
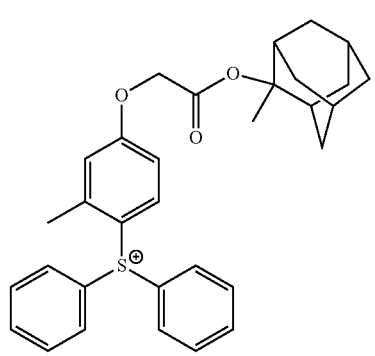
(ca-1-18)
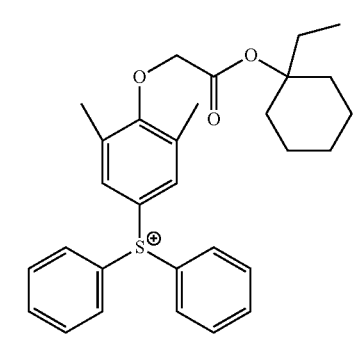
(ca-1-19)
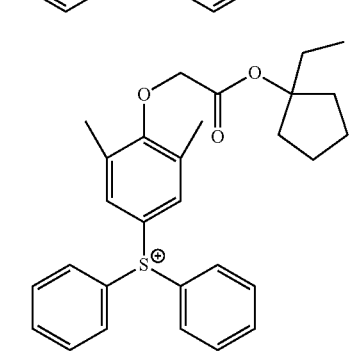
(ca-1-20)
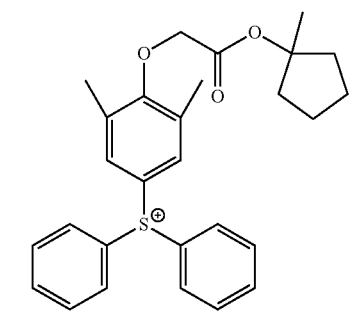

(ca-1-21)
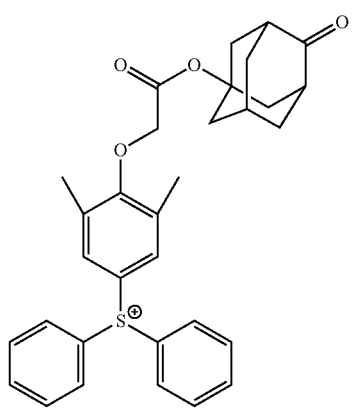
(ca-1-22)
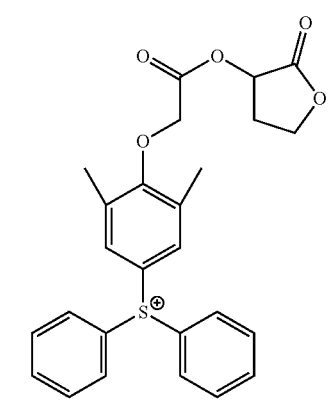
(ca-1-23)
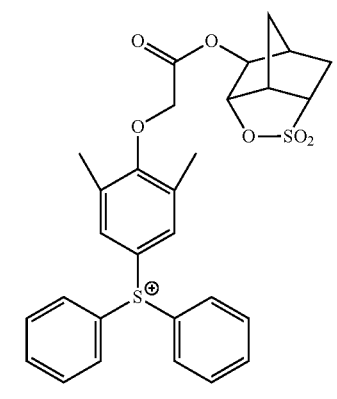
(ca-1-24)
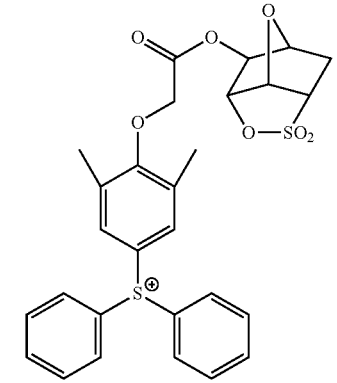
(ca-1-25)
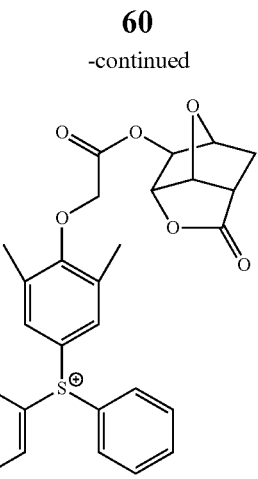
(ca-1-26)
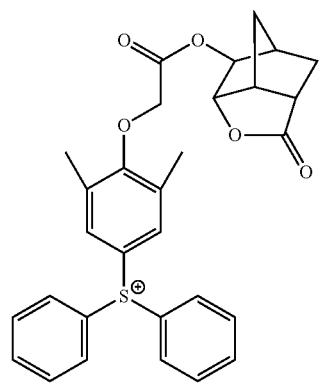
(ca-1-27)
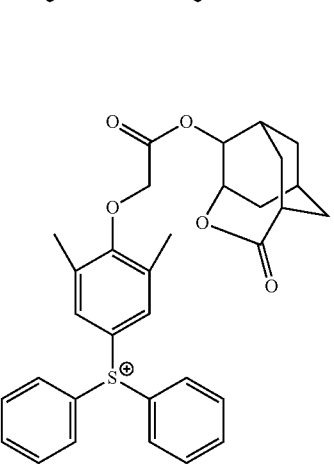
(ca-1-28)
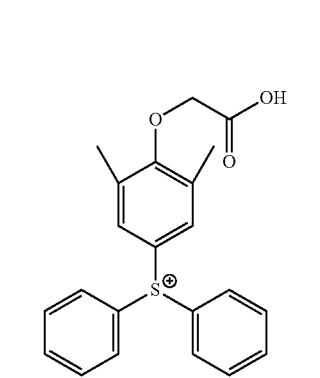

-continued
(ca-1-29)
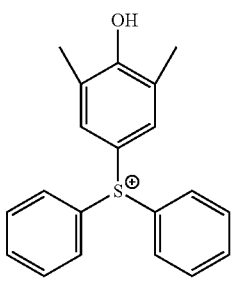
(ca-1-30)
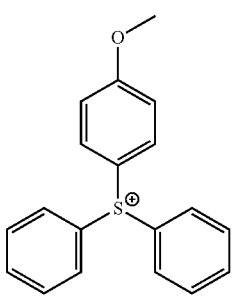
(ca-1-31)
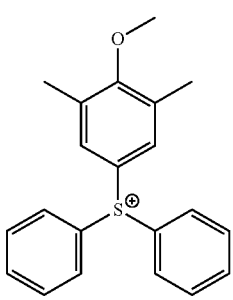
(ca-1-32)
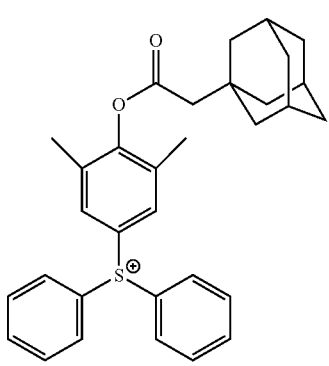
(ca-1-33)
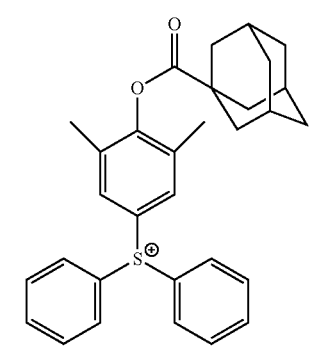
-continued
(ca-1-34)
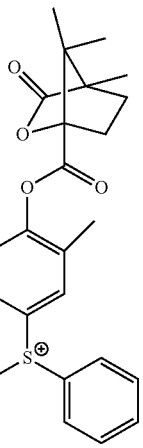
(ca-1-35)
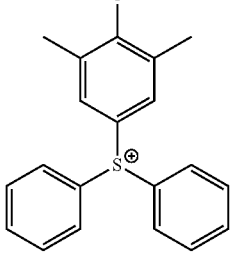
(ca-1-36)
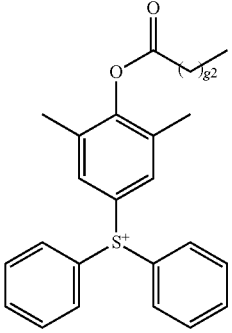
(ca-1-37)
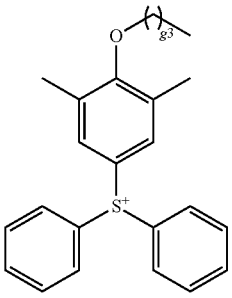

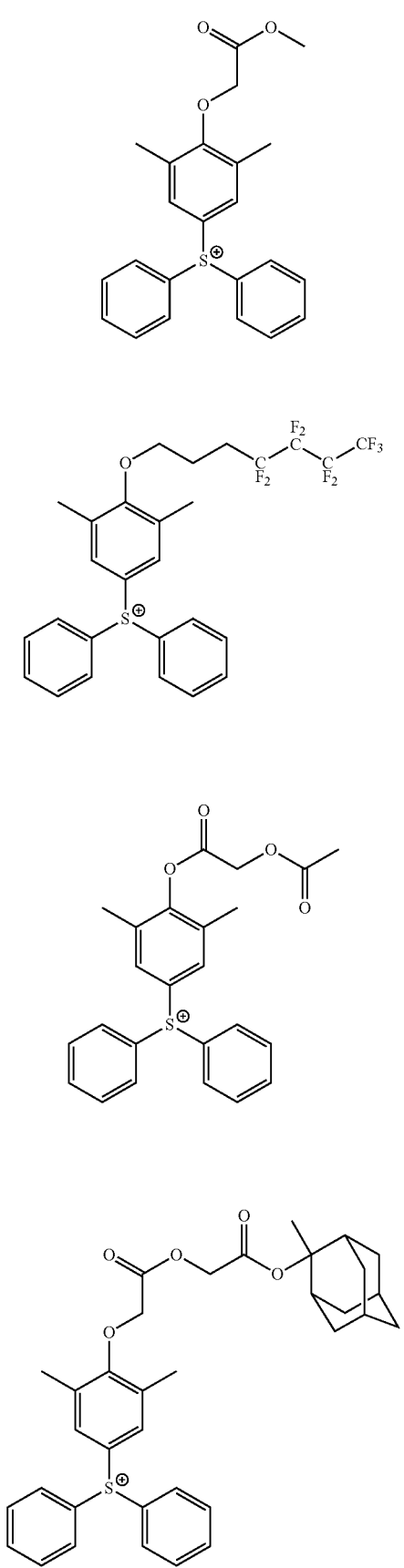
(ca-1-38)
(ca-1-39)
(ca-1-40)
(ca-1-41)
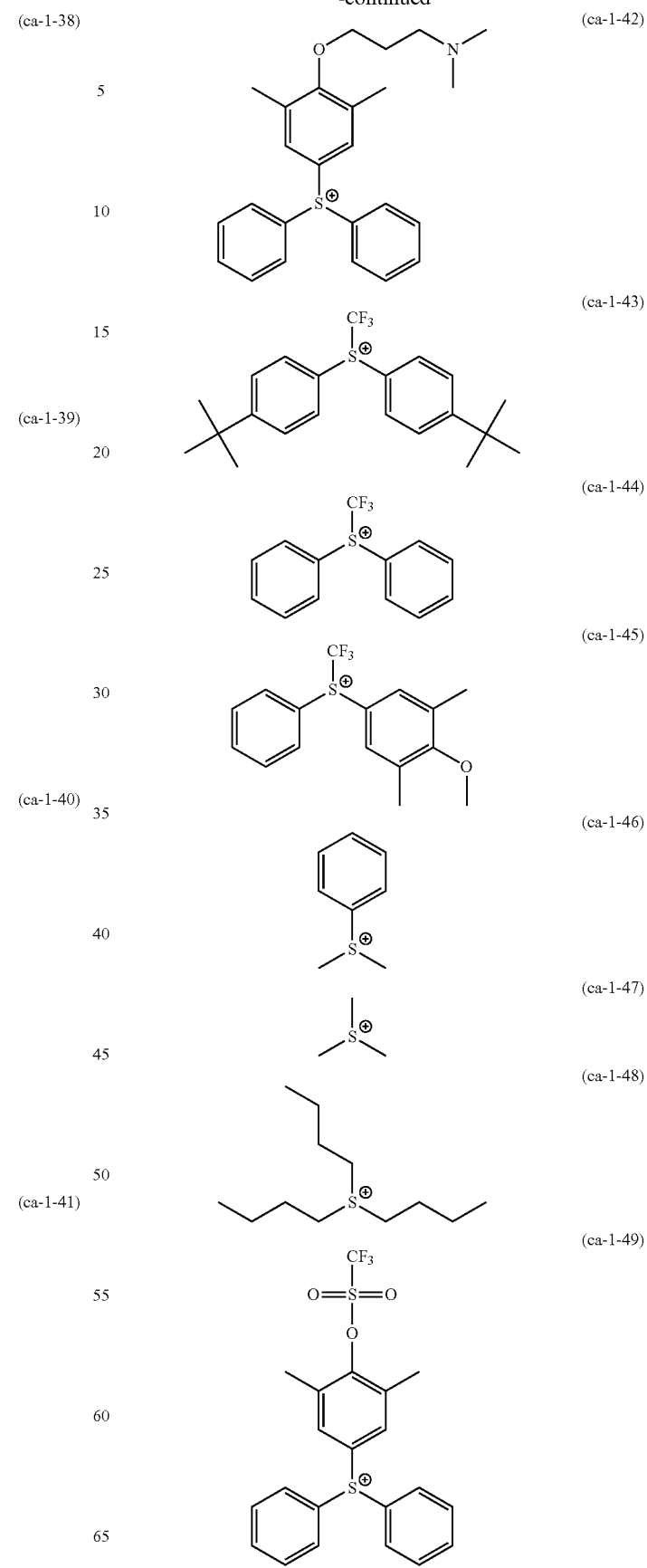
(ca-1-42)
(ca-1-43)
(ca-1-44)
(ca-1-45)
(ca-1-46)
(ca-1-47)
(ca-1-48)
(ca-1-49)

(ca-1-50)
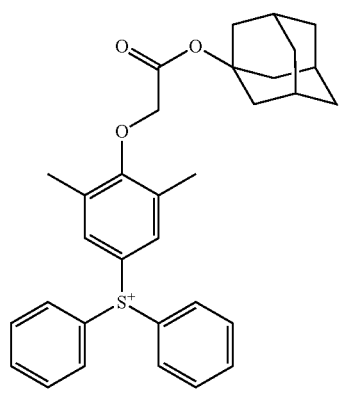
(ca-1-51)
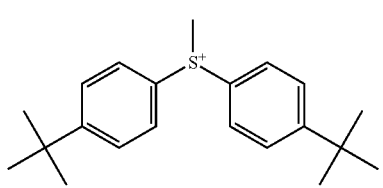
[In the formulae, g1, g2, and g3 each represent the number of repeating unit, g1 is an integer of 1 to 5, g2 is an integer of 0 to 20, and gas 3 is an integer of 0 to 20.]
(ca-1-52)
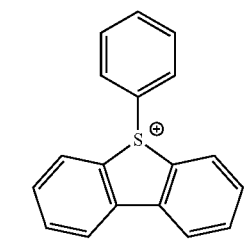
(ca-1-53)
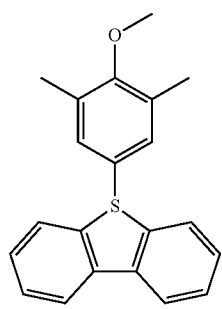
(ca-1-54)
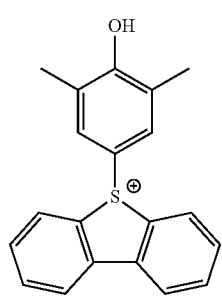
(ca-1-55)
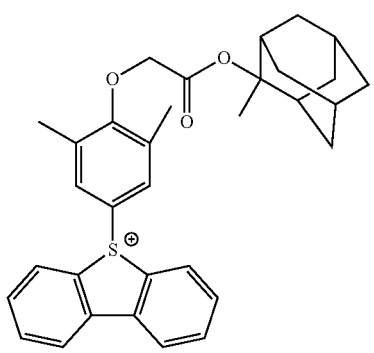
(ca-1-56)
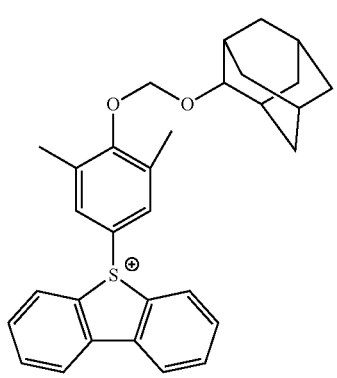
(ca-1-57)
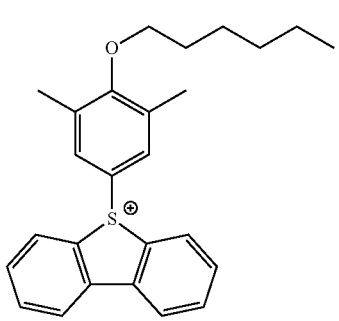
(ca-1-58)
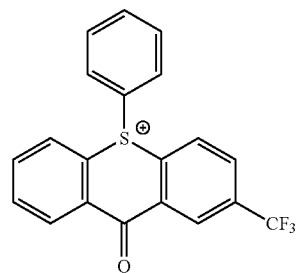
(ca-1-59)
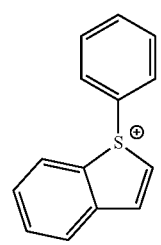

(ca-1-60) 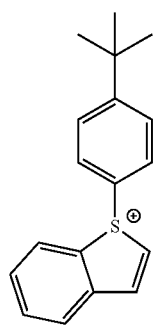

(ca-1-61) 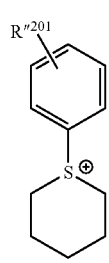

(ca-1-62) 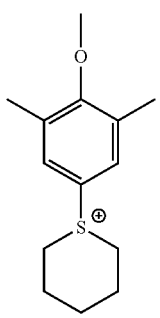

(ca-1-63) 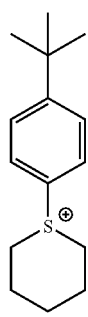

(ca-1-64) 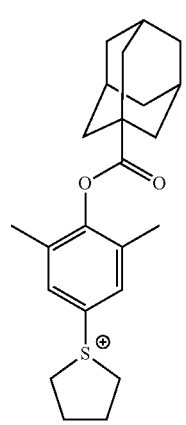

(ca-1-65) 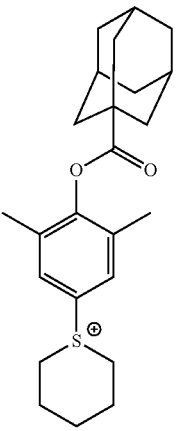

(ca-1-66) 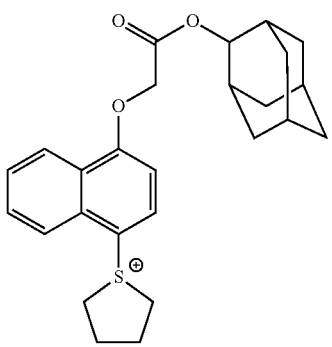

(ca-1-67) 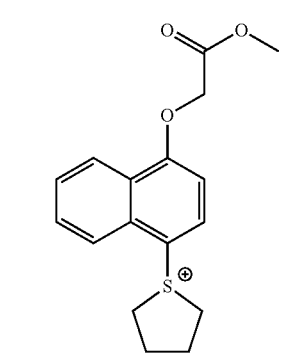

[In the formulae, $R''^{201}$ represents a hydrogen atom or a substituent, and examples of the substituent are the same as those exemplified above as the substituent which may be included in $R^{201}$ to $R^{207}$ and $R^{210}$ to $R^{212}$.]

Specifically, examples of suitable cations represented by Formula (ca-2) include a diphenyliodonium cation, a bis(4-tert-butylphenyl)iodonium cation, and the like.

Specifically, examples of suitable cations represented by Formula (ca-3) include a cation represented by each of Formulae (ca-3-1) to (ca-3-6).

(ca-3-1) 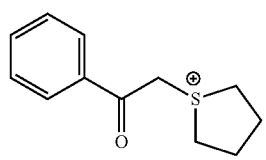

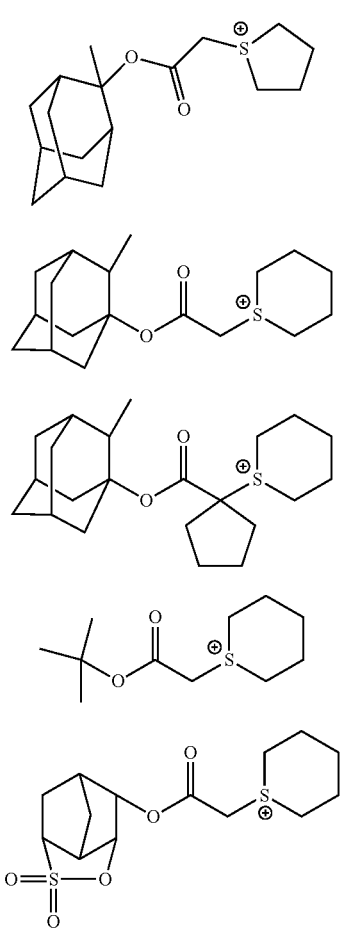

(ca-3-2)
(ca-3-3)
(ca-3-4)
(ca-3-5)
(ca-3-6)

[Specifically, examples of suitable cations represented by Formula (ca-4) include a cation represented by each of Formulae (ca-4-1) and (ca-4-2)].

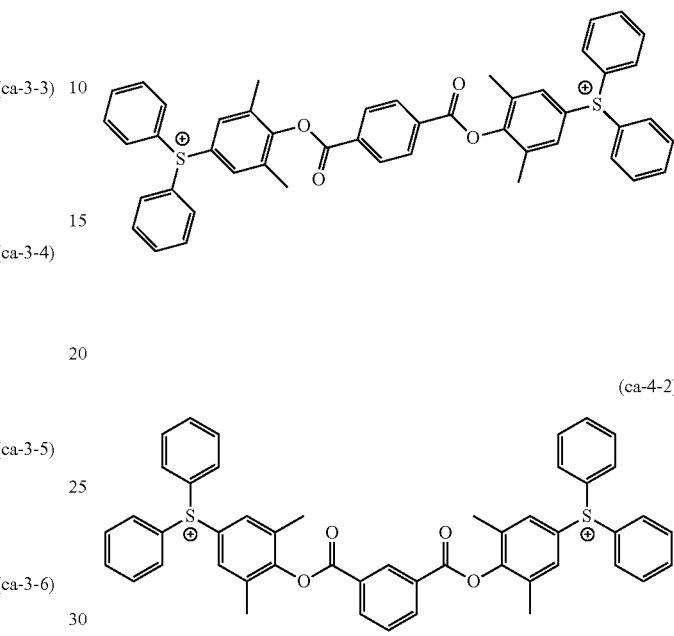

(ca-4-1)
(ca-4-2)

Among the above, the cation portion $[(M^{m+})_{1/m}]$ is preferably a cation represented by Formula (ca-1), and more preferably a cation represented by each of Formulae (ca-1-1) to (ca-1-67).

Specific examples of the component (B) will be shown below.

PAG-1  PAG-2

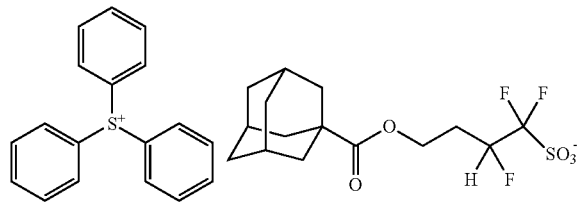

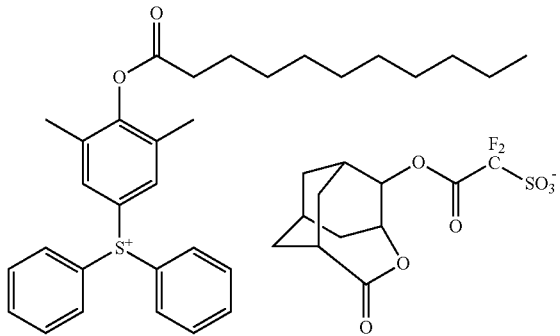

PAG-3  PAG-4

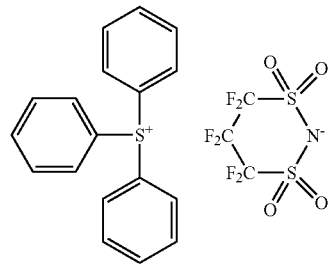

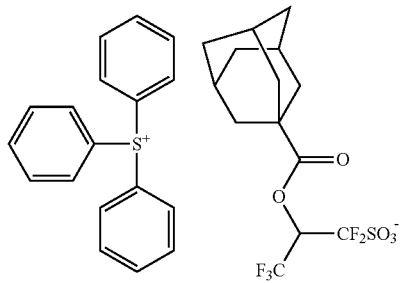

PAG-5

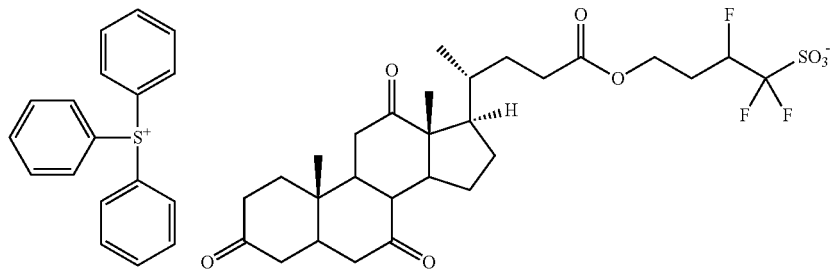

As the component (B), one kind of acid generator described above may be used singly, or two or more kinds thereof may be used in combination.

In a case where the resist composition contains the component (B), the content of the component (B) with respect to 100 parts by mass of the component (A) is preferably 0.5 to 60 parts by mass, more preferably 1 to 50 parts by mass, and even more preferably 1 to 40 parts by mass.

In a case where the content of the component (B) is within the above range, a pattern is sufficiently formed. Furthermore, it is preferable that the content of the component (B) is within the above range, because then at the time of dissolving each of the components of the resist composition in an organic solvent, a uniform solution is easily obtained, and the storage stability of the resist composition is improved.

[Component (D): Photoreactive Quencher Component]

In the present invention, the resist composition may further contain a photoreactive quencher component (hereinafter, referred to as "component (D)" as well).

The component (D) functions as a quencher (an acid diffusion control agent) trapping an acid generated from the component (B) or the like through exposure.

The component (D) in the present invention may be a photodegradable base (D1) (hereinafter, referred to as "component (D1)") which loses its acid diffusion controllability by being decomposed through exposure or a nitrogen-containing organic compound (D2) (hereinafter, referred to as "component (D2)") which does not correspond to the component (D1).

(Component (D1))

In a case where the resist composition contains the component (D1), at the time of forming a resist pattern, it is possible to improve the contrast between an exposed portion and an unexposed portion.

The component (D1) is not particularly limited as long as the component loses its acid diffusion controllability by being decomposed through exposure, and is preferably one or more kinds of compounds selected from the group consisting of a compound represented by Formula (d1-1) (hereinafter, referred to as "component (d1-1)"), a compound represented by Formula (d1-2) (hereinafter, referred to as "component (d1-2)"), and a compound represented by Formula (d1-3) (hereinafter, referred to as "component (d1-3)").

In an exposed portion, the components (d1-1) to (d1-3) are decomposed and lose their acid diffusion controllability (basicity). Therefore, they do not function as a quencher in an exposed portion, and function as a quencher in an unexposed portion.

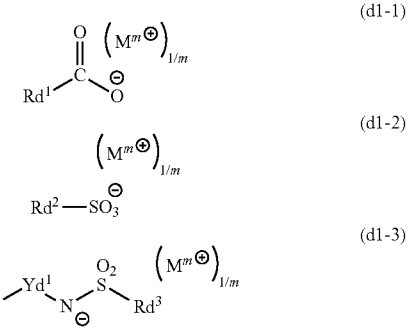

[In the formulae, $Rd^1$ to $Rd^4$ each represent a cyclic group which may have a substituent, a chain-like alkyl group which may have a substituent, or a chain-like alkenyl group which may have a substituent. Here, to a carbon atom adjacent to a S atom in $Rd^2$ in Formula (d1-2), two or more fluorine atoms are not bonded. $Yd^1$ represents a single bond or a divalent linking group. $M^{m+}$ each independently represents an m-valent organic cation.]

{Component (d1-1)}

Anion Portion

In Formula (d1-1), $Rd^1$ represents a cyclic group which may have a substituent, a chain-like alkyl group which may have a substituent, or a chain-like alkenyl group which may have a substituent. Examples of $Rd^1$ are the same as the examples of $R^{101}$ Among these, as $Rd^1$, an aromatic hydrocarbon group which may have a substituent, an aliphatic cyclic group which may have a substituent, or a chain-like hydrocarbon group which may have a substituent is preferable. As the substituent which may be included in these groups, a hydroxyl group, a fluorine atom, or a fluorinated alkyl group is preferable.

As the aromatic hydrocarbon group, a phenyl group or a naphthyl group is more preferable.

As the aliphatic cyclic group, a group obtained by removing one or more hydrogen atoms from polycycloalkane such as adamantane, norbornane, isobornane, tricyclodecane, or tetracyclododecane is more preferable.

As the chain-like hydrocarbon group, a chain-like alkyl group is preferable. The number of carbon atoms in the chain-like alkyl group is preferably 1 to 10. Specifically, examples of the alkyl group include a linear alkyl group such as a methyl group, an ethyl group, a propyl group, a butyl group, a pentyl group, a hexyl group, a heptyl group, an octyl group, a nonyl group, or a decyl group; and a branched alkyl group such as a 1-methylethyl group, a 1-methylpropy group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the number of carbon atoms in the fluorinated alkyl group is preferably 1 to 11, more preferably 1 to 8, and even more preferably 1 to 4. The fluorinated alkyl group may contain an atom other than a fluorine atom. Examples of the atom other than a fluorine atom include an oxygen atom, a carbon atom, a hydrogen atom, a sulfur atom, a nitrogen atom, and the like.

$Rd^1$ is preferably a fluorinated alkyl group obtained in a case where some or all of the hydrogen atoms constituting a linear alkyl group are substituted with a fluorine atom, and preferably a fluorinated alkyl group (a linear perfluoroalkyl group) obtained in a case where all of the hydrogen atoms constituting a linear alkyl group are substituted with a fluorine atom.

Specific examples preferable as the anion portion of the component (d1-1) will be shown below.

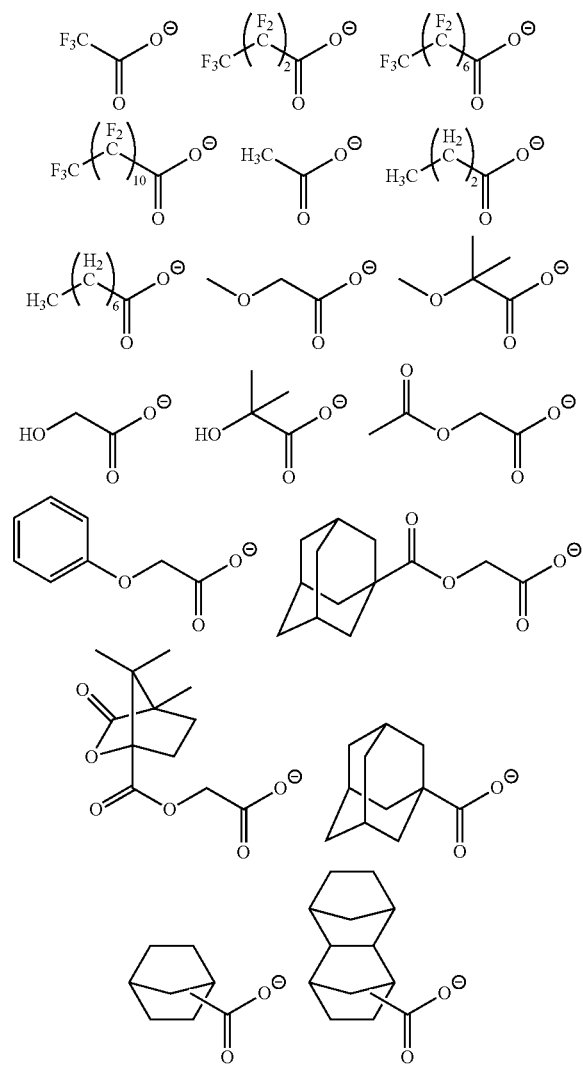

Cation Portion

In Formula (d1-1), $M^{m+}$ represents an m-valent organic cation.

The organic cation represented by $M^{m+}$ is not particularly limited, and examples thereof are the same as the cations represented by Formulae (ca-1) to (ca-4) described above. Among these, the cations represented by Formulae (ca-1-1) to (ca-1-67) are preferable.

One kind of component (d1-1) may be used singly, or two or more kinds thereof may be used in combination.

{Component (d1-2)}

Anion Portion

In Formula (d1-2), $Rd^2$ represents a cyclic group which may have a substituent, a chain-like alkyl group which may have a substituent, or a chain-like alkenyl group which may have a substituent. Examples of $Rd^2$ are the same the examples of $R^{101}$ Here, to a carbon atom adjacent to a S atom in $Rd^2$, two or more fluorine atoms are not bonded (the carbon atom is not substituted with fluorine). As a result, the anion of the component (d1-2) becomes an appropriate weak acid anion, and the quenching ability of the component (D) is improved.

$Rd^2$ is preferably an aliphatic cyclic group which may have a substituent and more preferably a group (which may have a substituent) obtained by removing one or more hydrogen atoms from adamantane, norbornane, isobornane, tricyclodecane, tetracyclododecane, or the like or a group obtained by removing one or more hydrogen atoms from camphor or the like.

The hydrocarbon group as $Rd^2$ may have a substituent. Examples of the substituent are the same as the substituents that may be included in the hydrocarbon group (an aromatic hydrocarbon group or an aliphatic hydrocarbon group) represented by $Rd^1$ in Formula (d1-1).

Specific examples preferable as the anion portion of the component (d1-2) will be shown below.

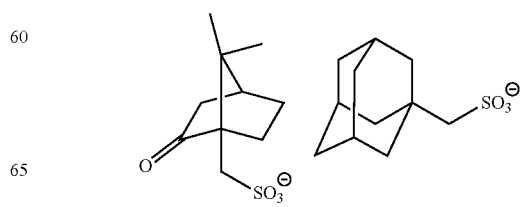

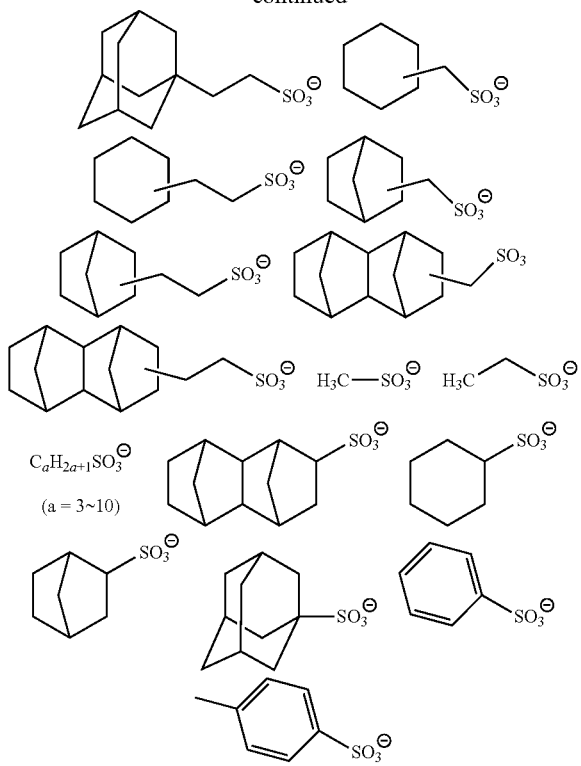

Cation Portion

In Formula (d1-2), $M^{m+}$ represents an m-valent organic cation, and is the same as $M^{m+}$ in Formula (d1-1).

One kind of component (d1-2) may be used singly, or two or more kinds thereof may be used in combination.

{Component (d1-3)}

Anion Portion

In Formula (d1-3), $Rd^3$ represents a cyclic group which may have a substituent, a chain-like alkyl group which may have a substituent, or a chain-like alkenyl group which may have a substituent. Examples of $Rd^3$ are the same as the examples of $R^{101}$. $Rd^3$ is preferably a cyclic group, a chain-like alkyl group, or a chain-like alkenyl group having a fluorine atom. Among these, a fluorinated alkyl group is preferable, and the same group as the fluorinated alkyl group represented by $Rd^1$ is more preferable.

In Formula (d1-3), $Rd^4$ represents a cyclic group which may have a substituent, a chain-like alkyl group which may have a substituent, or a chain-like alkenyl group which may have a substituent. Examples of $Rd^4$ are the same as the examples of $R^{101}$.

Among these, an alkyl group, an alkoxy group, an alkenyl group, and a cyclic group which may have a substituent are preferable.

As the alkyl group represented by $Rd^4$, a linear or branched alkyl group having 1 to 5 carbon atoms is preferable. Specifically, examples thereof include a methyl group, an ethyl group, a propyl group, an isopropyl group, a n-butyl group, an isobutyl group, a tert-butyl group, a pentyl group, an isopentyl group, a neopentyl group, and the like. Some of the hydrogen atoms in the alkyl group represented by $Rd^4$ may be substituted with a hydroxyl group, a cyano group, or the like.

The alkoxy group represented by $Rd^4$ is preferably an alkoxy group having 1 to 5 carbon atoms. Specific examples of the alkoxy group having 1 to 5 carbon atoms include a methoxy group, an ethoxy group, a n-propoxy group, an iso-propoxy group, a n-butoxy group, a tert-butoxy group, and the like. Among these, a methoxy group and an ethoxy group are preferable.

Examples of the alkenyl group represented by $Rd^4$ are the same as the examples of $R^{101}$. Among these, a vinyl group, a propenyl group (an allyl group), a 1-methylpropenyl group, and a 2-methylpropenyl group are preferable. These groups may further have, as a substituent, an alkyl group having 1 to 5 carbon atoms or a halogenated alkyl group having 1 to 5 carbon atoms.

Examples of the cyclic group represented by $Rd^4$ are the same as the examples of $R^{101}$. Among these, an alicyclic group obtained by removing one or more hydrogen atoms from cycloalkane such as cyclopentane, cyclohexane, adamantane, norbornane, isobornane, tricyclodecane, or tetracyclododecane or an aromatic group such as a phenyl group or a naphthyl group is preferable. In a case where $Rd^4$ represents an alicyclic group, the resist composition excellently dissolves in an organic solvent, and hence the lithography characteristics are improved. In a case where $Rd^4$ represents an aromatic group, in a lithography process using EUV as an exposure light source, the resist composition absorbs light with high efficiency, and the sensitivity or the lithography characteristics are improved.

In Formula (d1-3), $Yd^1$ represents a single bond or a divalent linking group.

The divalent linking group represented by $Yd^1$ is not particularly limited, and examples thereof include a divalent hydrocarbon group (an aliphatic hydrocarbon group or an aromatic hydrocarbon group) which may have a substituent, a divalent linking group having a heteroatom, and the like. Examples of these are the same as the examples of the divalent linking group represented by $Ya^{21}$ in Formula (a2-1) described above.

As $Yd^1$, a carbonyl group, an ester bond, an amide bond, an alkylene group, or a combination of these is preferable. The alkylene group is more preferably a linear or branched alkylene group, and even more preferably a methylene group or an ethylene group.

Specific examples preferable as the anion portion of the component (d1-3) will be shown below.

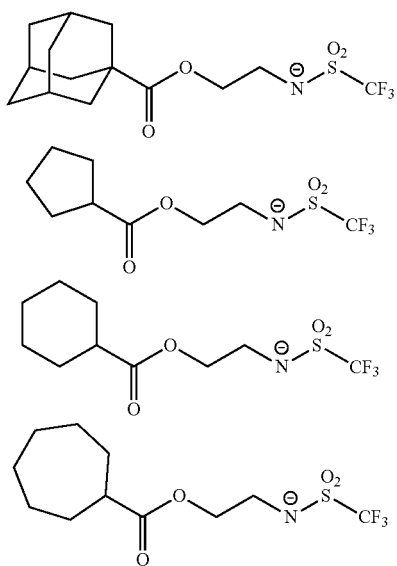

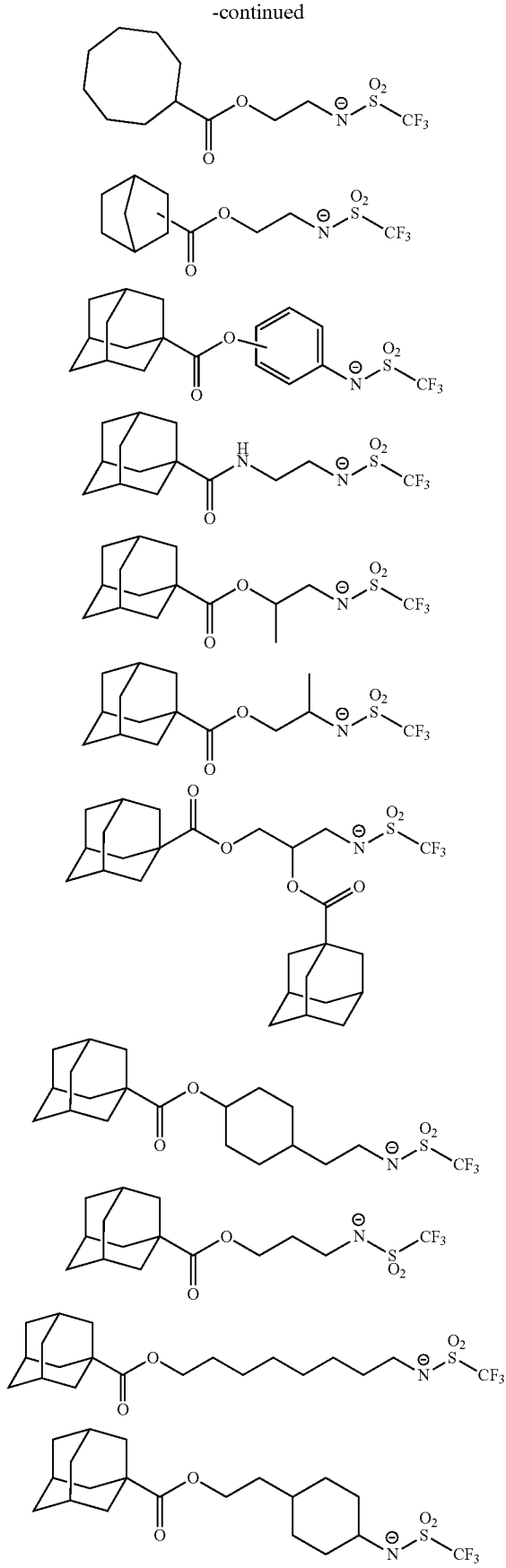

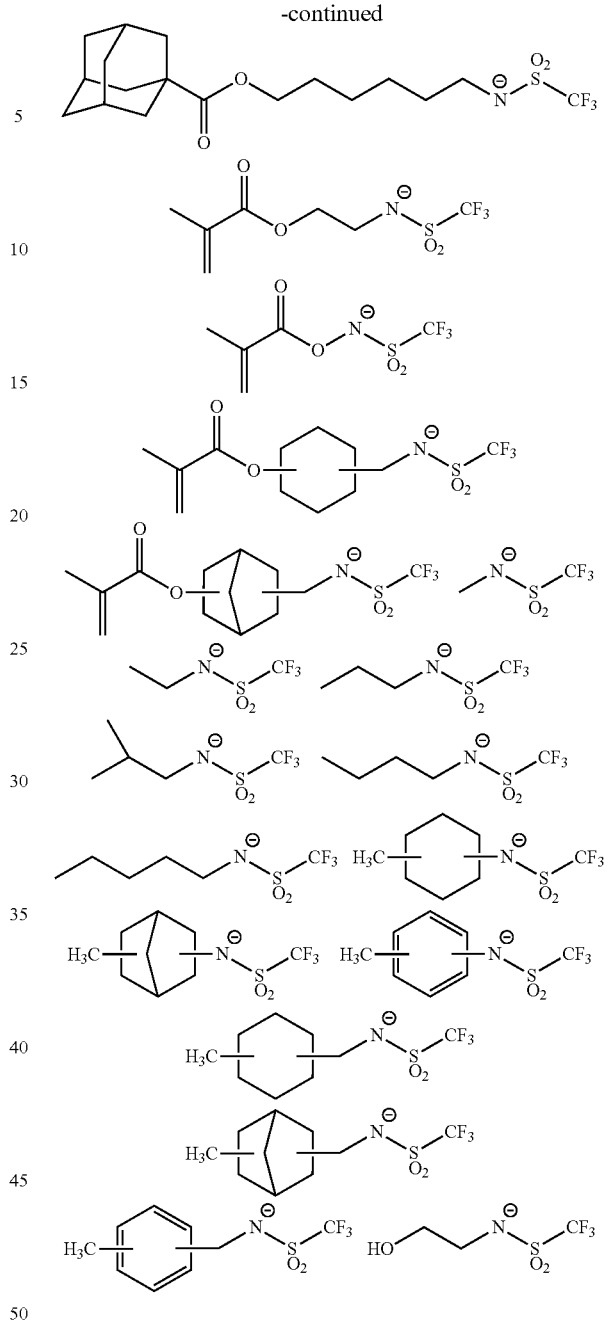

Cation Portion

In Formula (d1-3), $M^{m+}$ represents an m-valent organic cation and is the same as $M^{m+}$ in Formula (d1-1).

One kind of component (d1-3) may be used singly, or two or more kinds thereof may be used in combination.

As the component (D1), only one kind of component among the components (d1-1) to (d1-3) may be used, or two or more kinds thereof may be used in combination.

The content of the component (D1) with respect to 100 parts by mass of the component (A) is preferably 0.5 to 10 parts by mass, more preferably 0.5 to 8 parts by mass, and even more preferably 1 to 8 parts by mass.

In a case where the content of the component (D1) is equal to or greater than the preferred lower limit, particularly excellent lithography characteristics and a particularly excellent resist pattern shape are obtained. In a case where the content of the component (D1) is equal to or smaller than the aforementioned upper limit, excellent sensitivity can be maintained, and the throughput becomes excellent.

The method for manufacturing the component (d1-1) and the component (d1-2) is not particularly limited, and these components can be manufactured by known methods.

The content of the component (D1) with respect to 100 parts by mass of the component (A) is preferably 0.5 to 10.0 parts by mass, more preferably 0.5 to 8.0 parts by mass, and even more preferably 1.0 to 8.0 parts by mass. In a case where the content of the component (D1) is equal to or greater than the lower limit of the aforementioned range, particularly excellent lithography characteristics and a particularly excellent resist pattern shape are obtained. In a case where the content of the component (D1) is equal to or smaller than the upper limit of the aforementioned range, excellent sensitivity can be maintained, and the throughput becomes excellent.

(Component (D2))

The component (D) may contain a nitrogen-containing organic compound component (hereinafter, referred to as a component (D2)) which does not correspond to the component (D1).

The component (D2) is not particularly limited as long as it functions as an acid diffusion control agent and does not correspond to the component (D1), and any of known components may be used. Among these, an aliphatic amine, particularly, a secondary aliphatic amine or a tertiary aliphatic amine is preferable.

The aliphatic amine is an amine having one or more aliphatic groups. The number of carbon atoms in the aliphatic group is preferably 1 to 12.

Examples of the aliphatic amine include an amine, which is obtained in a case where at least one of the hydrogen atoms in ammonia ($NH_3$) is substituted with an alkyl group having 12 or less carbon atoms or a hydroxyalkyl group (alkylamine or alkyl alcohol amine), or a cyclic amine.

Specific examples of the alkylamine and the alkyl alcohol amine include monoalkylamine such as n-hexylamine, n-heptylamine, n-octylamine, n-nonylamine, and n-decylamine; dialkylamine such as diethylamine, di-n-propylamine, di-n-heptylamine, di-n-octylamine, and dicyclohexylamine; trialkylamine such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and alkyl alcohol amine such as diethanolamine, triethanolamine, diisopropanolamine, triisopropanolamine, di-n-octanolamine, and tri-n-octanolamine. Among these, trialkylamine having 5 to 10 carbon atoms is more preferable, and tri-n-pentylamine or tri-n-octylamine is particularly preferable.

Examples of the cyclic amine include a heterocyclic compound having a nitrogen atom as a heteroatom. The heterocyclic compound may be monocyclic (an aliphatic monocyclic amine) or polycyclic (an aliphatic polycyclic amine).

Specifically, examples of the aliphatic monocyclic amine include piperidine, piperazine, and the like.

As the aliphatic polycyclic amine, those having 6 to 10 carbon atoms are preferable. Specific examples thereof include 1,5-diazabicyclo[4.3.0]-5-nonene, 1,8-diazabicyclo[5.4.0]-7-undecene, hexamethylenetetramine, 1,4-diazabicyclo[2.2.2]octane, and the like.

Examples of other aliphatic amines include tris(2-methoxymethoxyethyl)amine, tris {2-(2-methoxyethoxy) ethyl}amine, tris {2-(2-methoxyethoxymethoxy) ethyl}amine, tris {2-(1-methoxyethoxy)ethyl}amine, tris {2-(1-ethoxyethoxy)ethyl}amine, tris {2-(1-ethoxypropoxy) ethyl}amine, tris[2-{2-(2-hydroxyethoxy)ethoxy}ethyl] amine, triethanolamine triacetate, and the like. Among these, triethanolamine triacetate is preferable.

As the component (D2), an aromatic amine may also be used.

Examples of the aromatic amine include aniline, pyridine, 4-dimethylaminopyridine, pyrrole, indole, pyrazole, imidazole, a derivative of these, diphenylamine, triphenylamine, tribenzylamine, 2,6-diisopropylaniline, N-tert-butoxycarbonyl pyrrolidine, and the like.

One kind of component (D2) may be used singly, or two or more kinds thereof may be used in combination.

The amount of the component (D2) used is generally within a range of 0.01 to 5.0 parts by mass with respect to 100 parts by mass of the component (A). In a case where the amount of the component (D2) is within the above range, the resist pattern shape, the post-exposure temporal stability, and the like are improved.

One kind of component (D) may be used singly, or two or more kinds thereof may be used in combination.

In a case where the resist composition of the present invention contains the component (D), the content of the component (D) with respect to 100 parts by mass of the component (A) is preferably 0.1 to 15 parts by mass, more preferably 0.3 to 12 parts by mass, and even more preferably 0.5 to 12 parts by mass. Provided that the content of the component (D) is equal to or greater than the lower limit of the aforementioned range, in a case where the resist composition is prepared, the lithography characteristics such as LWR are further improved. Furthermore, a better resist pattern shape is obtained. In a case where the content of the component (D) is equal to or smaller than the upper limit of the aforementioned range, excellent sensitivity can be maintained, and the throughput becomes excellent.

Specific examples of the component (D) will be shown below.

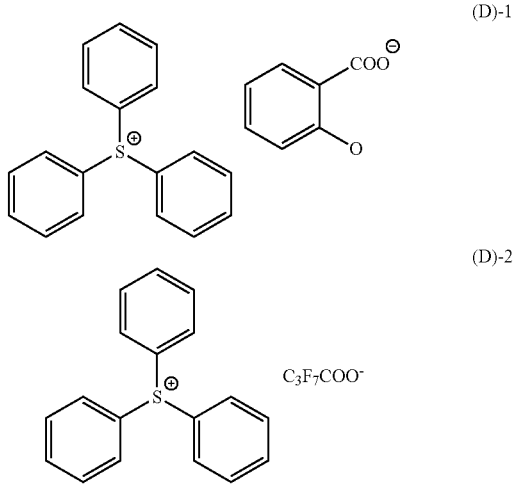

[Component (E)]

In the present invention, for the purpose of preventing the deterioration of sensitivity and improving the resist pattern shape, the post-exposure temporal stability, and the like, the resist composition can contain, as an optional component, at least one kind of compound (E) (hereinafter, referred to as a component (E)) selected from the group consisting of an organic carboxylic acid, an oxo acid of phosphorus, and derivatives of these.

As the organic carboxylic acid, for example, acetic acid, malonic acid, citric acid, malic acid, succinic acid, benzoic acid, salicylic acid, and the like are suitable.

Examples of the oxo acid of phosphorus include phosphoric acid, phosphonic acid, phosphinic acid, and the like. Among these, phosphonic acid is particularly preferable.

Examples of the derivatives of the oxo acid of phosphorus include esters obtained in a case where a hydrogen atom in the oxo acid is substituted with a hydrocarbon group. Examples of the hydrocarbon group include an alkyl group having 1 to 5 carbon atoms, an aryl group having 6 to 15 carbon atoms, and the like.

Examples of the derivatives of phosphoric acid include phosphoric acid esters such as a phosphoric acid di-n-butyl ester and a phosphoric acid diphenyl ester, and the like.

Examples of the derivatives of phosphonic acid include phosphonic acid esters such as a phosphonic acid dimethyl ester, a phosphonic acid-di-n-butyl ester, phenyl phosphate, a phosphonic acid diphenyl ester, and a phosphonic acid dibenzyl ester, and the like.

Examples of the derivatives of phosphinic acid include a phosphinic acid ester, phenyl phosphinate, and the like.

One kind of component (E) may be used singly, or two or more kinds thereof may be used in combination.

The amount of the component (E) used is generally within a range of 0.01 to 5.0 parts by mass with respect to 100 parts by mass of the component (A).

[Component (F)]

In the present invention, in order to impart water repellency to a resist film, the resist composition may contain a fluorine additive (hereinafter, referred to as "component (F)").

As the component (F), for example, it is possible to use fluorine-containing polymer compound descried in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226.

More specifically, examples of the component (F) include a polymer having a constituent unit (f1) represented by Formula (f1-1). Here, the polymer compound corresponding to the component (A) described above is excluded.

As the polymer having the constituent unit (f1), a polymer including only the constituent unit (f1) (homopolymer); a copolymer of the constituent unit (f1) and a constituent unit represented by Formula (m-1); and a copolymer of the constituent unit (f1), a constituent unit derived from an acrylic acid or a methacrylic acid, and a constituent unit represented by Formula (m-1) are preferable.

As the constituent unit represented by Formula (m-1), a constituent unit derived from 1-ethyl-1-cyclooctyl (meth) acrylate and a constituent unit derived from 1-methyl-1-adamantyl (meth)acrylate are preferable.

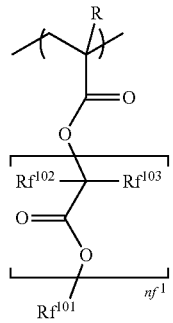

(f1-1)

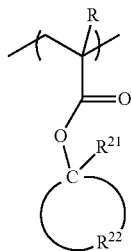

(m-1)

[In the formulae, a plurality of R's each independently represent a hydrogen atom, an alkyl group having 1 to 5 carbon atoms, or a halogenated alkyl group having 1 to 5 carbon atoms. In Formula (f1-1), $Rf^{102}$ and $Rf^{103}$ each independently represent a hydrogen atom, a halogen atom, an alkyl group having 1 to 5 carbon atoms, or a halogenated alkyl group having 1 to 5 carbon atoms. $Rf^{102}$ and $Rf^{103}$ may be the same as or different from each other. $nf^1$ represents an integer of 0 to 5, and $Rf^{101}$ represents an organic group having a fluorine atom. In Formula (m-1), $R^{21}$ represents an alkyl group, and $R^{22}$ represents a group forming an aliphatic cyclic group together with a carbon atom to which $R^{22}$ is bonded.]

In Formula (f1-1), R each independently represents a hydrogen atom, an alkyl group having 1 to 5 carbon atoms, or a halogenated alkyl group having 1 to 5 carbon atoms. R in Formula (f1-1) is the same as R in Formula (1) described above.

R is preferably a hydrogen atom, an alkyl group having 1 to 5 carbon atoms, or a fluorinated alkyl group having 1 to 5 carbon atoms. In view of ease of industrial availability, R is more preferably a hydrogen atom or an alkyl group having 1 to 5 carbon atoms, even more preferably an alkyl group having 1 to 5 carbon atoms, and particularly preferably a methyl group.

Examples of the halogen atom represented by $Rf^{102}$ and $Rf^{103}$ in Formula (f1-1) include a fluorine atom, a chlorine atom, a bromine atom, an iodine atom, and the like. Among these, a fluorine atom is particularly preferable. Examples of the alkyl group having 1 to 5 carbon atoms that is represented by $Rf^{102}$ and $Rf^{103}$ are the same as the examples of the alkyl group having 1 to 5 carbon atoms that is represented by R. Among these, a methyl group or an ethyl group is preferable. Specifically, examples of the halogenated alkyl group having 1 to 5 carbon atoms that is represented by $Rf^{102}$ and $Rf^{103}$ include a group obtained in a case where some or all of the hydrogen atoms in an alkyl group having 1 to 5 carbon atoms are substituted with a halogen atom.

Examples of the halogen atom include a fluorine atom, a chlorine atom, a bromine atom, an iodine atom, and the like. Among these, a fluorine atom is particularly preferable.

Particularly, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In Formula (f1-1), $nf^1$ represents an integer of 0 to 5. $nf^1$ is preferably an integer of 0 to 3, and more preferably 0 or 1.

In Formula (f1-1), $Rf^{101}$ represents an organic group having a fluorine atom, and preferably represents a hydrocarbon group having a fluorine atom.

The hydrocarbon group having a fluorine atom may be linear, branched, or cyclic. The number of carbon atoms in the hydrocarbon group is preferably 1 to 20, more preferably 1 to 15, and particularly preferably 1 to 10.

In the hydrocarbon group having a fluorine atom, the proportion of the hydrogen atom fluorinated in the hydrocarbon group is preferably equal to or higher than 25%, more preferably equal to or higher than 50%, and particularly preferably equal to or higher than 60% because then the hydrophobicity of a resist film at the time of performing immersion exposure is increased.

$Rf^{101}$ is more preferably a fluorinated hydrocarbon group having 1 to 5 carbon atoms, and particularly preferably a trifluoromethyl group, $-CH_2-CF_3$, $-CH_2-CF_2-CF_3$, $-CH(CF_3)_2-$, $-CH_2-CH_2-CF_3$, or $-CH_2-CH_2-CF_2-CF_2-CF_2-CF_3$.

In Formula (m-1), the alkyl group represented by $R^{21}$ may be linear, branched, or cyclic, and is preferably a linear or a branched. The number of carbon atoms in the linear alkyl group is preferably 1 to 5, more preferably 1 to 4, and even more preferably 1 or 2. Specifically, examples thereof include a methyl group, an ethyl group, a n-propyl group, a n-butyl group, a n-pentyl group, and the like. Among these, a methyl group, an ethyl group, or a n-butyl group is preferable, and a methyl group or an ethyl group is more preferable. The number of carbon atoms in the branched alkyl group is preferably 3 to 10 and more preferably 3 to 5. Specifically, examples thereof include an isopropyl group, an isobutyl group, a tert-butyl group, an isopentyl group, a neopentyl group, and the like. Among these, an isopropyl group is particularly preferable.

In Formula (m-1), $R^{22}$ represents a group forming an aliphatic cyclic group together with a carbon atom to which $R^{22}$ is bonded. The aliphatic cyclic group formed by $R^{22}$ may be polycyclic or monocyclic. As the monocyclic aliphatic cyclic group, a group obtained by removing one or more hydrogen atoms from monocycloalkane is preferable. As the monocycloalkane, those having 3 to 10 carbon atoms are preferable. Examples thereof include cyclopentane, cyclohexane, cyclooctane, and the like. As the polycyclic aliphatic cyclic group, a group obtained by removing one or more hydrogen atoms from polycycloalkane is preferable. As the polycycloalkane, those having 7 to 12 carbon atoms are preferable. Examples thereof include adamantane, norbornane, isobornane, tricyclodecane, tetracyclododecane, and the like.

The mass average molecular weight (Mw) (measured by gel permeation chromatography and expressed in terms of standard polystyrene) of the component (F) is preferably 1,000 to 50,000, more preferably 5,000 to 40,000, and most preferably 10,000 to 30,000. In a case where Mw is equal to or smaller than the upper limit of the aforementioned range, the solubility in a solvent for a resist becomes sufficient such that the composition can be used as a resist. In a case where Mw is equal to or greater than the lower limit of the aforementioned range, dry etching resistance or the cross-sectional shape of a resist pattern becomes excellent.

The dispersity (Mw/Mn) of the component (F) is preferably 1.0 to 5.0, more preferably 1.0 to 3.0, and most preferably 1.2 to 2.5.

Specific examples of the component (F) will be shown below.

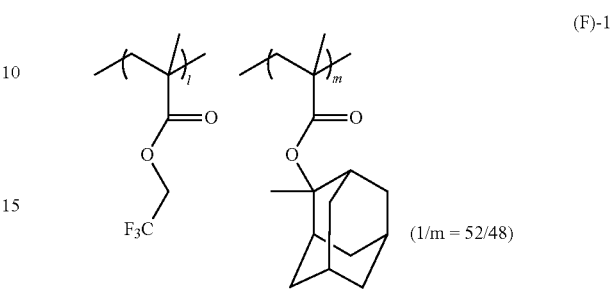

(F)-1

(l/m = 52/48)

One kind of component (F) may be used singly, or two or more kinds thereof may be used in combination.

The proportion of the component (F) used is 0.5 to 10 parts by mass with respect to 100 parts by mass of the component (A).

In the present invention, to the resist composition, miscible additives such as an additive resin, a dissolution inhibitor, a plasticizer, a stabilizer, a colorant, an antihalation agent, and a dye for improving the performance of a resist film can be appropriately added as desired.

[Component (S)]

The resist composition of the present invention can be manufactured by dissolving the materials in an organic solvent (hereinafter, referred to as a component (S) in some cases).

The component (S) is not limited as long as it can dissolve each of the components to be used and make a uniform solution. One kind or two or more kinds of organic solvents can be used by being appropriately selected from solvents known in the related art as solvents for chemical amplification-type resists.

Examples of the component (S) include lactones such as γ-butyrolactone; ketones such as acetone, methyl ethyl ketone (MEK), cyclohexanone, methyl-n-pentyl ketone (2-heptanone), and methyl isopentyl ketone; polyhydric alcohols such as ethylene glycol, diethylene glycol, propylene glycol, and dipropylene glycol; derivatives of polyhydric alcohols including a compound having an ester bond such as ethylene glycol monoacetate, diethylene glycol monoacetate, propylene glycol monoacetate, or dipropylene glycol monoacetate, and a compound having an ether bond such as a monoalkyl ether or a monophenyl ether like monomethyl ether, monoethyl ether, monopropyl ether, or monobutyl ether of the aforementioned polyhydric alcohols or the aforementioned compound having an ester bond [among these, propylene glycol monomethyl ether acetate (PGMEA) and propylene glycol monomethyl ether (PGME) are preferable]; cyclic ethers such as dioxane or esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, and mesitylene, dimethylsulfoxide (DMSO), and the like.

One kind of these organic solvents may be used singly, or two or more kinds thereof may be used as a mixed solvent.

Among these, PGMEA, PGME, γ-butyrolactone, and ethyl lactate (EL) are preferable.

Furthermore, a mixed solvent obtained by mixing PGMEA with a polar solvent is also preferable. The mixing ratio (mass ratio) thereof is appropriately determined in consideration of the compatibility between PGMEA and the polar solvent. The mixing ratio is preferably within a range of 1:9 to 9:1, and more preferably within a range of 2:8 to 8:2.

More specifically, in a case where ethyl lactate (EL) or cyclohexanone is formulated as a polar solvent, the mass ratio of PGMEA:ethyl lactate (EL) or cyclohexanone is preferably 1:9 to 9:1, and more preferably 2:8 to 8:2. In a case where PGME is formulated as a polar solvent, the mass ratio of PGMEA:PGME is preferably 1:9 to 9:1, more preferably 2:8 to 8:2, and even more preferably 3:7 to 7:3.

In addition, as the component (S), a mixed solvent of at least one kind of solvent selected from PGMEA and ethyl lactate (EL) and γ-butyrolactone is also preferable. In this case, the mixing ratio as the mass ratio between at least one kind of solvent described above and γ-butyrolactone is preferably 70:30 to 95:5.

The amount of the component (S) used is not particularly limited, and is appropriately set according to the thickness of a coating film at a concentration that enables a substrate or the like to be coated. Generally, the amount of the component (S) used is set such that the concentration of solid contents of the resist composition is within a range of 1% to 20% by mass, and preferably within a range of 2% to 15% by mass.

<<Resist Pattern Forming Method>>

A resist pattern of the present invention can be formed by a step of forming a resist film on a support by using the aforementioned resist composition, a step of subjecting the resist film to exposure, and a step of developing the resist film.

The pattern forming method can be performed as below, for example.

First, a support is coated with the aforementioned resist composition by using a spinner or the like, and a baking (post application baking (PAB)) treatment is performed for 40 to 120 seconds and preferably for 60 to 90 seconds under a temperature condition of, for example, 80° C. to 150° C., thereby forming a resist film.

Then, for example, by using an exposure device such as an ArF exposure device, an electron beam lithography device, or an EUV exposure device, the resist film is subjected to exposure through a mask (a mask pattern) on which a predetermined pattern is formed or subject to selective exposure through lithography or the like by being directly irradiated with electron beams without the intervention of a mask, and then a baking (post-exposure baking (PEB)) treatment is performed for 40 to 120 seconds and preferably for 60 to 90 seconds under a temperature condition of, for example, 80° C. to 150° C.

Then, the resist film is subjected to a development treatment.

In a case where an alkaline development process is adopted as the development treatment, an alkaline developer is used. In a case where a solvent development process is adopted, a developer containing an organic solvent (organic developer) is used.

It is preferable to perform a rinsing treatment after the development treatment. In a case where the alkaline development process is performed, the rinsing treatment is preferably rinsing with water using pure water. In a case where the solvent development process is performed, it is preferable to use a rinsing solution containing an organic solvent.

In a case where the solvent development process is performed, after the development treatment or the rinsing treatment, the developer or the rinsing solution attached onto the pattern may be removed by being treated with a supercritical fluid.

After the development treatment or the rinsing treatment, drying is performed. Furthermore, in some cases, a baking treatment (post-baking) may be performed after the development treatment. In this way, a resist pattern can be obtained.

In the present invention, as the development treatment, an alkaline development process or a solvent development process may be adopted.

The support is not particularly limited, and those known in the related art can be used. Examples thereof include substrates for electronic parts, substrates for electronic parts on which a predetermined wiring pattern is formed, and the like. More specifically, examples thereof include a silicon wafer, a substrate made of a metal such as copper, chromium, iron, or aluminum, a glass substrate, and the like. As a material for the wiring pattern, for example, copper, aluminum, nickel, gold, and the like can be used.

Furthermore, the aforementioned substrate on which either or both of an inorganic film and organic film are provided may be used as the support. Examples of the inorganic film include an inorganic antireflection film (inorganic BARC). Examples of the organic film include organic films such as an organic antireflection film (organic BARC) and a lower layer organic film in a multilayer resist method.

The multilayer resist method is a method in which at least one layer of organic film (lower layer organic film) and at least one layer of resist film (upper layer resist film) are provided on a substrate, and the lower layer organic film is subjected to patterning by using a resist pattern formed on the upper layer resist film as a mask. The multilayer resist method is known to be able to form a pattern with a high aspect ratio. That is, according to the multilayer resist method, an intended thickness can be secured due to the lower layer organic film, and accordingly, the resist film can be thinned, and a fine pattern with a high aspect ratio can be formed.

The multilayer resist method is basically classified into a method (double layer resist method) adopting a double layer structure consisting of an upper layer resist film and a lower layer organic film and a method (triple layer resist method) adopting a multilayer structure consisting of three or more layers in which one or more interlayers (thin metal films or the like) are provided between an upper layer resist film and a lower layer organic film.

The wavelength used for exposure is not particularly limited, and radiation such as an ArF excimer laser, a KrF excimer laser, a $F_2$ excimer laser, extreme ultraviolet (EUV), vacuum ultraviolet (VUV), electron beams (EB), X-rays, and soft X-rays can be used. The aforementioned resist composition is very useful as a composition for a KrF excimer laser, an ArF excimer laser, EB, or EUV.

The exposure method of the resist film may be general exposure (dry exposure) performed in the air or an inert gas such as nitrogen or may be liquid immersion lithography.

The liquid immersion lithography is an exposure method in which a space between a resist film and a lens in a lowermost position of an exposure device is filled in advance with a solvent (liquid immersion medium) having a refractive index higher than a refractive index of the air, and exposure (immersion exposure) is performed in this state.

As the liquid immersion medium, a solvent is preferable which has a refractive index that is higher than a refractive index of the air but is lower than a refractive index of the resist film subjected to exposure. The refractive index of the solvent is not particularly limited as long as it is within the range described above.

Examples of the solvent, which has a refractive index that is higher than a refractive index of the air but is lower than a refractive index of the resist film, include water, a fluorine-based inert liquid, a silicon-based solvent, a hydrocarbon-based solvent, and the like.

Specific examples of the fluorine-based inert liquid include liquids containing a fluorine-based compound such as $C_3HCl_2F_5$, $C_4F_9OCH_3$, $C_4F_9OC_2H_5$, or $C_5H_3F_7$ as a main component, and the like. The boiling point of the fluorine-based inert liquid is preferably 70° C. to 180° C., and more preferably 80° C. to 160° C. It is preferable that the boiling point of the fluorine-based inert liquid is within the above range, because then the medium used for liquid immersion can be removed by a simple method after the exposure is finished.

As the fluorine-based inert liquid, particularly, a perfluoroalkyl compound obtained in a case where all of the hydrogen atoms of an alkyl group are substituted with a fluorine atom is preferable. Specific examples of the perfluoroalkyl compound include a perfluoroalkylether compound and a perfluoroalkylamine compound.

Specifically, examples of the perfluoroalkylether compound include perfluoro(2-butyl-tetrahydrofuran) (boiling point: 102° C.), and examples of the perfluoroalkylamine compound include perfluorotributylamine (boiling point: 174° C.).

From the viewpoint of cost, safety, environmental issue, versatility, and the like, water is preferably used as the liquid immersion medium.

Examples of the alkaline developer used in the development treatment in the alkaline development process include a 0.1% to 10% by mass aqueous tetramethylammonium hydroxide (TMAH) solution.

In the solvent development process, the organic solvent contained in the organic developer used in the development treatment is not limited as long as the organic solvent can dissolve the component (A) (the component (A) not yet being subjected to exposure). The organic solvent can be appropriately selected from known organic solvents. Specifically, it is possible to use a polar solvent and a hydrocarbon-based organic solvent such as a ketone-based solvent, an ester-based solvent, an alcohol-based solvent, an amide-based solvent, and an ether-based solvent. The content of the organic solvent in the developer can be equal to or higher than 80% by mass.

If necessary, known additives can be formulated with the organic developer. Examples of the additives include a surfactant. The surfactant is not particularly limited, and for example, ionic or nonionic fluorine-based and/or silicon-based surfactants and the like can be used.

In a case where a surfactant is formulated with the developer, the amount of the surfactant formulated with respect to the total amount of the organic developer is generally, 0.001% to 5% by mass, preferably 0.005% to 2% by mass, and more preferably 0.01% to 0.5% by mass.

The development treatment can be performed by a known development method. Examples of the method include a method of dipping a support in a developer for a certain period of time (dipping method), a method of heaping a developer on the surface of a support by exploiting surface tension and allowing the developer stand still for a certain period of time (paddle method), a method of spraying a developer to the surface of a support (spray method), a method of continuously ejecting a developer onto a support, which is rotating at a certain rate, while scanning a developer-ejecting nozzle at a certain rate (dynamic dispense method), and the like.

The rinsing treatment (washing treatment) using a rinsing solution can be performed by a known rinsing method. Examples of the method include a method of continuously ejecting a rinsing solution onto a support which is rotating at a certain rate (rotary coating method), a method of dipping a support in a rinsing solution for a certain period of time (dipping method), a method of spraying a rinsing solution to the surface of a support (spray method), and the like.

The resist composition of the present invention is a novel resist composition that is not known in the related art.

According to the resist composition of the present invention, it is possible to form a resist film on a support such as a substrate with excellent adhesiveness. Furthermore, the resist composition of the present invention has various excellent lithography characteristics such as an excellent resist pattern shape to be formed (for example, the excellent circularity of a hole in a case where a hole pattern is formed, and the like) and excellent CDU.

EXAMPLES

Hereinafter, the present invention will be more specifically described based on examples, but the present invention is not limited to the examples.

<Component (A): Polymer Compounds P1 to P2>

Polymer compounds P-1 to P-12 were obtained by radically polymerizing the monomers using the following monomers M-1 to M-12 which induce constituent units constituting the polymer compounds at a predetermined molar ratio shown in Table 1.

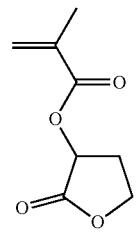

M-1

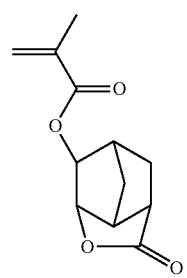

M-2

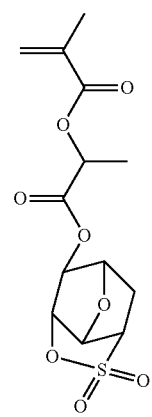

M-3

M-4
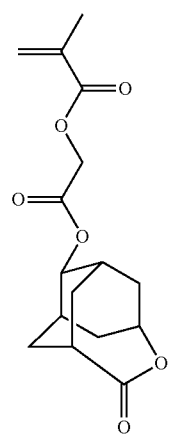
M-5
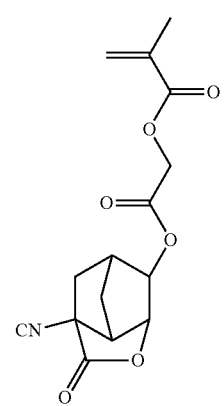
M-6
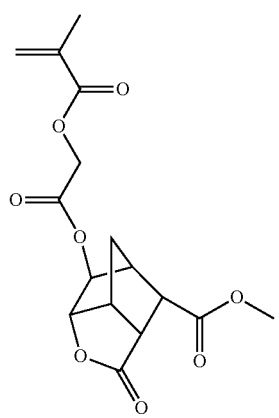
M-7
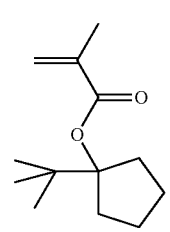
M-8
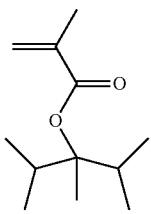
M-9
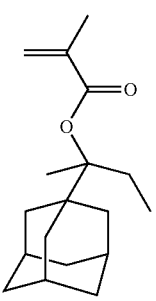
M-10
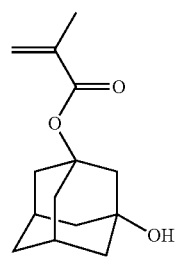
M-11
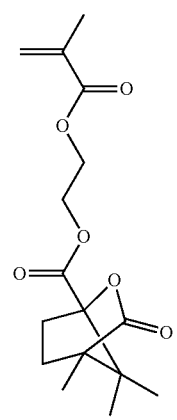
M-12
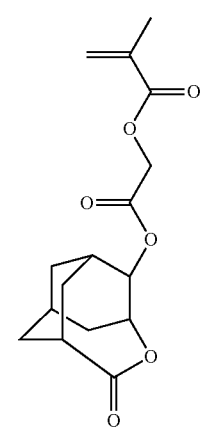

Regarding the polymer compounds P-1 to P-12, a copolymerization composition ratio of each of the polymer compounds that is determined by $^{13}$C-NMR (a proportion (molar ratio) between constituent units in each of the polymer compounds), a weight average molecular weight (Mw) of each of the polymer compounds measured by GPC and expressed in terms of standard polystyrene, and a polydispersity index (PDI) of each of the polymer compounds are described in Table 1.

TABLE 1

| Polymer | (a1) | (a2) | | (a3) | | | | Molar ratio | Mw | PDI |
|---|---|---|---|---|---|---|---|---|---|---|
| P-1 | M-7 | M-4 | — | M-1 | — | M-9 | M-10 | 20/20/20/30/10 | 8,200 | 1.65 |
| P-2 | M-7 | M-3 | — | M-1 | — | M-9 | M-10 | 20/20/20/30/10 | 7,900 | 1.68 |
| P-3 | M-7 | M-3 | — | M-1 | — | — | M-10 | 50/20/20/10 | 8,700 | 1.63 |
| P-4 | M-7 | M-4 | — | — | — | — | — | 50/50 | 9,200 | 1.66 |
| P-5 | M-7 | M-5 | — | — | — | — | M-10 | 50/40/10 | 5,600 | 1.58 |
| P-6 | M-7 | M-4 | M-11 | — | — | M-9 | M-10 | 40/30/10/10/10 | 7,800 | 1.66 |
| P-7 | M-7 | — | — | M-1 | — | M-9 | M-10 | 20/40/30/10 | 7,900 | 1.69 |
| P-8 | — | M-4 | — | M-1 | M-8 | M-9 | M-10 | 20/20/20/30/10 | 7,500 | 1.70 |
| P-9 | M-7 | — | — | M-1 | M-6 | M-9 | M-10 | 20/20/20/30/10 | 7,800 | 1.67 |
| P-10 | M-7 | — | — | M-1 | M-2 | — | — | 50/20/30 | 8,800 | 1.70 |
| P-11 | M-7 | M-12 | — | — | — | — | — | 50/50 | 8,700 | 1.77 |
| P-12 | M-7 | M-12 | — | M-1 | — | M-9 | M-10 | 20/20/20/30/10 | 8,000 | 1.68 |

The molar ratio shown in Table 1 is a molar ratio among monomers used in copolymerization. For example, for P-1, the molar ratio means that monomers M-7, M-4, M-1, M-9 and M-10 were used in copolymerization with a molar ratio of M-7:M-4:M-1:M-9:M-10=20/20/20/30/10. The same is true for P-2 to P-12.

<Resist Composition>

The components shown in Table 2 were mixed and dissolved together, thereby preparing resist compositions used in the resist pattern forming method of each example.

TABLE 2

| | Component (A) | Component (B) | | Component (D) | Component (F) | Component (S) |
|---|---|---|---|---|---|---|
| Example 1 | P-1 | PAG-1 | PAG-3 | D-1 | F-1 | PGMEA/PGME |
| | [100] | [3] | [1] | [3] | [2] | [2,000/800] |
| Example 2 | P-1 | PAG-2 | — | D-1 | F-1 | PGMEA/PGME |
| | [100] | [6] | | [3] | [2] | [2,000/800] |
| Example 3 | P-2 | PAG-1 | PAG-3 | D-1 | F-1 | PGMEA/PGME |
| | [100] | [3] | [1] | [3] | [2] | [2,000/800] |
| Example 4 | P-3 | PAG-1 | PAG-3 | D-1 | F-1 | PGMEA/PGME |
| | [100] | [3] | [1] | [3] | [2] | [2,000/800] |
| Example 5 | P-4 | PAG-1 | PAG-3 | D-1 | F-1 | PGMEA/PGME |
| | [100] | [3] | [1] | [3] | [2] | [2,000/800] |
| Example 6 | P-5 | PAG-4 | — | D-1 | F-1 | PGMEA/PGME |
| | [100] | [6] | | [3] | [2] | [2,000/800] |
| Example 7 | P-6 | PAG-4 | — | D-1 | F-1 | PGMEA/PGME |
| | [100] | [6] | | [3] | [2] | [2,000/800] |
| Example 8 | P-11 | PAG-1 | — | D-2 | F-1 | PGMEA/PGME |
| | [100] | [5.6] | | [4.1] | [2] | [2,000/800] |
| Example 9 | P-12 | PAG-1 | — | D-2 | F-1 | PGMEA/PGME |
| | [100] | [5.6] | | [4.1] | [2] | [2,000/800] |
| Example 10 | P-11 | PAG-5 | — | D-1 | F-1 | PGMEA/PGME |
| | [100] | [8.5] | | [3.5] | [2] | [2,000/800] |
| Comparative Example 1 | P-7 | PAG-1 | PAG-3 | D-1 | F-1 | PGMEA/PGME |
| | [100] | [3] | [1] | [3] | [2] | [2,000/800] |
| Comparative Example 2 | P-8 | PAG-1 | PAG-3 | D-1 | F-1 | PGMEA/PGME |
| | [100] | [3] | [1] | [3] | [2] | [2,000/800] |
| Comparative Example 3 | P-9 | PAG-1 | PAG-3 | D-1 | F-1 | PGMEA/PGME |
| | [100] | [3] | [1] | [3] | [2] | [2,000/800] |
| Comparative Example 4 | P-10 | PAG-1 | PAG-3 | D-1 | F-1 | PGMEA/PGME |
| | [100] | [3] | [1] | [3] | [2] | [2,000/800] |

In Table 2, each of the abbreviations means the following. The numerical value in each square bracket is a formulation amount (part by mass).

Component (A): polymer compounds P-1 to P-12 in Table 1

Component (B): acid generators represented by Chemical Formulae PAG-1 to PAG-5

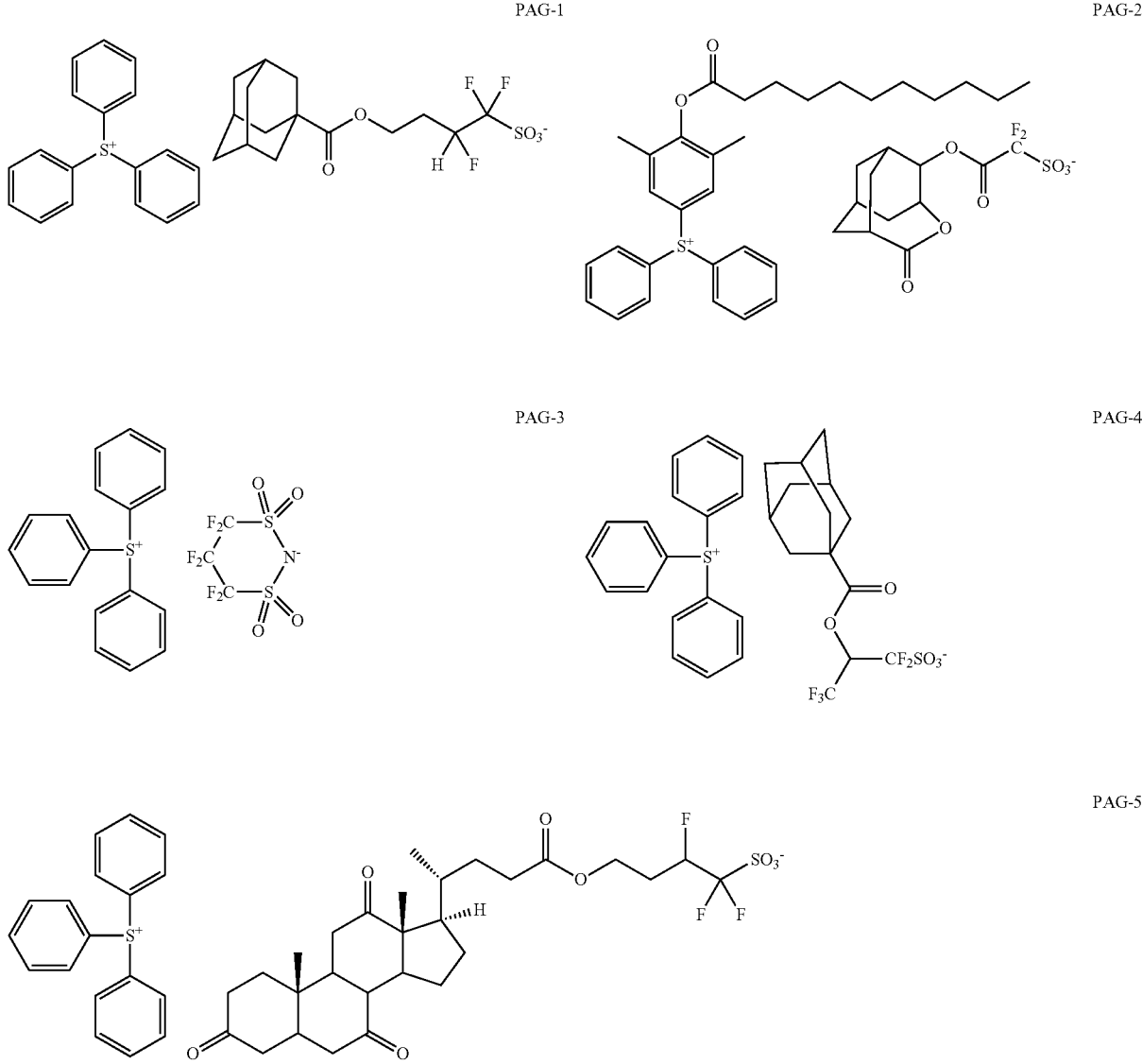

Component (D): acid diffusion control agents represented by Chemical Formulae (D)-1 and (D)-2

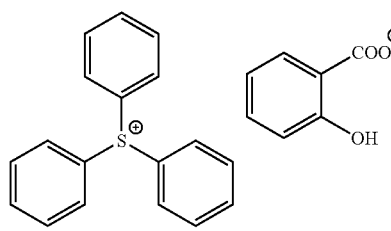

(D)-1

-continued

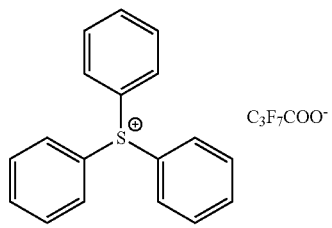

(D)-2

Component (F): fluorine-containing polymer compound represented by Chemical Formula (F)-1 having weight average molecular weight (Mw) of 17,100 measured by GPC and expressed in terms of standard polystyrene, having polydispersity index (Mw/Mn) of 1.71, and having copolymerization composition ratio (proportion (molar ratio) between constituent units in the structural formula) of 1/m=52/48 determined by $^{13}$C-NMR.

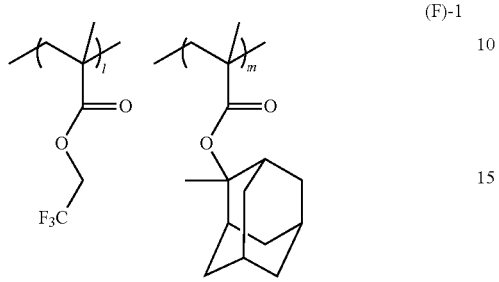

(F)-1

Component (S):
PGMEA: propylene glycol monomethyl ether acetate
PGME: propylene glycol monomethyl ether <Formation of Negative Resist Pattern: Examples 1 to 10 and Comparative Examples 1 to 4>

A 12-inch silicon wafer was coated with an organic antireflection film composition "ARC95" (trade name, manufactured by Brewer Science, Inc.) by using a spinner, and the composition was dried by being fired on a hot plate for 60 seconds at 205° C., thereby forming an organic antireflection film having a film thickness of 90 nm.

Then, the film was coated with each of the resist compositions shown in Table 2 by using a spinner, and each of the compositions was dried by being subjected to a post application baking (PAB) treatment on a hot plate under the condition of a temperature of 110° C. for 60 seconds, thereby forming a resist film having a film thickness of 85 nm.

Thereafter, by using an ArF exposure device NSR—S609B for liquid immersion [manufactured by NIKON CORPORATION; numerical aperture (NA)=1.30, Crosspole (0.78 to 0.97) with POLANO, liquid immersion medium: water], the resist film was selectively irradiated with an ArF excimer laser (193 nm) through each photomask by setting a target trench (hole width of 45 nm/pitch of 90 nm).

Then, a post-exposure baking (PEB) treatment was performed for 60 seconds at 90° C.

Subsequently, by using butyl acetate, solvent development was performed for 30 seconds at 23° C., and shake-off drying was performed.

As a result, in all of the examples, a negative contact hole pattern (CH pattern) was formed.

<Evaluation of Negative Resist Pattern>

[CDU (in-Plane Uniformity of Dimension of Hole Pattern)]

Among the CH patterns formed as above, 100 holes were observed from above by using a critical dimension SEM (scanning electron microscope, acceleration voltage: 300 V, trade name: S-9380, manufactured by Hitachi High-Technologies Corporation), and a hole diameter (nm) of each hole was measured. The standard deviation (σ) calculated from the measured results was multiplied by 3 (3σ). The results are shown in Table 3 as "CDU".

The smaller the value of 3σ obtained as above, the higher the in-plane uniformity of the dimension of a plurality of holes (CD) formed in the resist film.

TABLE 3

| | CDU |
|---|---|
| Example 1 | 5.01 |
| Example 2 | 4.63 |
| Example 3 | 4.83 |
| Example 4 | 4.92 |
| Example 5 | 5.12 |
| Example 6 | 4.76 |
| Example 7 | 4.66 |
| Example 8 | 4.7 |
| Example 9 | 4.3 |
| Example 10 | 4.2 |
| Comparative Example 1 | 5.56 |
| Comparative Example 2 | 5.76 |
| Comparative Example 3 | 5.83 |
| Comparative Example 4 | 5.75 |

From the results shown in Table 3, it is possible to confirm that the value of CDU is smaller in Examples 1 to 10 than in Comparative Examples 1 to 4, and hence the in-plane uniformity of the dimension of the hole pattern is high in Examples 1 to 10.

Hitherto, preferable examples of the present invention have been described, but the present invention is not limited to the examples. Within a scope that does not depart from the gist of the present invention, the constituents can be added, omitted, substituted, and modified in other ways. The present invention is limited not to the above description, but only to the attached claims.

What is claimed is:

1. A resist composition comprising:
a component (A) whose solubility in a developer changes by the action of an acid; and
an acid generator component (B) generating an acid through exposure,
wherein the component (A) contains a polymer compound having a constituent unit (a1) represented by Formula (1) and a constituent unit (a2) represented by Formula (2),

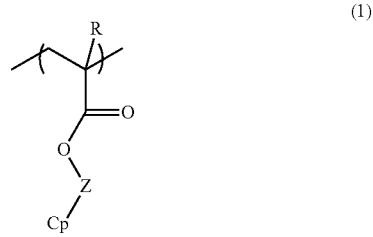

(1)

wherein R represents a hydrogen atom, an alkyl group having 1 to 5 carbon atoms, or a halogenated alkyl group having 1 to 5 carbon atoms; Z represents a single bond or an alkylene group; and $C_p$ represents a group represented by Formula (Cp-1),

(Cp-1)

wherein $R_2$ represents a tertiary alkyl group, $n_p$ represents a positive integer, and * represents a binding position in which (Cp-1) is bonded to Z,

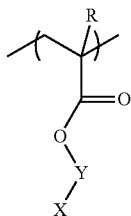
(2)

wherein R represents a hydrogen atom, an alkyl group having 1 to 5 carbon atoms, or a halogenated alkyl group having 1 to 5 carbon atoms; Y represents a divalent linking group; and X represents a group represented by a formula selected from the group consisting of Formulae (a2-r-1) to (a2-r-7), (a5-r-1), and (a5-r-2),

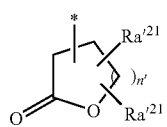
(a2-r-1)

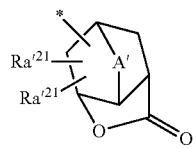
(a2-r-2)

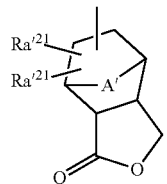
(a2-r-3)

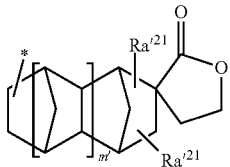
(a2-r-4)

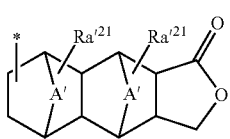
(a2-r-5)

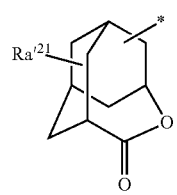
(a2-r-6)

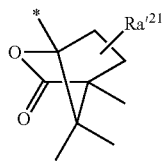
(a2-r-7)

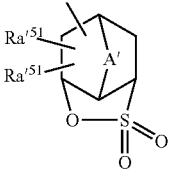
(a5-r-1)

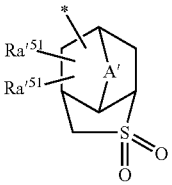
(a5-r-2)

wherein $Ra'^{21}$ and $Ra'^{51}$ each independently represent a hydrogen atom, a cyano group, or a halogen atom; A' represents an alkylene group having 1 to 5 carbon atoms that may contain an oxygen atom or a sulfur atom, an oxygen atom, or a sulfur atom; n' represents an integer of 0 to 2; and m' represents an integer of 0 or 1.

2. The resist composition according to claim 1, wherein in Formula (1), $n_p$ represents an integer of 1 to 3, and $R_2$ represents a tertiary alkyl group having 4 to 10 carbon atoms.

3. The resist composition according to claim 1, wherein the constituent unit (a2) is a constituent unit represented by Formula (2-1) or Formula (2-2),

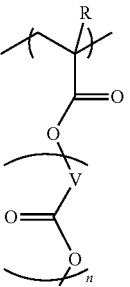
Formula (2-1)

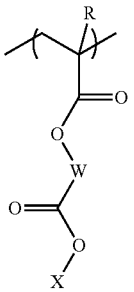
Formula (2-2)

wherein R represents a hydrogen atom, an alkyl group having 1 to 5 carbon atoms, or a halogenated alkyl group having 1 to 5 carbon atoms; X represents a group represented by a formula selected from the group consisting of Formulae (a2-r-1) to (a2-r-7), (a5-r-1), and (a5-r-2), V and W each represent a divalent linking group; and n represents an integer of 1 to 5.

4. The resist composition according to claim 1, wherein in Formulae (2), X represents a group represented by the formula selected from the group consisting of Formulae (a2-r-1), (a2-r-2), (a2-r-6), (a2-r-7), and (a5-r-1).

5. The resist composition according to claim 3, wherein in Formula (2-1) or (2-2), X represents a group represented by the formula selected from the group consisting of Formulae (a2-r-1), (a2-r-2), (a2-r-6), (a2-r-7), and (a5-r-1).

6. A resist pattern forming method, comprising:
   forming a resist film on a support using the resist composition according to claim 1;
   subjecting the resist film to exposure; and
   forming a resist pattern by developing the resist film.

* * * * *